(12) United States Patent
Zhang et al.

(10) Patent No.: US 12,550,550 B2
(45) Date of Patent: Feb. 10, 2026

(54) DISPLAY SUBSTRATE AND DISPLAY DEVICE WITH TRANSMISSION PORTIONS STAGGERED BY DISTANCE GREATER OR EQUAL TO WIDTH OF DRIVING CIRCUIT

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Jingli Zhang, Beijing (CN); Xinyu Wei, Beijing (CN); Erlong Song, Beijing (CN); Kai Zhang, Beijing (CN); Xiaodong Chu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 52 days.

(21) Appl. No.: 17/907,933

(22) PCT Filed: Sep. 23, 2021

(86) PCT No.: PCT/CN2021/119995
§ 371 (c)(1),
(2) Date: Aug. 29, 2022

(87) PCT Pub. No.: WO2023/044678
PCT Pub. Date: Mar. 30, 2023

(65) Prior Publication Data
US 2024/0196671 A1    Jun. 13, 2024

(51) Int. Cl.
*H10K 59/131* (2023.01)
(52) U.S. Cl.
CPC ................. *H10K 59/131* (2023.02)

(58) Field of Classification Search
CPC .................................................. H10K 59/131
See application file for complete search history.

(56) References Cited

U.S. PATENT DOCUMENTS

2004/0252117 A1    12/2004   Tanada
2014/0034923 A1*    2/2014   Kim ..................... H10K 59/123
                                                    257/40
(Continued)

FOREIGN PATENT DOCUMENTS

CN           103903558 A       7/2014
CN           105161495 A      12/2015
(Continued)

OTHER PUBLICATIONS

First Office Action for Chinese Application No. 202180002610.3, dated Feb. 1, 2023, 12 Pages.

*Primary Examiner* — Lex H Malsawma
(74) *Attorney, Agent, or Firm* — BROOKS KUSHMAN P.C.

(57) ABSTRACT

A display substrate includes: a base substrate and an initialization signal transmission layer arranged on the base substrate; the initialization signal transmission layer includes a plurality of first transmission portions and a plurality of second transmission portions; the plurality of first transmission portions are arranged along a first direction, the first transmission portion includes at least a portion extending along the second direction, the second direction intersects the first direction; the second transmission portion includes at least a portion extending along the first direction, adjacent first transmission portions are coupled through at least one second transmission portion; the plurality of first transmission portions include a target transmission portion, a second transmission portion located between the target transmission portion and an adjacent previous first transmission portion and a second transmission portion located between the target (Continued)

transmission portion and an adjacent next first transmission portion are staggered along the second direction.

20 Claims, 54 Drawing Sheets

(56) References Cited

U.S. PATENT DOCUMENTS

| | | | |
|---|---|---|---|
| 2014/0184579 | A1 | 7/2014 | Kim et al. |
| 2015/0009194 | A1 | 1/2015 | Kim et al. |
| 2016/0357049 | A1 | 12/2016 | Chen et al. |
| 2017/0200417 | A1 | 7/2017 | Wu et al. |
| 2018/0031880 | A1 | 2/2018 | Kwak et al. |
| 2021/0133418 | A1 | 5/2021 | Liu et al. |
| 2021/0193773 | A1* | 6/2021 | Park ................ H10K 59/124 |
| 2021/0193778 | A1 | 6/2021 | Wang et al. |

FOREIGN PATENT DOCUMENTS

| | | | |
|---|---|---|---|
| CN | 106782313 A | 5/2017 | |
| CN | 110676295 A | 1/2020 | |
| CN | 110750020 A | 2/2020 | |
| CN | 210516730 U | 5/2020 | |
| CN | 211265478 U | 8/2020 | |
| CN | 111682054 A | 9/2020 | |
| CN | 112908245 A | 6/2021 | |
| CN | 113096601 A | 7/2021 | |
| CN | 113160716 A | 7/2021 | |
| CN | 113439299 A | 9/2021 | |
| WO | 2021147086 A1 | 7/2021 | |

\* cited by examiner

DISPLAY SUBSTRATE AND DISPLAY DEVICE WITH TRANSMISSION PORTIONS STAGGERED BY DISTANCE GREATER OR EQUAL TO WIDTH OF DRIVING CIRCUIT

CROSS-REFERENCE TO RELATED APPLICATION

This application is the U.S. national phase of PCT Application No. PCT/CN2021/119995 filed on Sep. 23, 2021, which is incorporated herein by reference in its entirety.

TECHNICAL FIELD

The present disclosure relates to the field of display technology, and more particularly to a display substrate and a display device.

BACKGROUND

As an important medium for human-computer interaction, touch panels are increasingly used in computers, watches, mobile phones and other fields. As the screen size becomes larger and the refresh frequency becomes higher, the loading of the panel is much more, the problem of insufficient charging time is more serious.

SUMMARY

The present disclosure aims to provide a display substrate and a display device.

In order to achieve the objective, the present disclosure provides the following solution.

A first aspect of the present disclosure provides a display substrate, including: a base substrate and a plurality of sub-pixels arranged on the base substrate, wherein the sub-pixels includes a sub-pixel driving circuit, an orthographic projection of the sub-pixel driving circuit on the base substrate has a maximum first width along a second direction; the display substrate further includes: an initialization signal transmission layer arranged on the base substrate; wherein the initialization signal transmission layer includes a plurality of first transmission portions and a plurality of second transmission portions; the plurality of first transmission portions are arranged along a first direction, the first transmission portion includes at least a portion extending along the second direction, the second direction intersects the first direction; the second transmission portion includes at least a portion extending along the first direction, adjacent first transmission portions are coupled through at least one second transmission portion; the plurality of first transmission portions include a target transmission portion, and the target transmission portion includes at least a portion extending along the second direction, a second transmission portion located between the target transmission portion and an adjacent previous first transmission portion and a second transmission portion located between the target transmission portion and an adjacent next first transmission portion are staggered by a first distance along the second direction, the first distance is greater than or equal to the first width.

Optionally, the display substrate includes a first initialization signal transmission layer and a second initialization signal transmission layer; the initialization signal transmission layer is the first initialization signal transmission layer or the second initialization signal transmission layer; or, the display substrate includes at least two initialization signal transmission layers, a first one of the at least two initialization signal transmission layers is the first initialization signal transmission layer, and a second one of the at least two initialization signal transmission layers is the second initialization signal transmission layer.

Optionally, the display substrate further comprises a third initialization signal transmission layer.

Optionally, a third one of the at least two initialization signal transmission layers is the third initialization signal transmission layer.

Optionally, the display substrate comprises a first initialization signal transmission layer, a second initialization signal transmission layer and a third initialization signal transmission layer; the initialization signal transmission layer is one of the first initialization signal transmission layer, the second initialization signal transmission layer and the third initialization signal transmission layer.

Optionally, the plurality of first transmission portions include a non-target transmission portion, a second transmission portion located between the non-target transmission portion and an adjacent previous first transmission portion and a second transmission portion located between the non-target transmission portion and an adjacent next first transmission portion are arranged in a same column along the first direction.

Optionally, a second transmission portion in the first initialization signal transmission layer and a second transmission portion in the second initialization signal transmission layer are staggered along the second direction.

Optionally, a second transmission portion in the first initialization signal transmission layer and a second transmission portion in the second initialization signal transmission layer are staggered in the second direction; and/or, the second transmission portion in the first initialization signal transmission layer and a second transmission portion in the third initialization signal transmission layer are staggered in the second direction; and/or, the second transmission portion in the second initialization signal transmission layer and the second transmission portion in the third initialization signal transmission layer are staggered in the second direction.

Optionally, the display substrate further includes a plurality of sub-pixels, and the plurality of sub-pixels include a plurality of sub-pixel driving circuits; the plurality of sub-pixel driving circuits included in the plurality of sub-pixels are divided into a plurality of rows of sub-pixel driving circuits, and each sub-pixel driving circuit in each row of sub-pixel driving circuits is coupled to a corresponding first transmission portion; the adjacent first transmission portions are coupled through a plurality of second transmission portions, among the plurality of the second transmission portions, a distance between adjacent second transmission portions is greater than or equal to a maximum width in the second direction of an orthographic projection of one sub-pixel driving circuit on the base substrate.

Optionally, adjacent sub-pixel driving circuits in a same row of sub-pixel driving circuits are arranged symmetrically as a whole; the sub-pixels further include a plurality of data lines and a plurality of power supply lines, data lines adjacent in the second direction are symmetrically arranged, and power supply lines adjacent in the second direction are symmetrically arranged.

Optionally, the first transmission portion and the second transmission portion are formed as an integral structure.

Optionally, the display substrate further comprises a plurality of sub-pixels; the sub-pixels comprise a sub-pixel driving circuit, and the sub-pixel driving circuit comprises a driving transistor; an orthographic projection of the second transmission portion on the base substrate partially overlaps an orthographic projection of a gate electrode of the driving transistor on the base substrate.

Optionally, the display substrate includes a plurality of data lines, and the data line includes at least a portion extending along the first direction; the sub-pixel driving circuit further includes: a first transistor and a fourth transistor, the first transistor is respectively coupled to a gate electrode and a second electrode of the driving transistor, and the fourth transistor is respectively coupled to the first electrode of the driving transistor and a corresponding data line; the first transistor includes a first active layer, and the fourth transistor includes a fourth active layer; at least part of the orthographic projection of the second transmission portion on the base substrate is located between an orthographic projection of the first active layer on the base substrate and an orthographic projection of the fourth active layer on the base substrate.

Optionally, the display substrate further comprises a power supply line; the sub-pixel further includes a light-emitting element; the sub-pixel driving circuit further includes a fifth transistor and a sixth transistor, the fifth transistor is respectively coupled to a first electrode of the driving transistor and a corresponding power supply line, the sixth transistor is respectively connected to a second electrode of the driving transistor and the light emitting element; the fifth transistor includes a fifth active layer, and the sixth transistor includes a sixth active layer; at least part of the orthographic projection of the second transmission portion on the base substrate is located between an orthographic projection of the fifth active layer on the base substrate and an orthographic projection of the sixth active layer on the base substrate.

Optionally, the plurality of sub-pixels are divided into a plurality of sub-pixel groups, and each sub-pixel group includes a first sub-pixel and a second sub-pixel; both the first sub-pixel and the second sub-pixel include a second conductive portion, and the second conductive portion in the first sub-pixel is coupled to the second conductive portion in the second sub-pixel; a fifth transistor in the first sub-pixel is coupled to the second conductive portion; a fifth transistor in the second sub-pixel is coupled to the second conductive portion, the second conductive portion in the second sub-pixel is coupled to the corresponding power supply line; at least part of the second transmission portion is located in a sub-pixel driving circuit layout area in the first sub-pixel, and the orthographic projection of the second transmission portion on the base substrate does not overlap an orthographic projection of the second conductive portion in the first sub-pixel on the base substrate.

Optionally, the sub-pixel driving circuit further includes an eighth transistor, and the eighth transistor is coupled to the first electrode or the second electrode of the driving transistor, the eighth transistor is used for resetting the first electrode or the second electrode; the eighth transistor includes an eighth active layer, at least a portion of the orthographic projection of the second transmission portion on the base substrate and an orthographic projection of the eighth active layer on the base substrate are arranged along the second direction.

Optionally, the display substrate includes a plurality of sub-pixels, and the sub-pixels include a light-emitting element and a sub-pixel driving circuit; the sub-pixel driving circuit includes a driving transistor, and further includes: a second transistor, wherein the second transistor is respectively coupled to the gate electrode of the driving transistor and the initialization signal transmission layer; a seventh transistor, wherein the seventh transistor is respectively coupled to the light-emitting element and the initialization signal transmission layer.

Optionally, the display substrate includes a plurality of sub-pixels, and the sub-pixels include a light-emitting element and a sub-pixel driving circuit; the sub-pixel driving circuit includes a driving transistor, and further includes: a second transistor, wherein the second transistor is respectively coupled to the gate electrode of the driving transistor and the first initialization signal transmission layer; a seventh transistor, wherein the seventh transistor is respectively coupled to the light emitting element and the second initialization signal transmission layer.

Optionally, the display substrate includes a plurality of sub-pixels, and the sub-pixels include a light-emitting element and a sub-pixel driving circuit; the sub-pixel driving circuit includes a driving transistor, and further includes: a second transistor, wherein the second transistor is respectively coupled to the gate electrode of the driving transistor and the first initialization signal transmission layer; a seventh transistor, wherein the seventh transistor is respectively coupled to the light-emitting element and the second initialization signal transmission layer; an eighth transistor, wherein the eighth transistor is respectively coupled to the first electrode of the driving transistor and the third initialization signal transmission layer.

Optionally, the display substrate further includes a display area and a peripheral area surrounding the display area, and the display substrate further includes: a first signal line, wherein the first signal line is located in the peripheral area of the display substrate, the first signal line includes at least a portion extending along the first direction, the first signal line is coupled to the first initialization signal transmission layer; the first signal line is made of a second source-drain metal layer, and the first transmission portion included in the first initialization signal transmission layer is made of a first gate metal layer.

Optionally, the display substrate further includes: a second signal line, wherein the second signal line is located in the peripheral area of the display substrate, the second signal line includes at least a portion extending along the first direction, an orthographic projection of the first signal line on the base substrate is located between the display area and an orthographic projection of the second signal line on the base substrate, and the second signal line is coupled to the second initialization signal transmission layer; the second signal line and the first transmission portion included in the second initialization signal transmission layer are both made of a first source-drain metal layer.

Optionally, the display substrate further includes: a third signal line, wherein an orthographic projection of the third signal line on the base substrate is located between the orthographic projection of the first signal line on the base substrate and the orthographic projection of the second signal line on the base substrate, the third signal line is coupled to the third initialization signal transmission layer; the third signal line is made of the first source-drain metal layer, and the third initialization signal transmission layer is made of a third gate metal layer.

A second aspect of the present disclosure provides a display device including the display substrate.

BRIEF DESCRIPTION OF THE DRAWINGS

The accompanying drawings described herein are used to provide further understanding of the present disclosure and constitute a portion of the present disclosure. The exemplary embodiments of the present disclosure and their descriptions are used to explain the present disclosure and do not constitute an improper limitation of the present disclosure.

DETAILED DESCRIPTION

Figure 1:
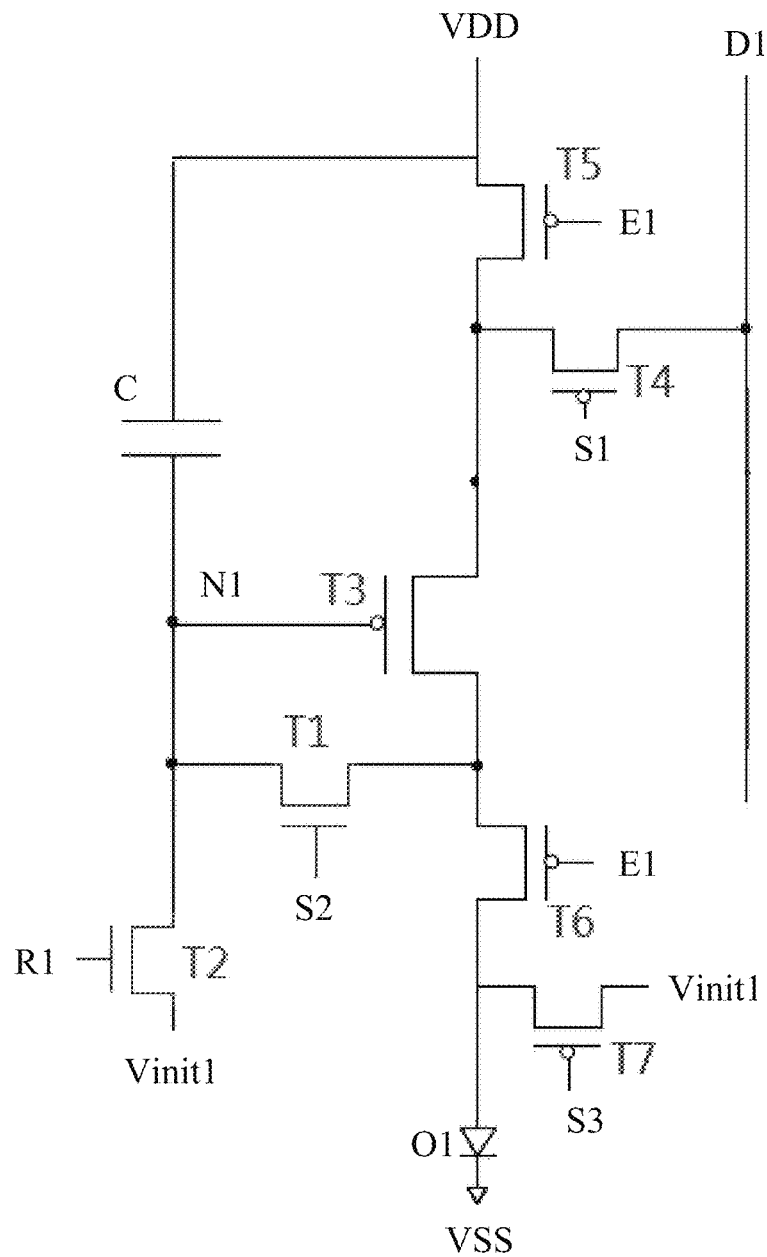
FIG. 1 is a first schematic circuit diagram of a sub-pixel driving circuit provided by an embodiment of the present disclosure.

In order to further illustrate the display substrate and the display device provided by the embodiments of the present disclosure, a detailed description is given below with reference to the accompanying drawings.

As the screen size becomes larger and the refresh frequency becomes higher, the loading of panel is much more and the problem of insufficient charging time is more serious. Therefore, reducing the loading and reducing the charging time is an urgent problem to be solved.

Referring to FIG. 2, FIG. 3, FIG. 5, FIG. 6 and FIG. 8, an embodiment of the present disclosure provides a display substrate, including: a base substrate and a plurality of sub-pixels arranged on the base substrate, wherein the sub-pixels includes a sub-pixel driving circuit, an orthographic projection of the sub-pixel driving circuit on the base substrate has a maximum first width along a second direction; the display substrate further includes: an initialization signal transmission layer (e.g., a first initialization signal transmission layer Vinit1, a second initialization signal transmission layer Vinit2 and a third initialization signal transmission layer Vinit3) arranged on the base substrate; the initialization signal transmission layer includes a plurality of first transmission portions 20 and a plurality of second transmission portions 21; the plurality of first transmission portions 20 are arranged along a first direction, the first transmission portion 20 includes at least a part of the first transmission portion 20 extending along the second direction, the second direction intersects the first direction; the second transmission portion 21 includes at least a part of the second transmission portion 21 extending along the first direction, the adjacent first transmission portions 20 are coupled through at least one of the second transmission portions 21;

The plurality of first transmission portions 20 include a target transmission portion 201, and the target transmission portion 201 includes at least part of target transmission portion 201 extending along the second direction, a second transmission portion 21 located between the target transmission portion 201 and an adjacent previous first transmission portion 20 and a second transmission portion 21 located between the target transmission portions 201 and an adjacent next first transmission portion 20 are staggered by a first distance along the second direction, the first distance is greater than or equal to the first width.

Exemplarily, the first distance is equal to the first width; or the first distance is N times of the first width, N is an integer.

Exemplarily, the second transmission portions 21 staggered along the second direction are connected to sub-pixel driving circuits of different columns.

Figure 2:
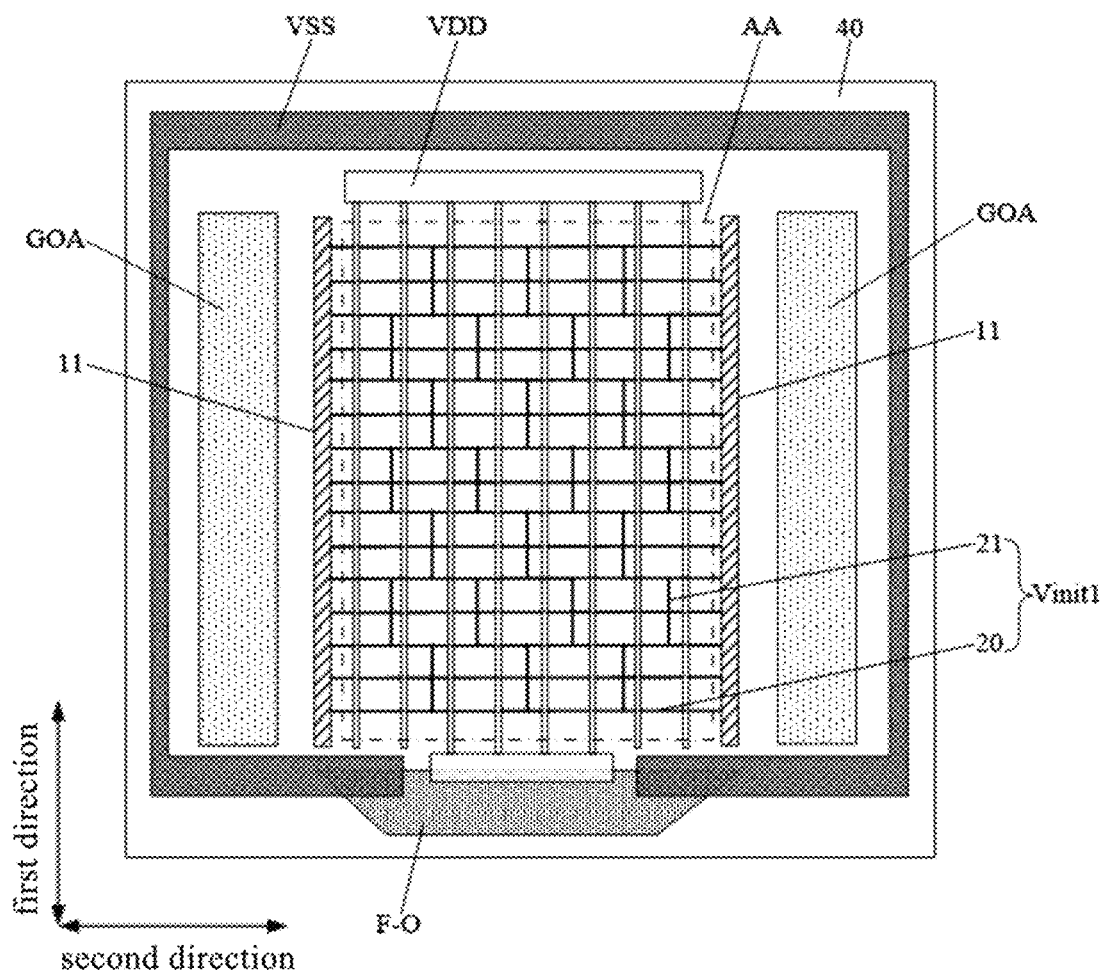
FIG. 2 is a schematic diagram of a first structure of a display substrate provided by an embodiment of the present disclosure.
Figure 3:
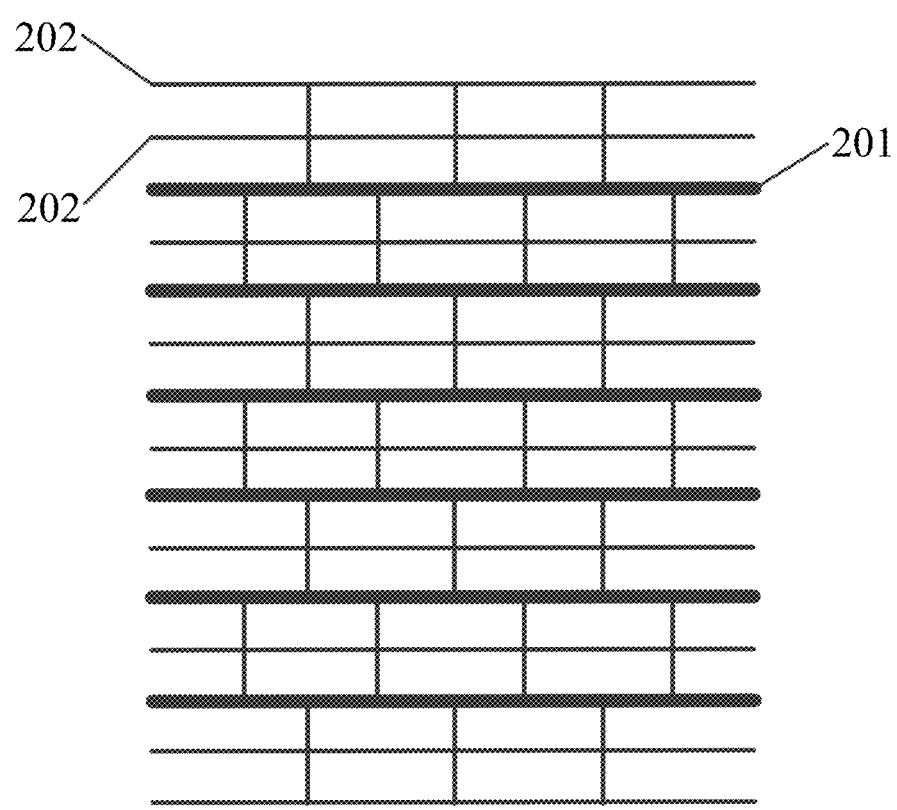
FIG. 3 is a schematic diagram of a target transmission portion and a non-target transmission portion provided by an embodiment of the present disclosure.

It should be noted that the thicker line in FIG. 3 is the target transmission portion 201, and the thinner line is the non-target transmission portion 202. FIG. 2, FIG. 5, FIG. 6 and FIG. 8 also illustrate a fan-out area F-0, a gate driving circuit GOA, and a negative power supply line VSS.

Figure 4:
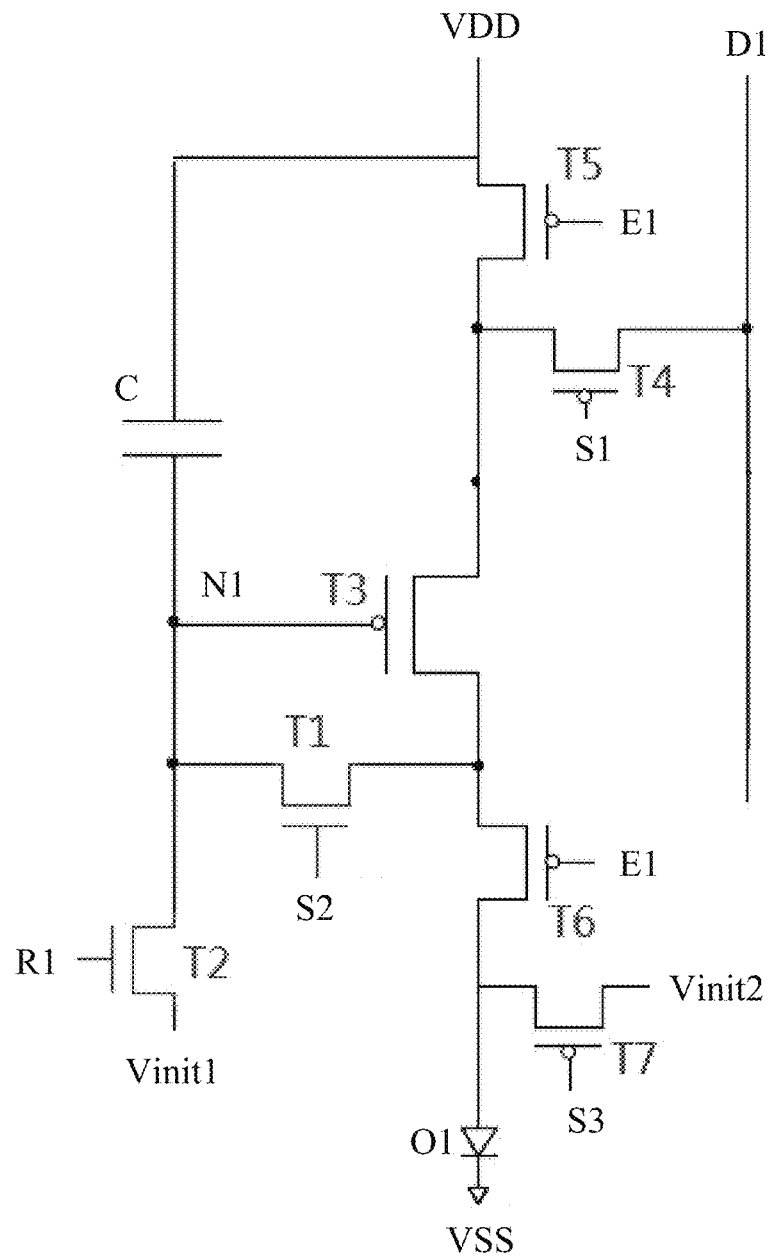
FIG. 4 is a second schematic circuit diagram of a sub-pixel driving circuit provided by an embodiment of the present disclosure.
Figure 7:
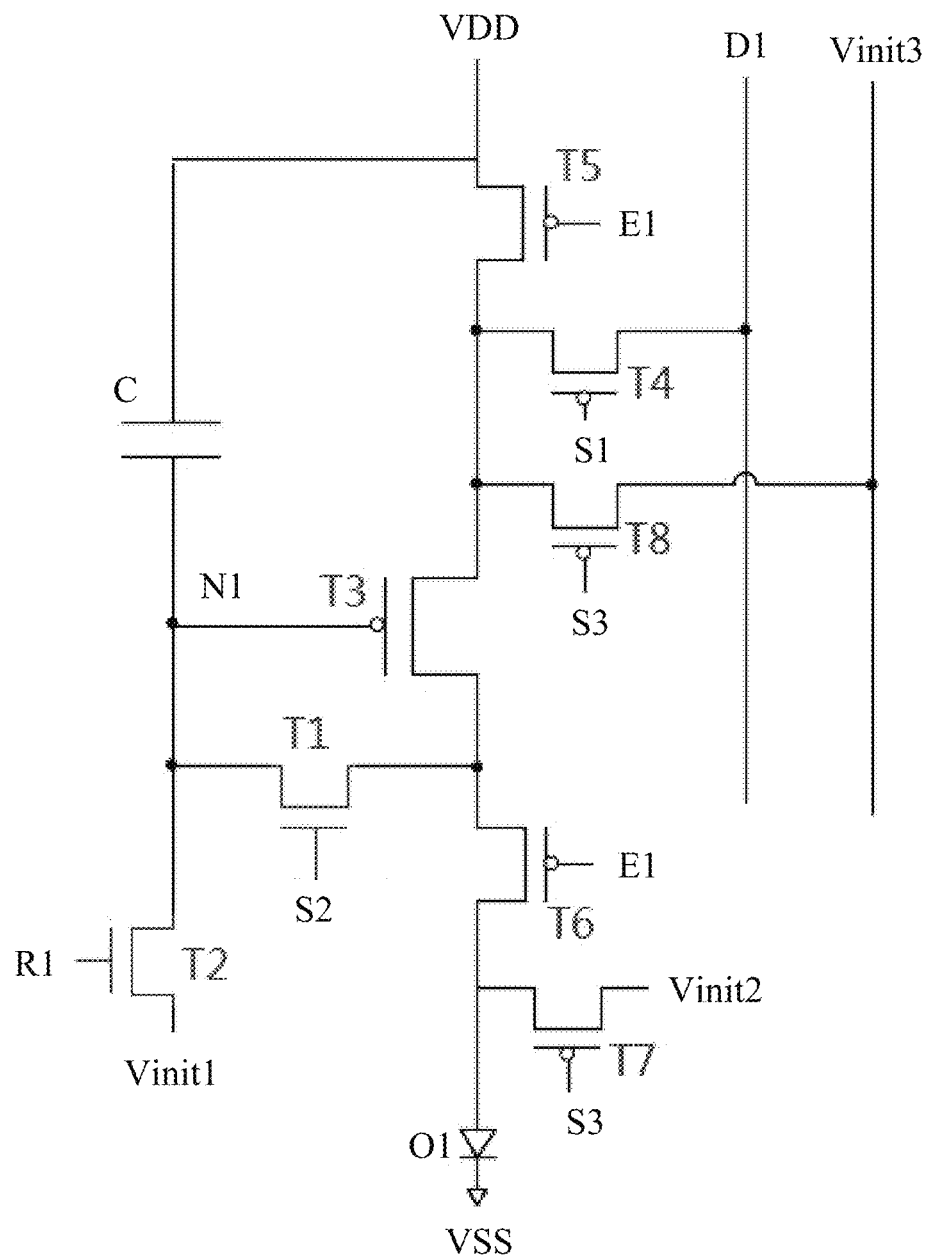
FIG. 7 is a third circuit schematic diagram of a sub-pixel driving circuit provided by an embodiment of the present disclosure.

It is worth noting that in FIG. 1, FIG. 4 and FIG. 7, the timing of the signals transmitted by the reset line R1, the first scan line S1, the second scan line S2, the third scan line S3 and the light emitting control line E1 can be set according to actual needs. Exemplarily, in the case where the eighth transistor T8 is not included, the timing of the signals transmitted by the first scan line S1, the second scan line S2 and the third scan line S3 are the same, but not limited thereto.

It is worth noting that the target transmission portion 201 and the non-target transmission portion 202 in the present disclosure are both used to transmit initialization signals, and are defined by different names according different layouts of the second transmission portion connected thereto and are not related as being a transmission target or not.

Exemplarily, the initialization signal transmission layer is used for transmitting initialization signals.

Exemplarily, the display substrate includes a display area AA and a peripheral area 40 surrounding the display area AA. The first transmission portion 20 can extend from the display area AA to the peripheral area 40 and can be coupled to a corresponding signal line in the peripheral area 40, to receive a corresponding initialization signal.

Exemplarily, the display substrate includes a plurality of sub-pixels, the plurality of sub-pixels includes a plurality of sub-pixel driving circuits, and the plurality of sub-pixel driving circuits are arranged in an array, which can be divided into a plurality of rows of sub-pixel driving circuits arranged along the first direction. Each row of sub-pixel driving circuits includes a plurality of sub-pixel driving circuits arranged along the second direction.

Exemplarily, the arrangement of the plurality of sub-pixels includes: RGBG, GGRB, and the like.

Figure 29A:
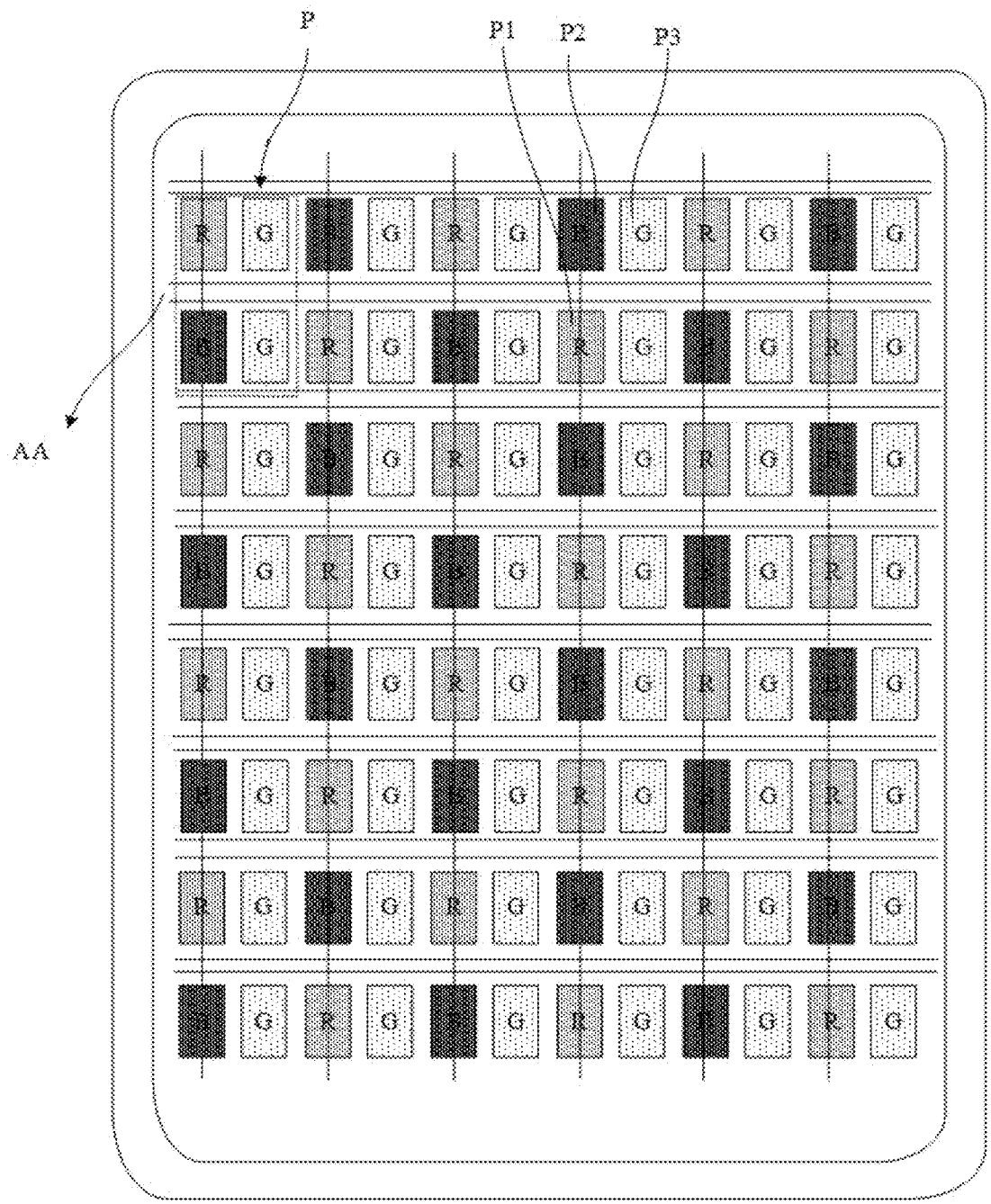
FIG. 29a is a layout of sub-pixels provided by an embodiment of the present disclosure.

FIG. 29*a* is a schematic plan view of a display substrate according to an embodiment of the disclosure. As shown in FIG. 29*a*, the display substrate may include a plurality of pixel units P arranged in a matrix, and at least one pixel unit P may include a first color sub-pixel P1 that emits light of a first color, a second color sub-pixel P2 that emits light of a second color and two third color sub-pixels P3 that emit light of the third color, the four sub-pixels may each include a sub-pixel driving circuit and a light-emitting element, and the sub-pixel driving circuit in each sub-pixel is connected to the scan line, the data line and the light-emitting control line, and the sub-pixel driving circuit is configured to receive the data voltage transmitted by the data line under the control of the scan line and the light-emitting control line, and output a corresponding current to the light-emitting element. The light-emitting element in each sub-pixel is respectively connected to the sub-pixel driving circuit of the sub-pixel, and the light-emitting element is configured to emit light with corresponding brightness in response to the current outputted by the sub-pixel driving circuit of the sub-pixel.

Figure 29B:
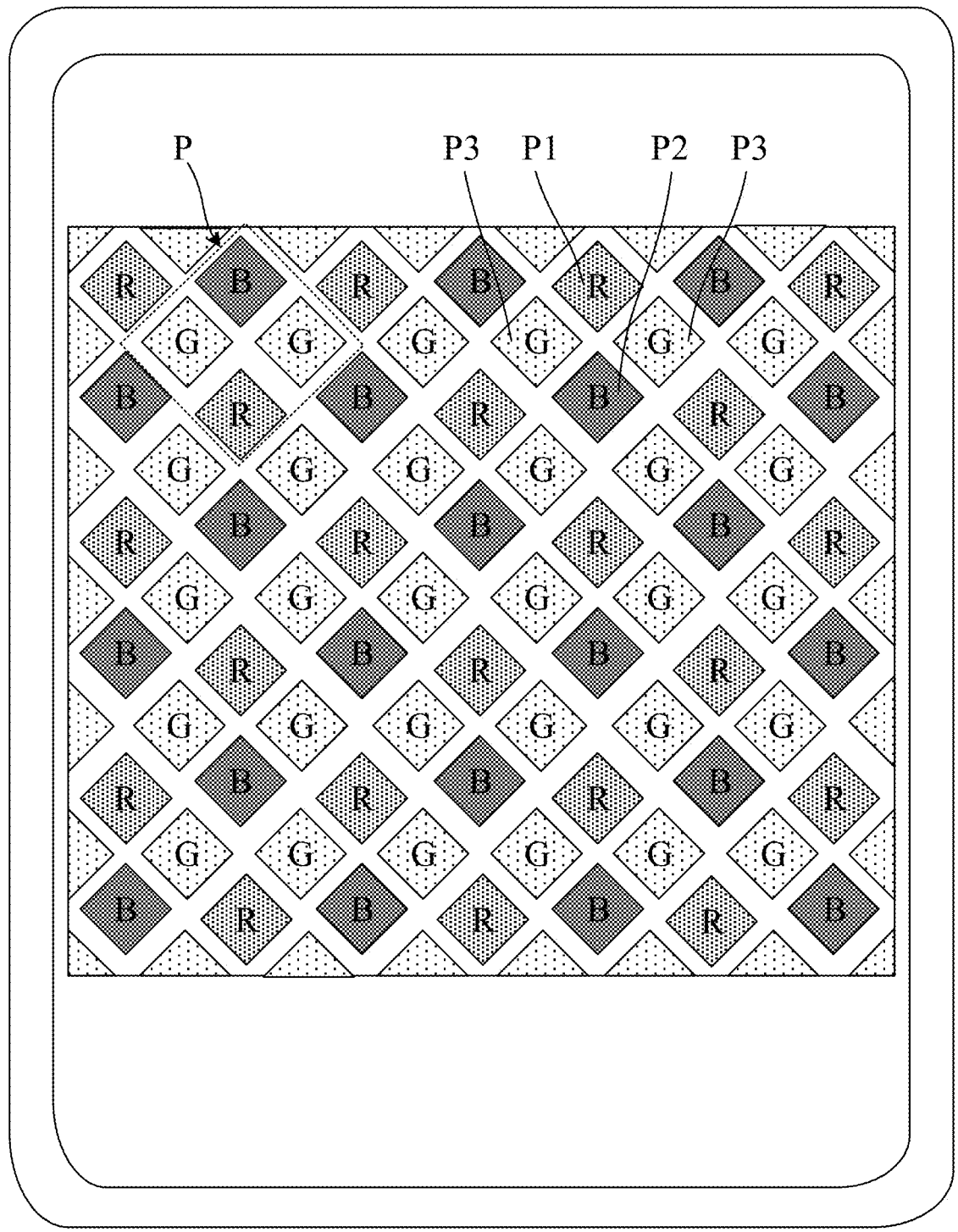
FIG. 29b is another layout of sub-pixels provided by the embodiment of the present disclosure.

In an exemplary embodiment, the first color sub-pixel P1 may be a red sub-pixel (R) that emits red light, and the sub-pixel driving circuit of the sub-pixel P1 is electrically connected to the first electrode (i.e., the anode) of the light-emitting element that emits red light, the second color sub-pixel P2 can be a blue sub-pixel (B) that emits blue light, the sub-pixel driving circuit of the sub-pixel P2 is electrically connected to the first electrode of the light-emitting element that emits blue light, and the third The sub-pixel P3 may be a green sub-pixel (G) that emits green light, and the sub-pixel driving circuit of the sub-pixel P3 is electrically connected to the first electrode of the light-emitting element that emits green light. In an exemplary embodiment, the main shape of the first electrode of the sub-pixel may be a rectangle shape, a diamond shape, a pentagon shape or a hexagon shape. The first electrodes of the four sub-pixels can be arranged in a square manner to form a GGRB pixel arrangement, as shown in FIG. 29*a*; they can also be arranged in a diamond manner to form an RGBG pixel arrangement, as shown in FIG. 29*b*. In an exemplary embodiment, the four sub-pixels may be arranged in parallel in a horizontal or vertical direction. In an exemplary embodiment, the pixel unit may include three sub-pixels, first electrodes of the three sub-pixels may be arranged in parallel in a horizontal or vertical direction or arranged in triangle, it is not limited herein.

Exemplarily, the plurality of rows of sub-pixel driving circuits are in one-to-one correspondence with the plurality of first transmission portions 20, and each sub-pixel driving circuit in each row of sub-pixel driving circuits is respectively coupled to the corresponding first transmission portion 20.

Exemplarily, the first transmission portion 20 includes a portion extending along the second direction and a portion extending along the first direction.

Exemplarily, the first transmission portion 20 includes a portion extending along a second direction, a portion extending along a first direction, and a portion extending along a third direction, and the third direction is intersect with each of the first direction and the second direction.

Exemplarily, adjacent first transmission portions 20 are coupled through a plurality of second transmission portions 21. The number of the plurality of second transmission portions 21 is less than or equal to the number of sub-pixel driving circuits included in one row of sub-pixel driving circuits.

Exemplarily, a part of the second transmission portion 21 can extend from the display area AA to the peripheral area 40. Exemplarily, the part of the second transmission portion 21 can also be coupled to a corresponding signal line in the peripheral area 40 to receive a corresponding initialization signal.

Exemplarily, the first transmission portion 20 and the second transmission portion 21 are arranged at the same layer or at different layers.

Exemplarily, the plurality of first transmission portions 20 include at least one target transmission portion 201. A second transmission portion 21 located between the target transmission portion 201 and the adjacent previous first transmission portion 20 is staggered in the second direction with a second transmission portion 21 located between the target transmission portion 201 and the adjacent next first transmission portion 20.

Exemplarily, a staggered distance is greater than or equal to a maximum width in the second direction of the orthographic projection of one sub-pixel driving circuit on the base substrate.

Exemplarily, the first direction includes a longitudinal direction, and the second direction includes a lateral direction.

Exemplarily, the display substrate includes a plurality of gate lines and a plurality of data lines, the gate lines include at least a portion extending along the second direction, and the data lines include at least a portion extending along the first direction.

According to the specific structure of the above-mentioned display substrate, in the display substrate provided by the embodiment of the present disclosure, the initialization signal transmission layer is set to include a plurality of first transmission portions 20 and a plurality of second transmission portions 21; the first transmission portions 20 includes at least a portion extending along the second direction, the second transmission portion 21 includes at least a portion extending along the first direction, and at least one second transmission portion 21 is used to couple the adjacent first transmission portions 20, so that the initialization signal transmission layer is formed into a grid shape. Compared with the conventional initialization signal transmission layer only including the lateral portion, the grid-shaped initialization signal transmission layer can reduce the initialization signal loading by about 20%, so that the initialization signal is charged faster, and the reset effect of the corresponding node is better. This beneficial effect is more pronounced for large-screen high-frequency panels.

Figure 9:
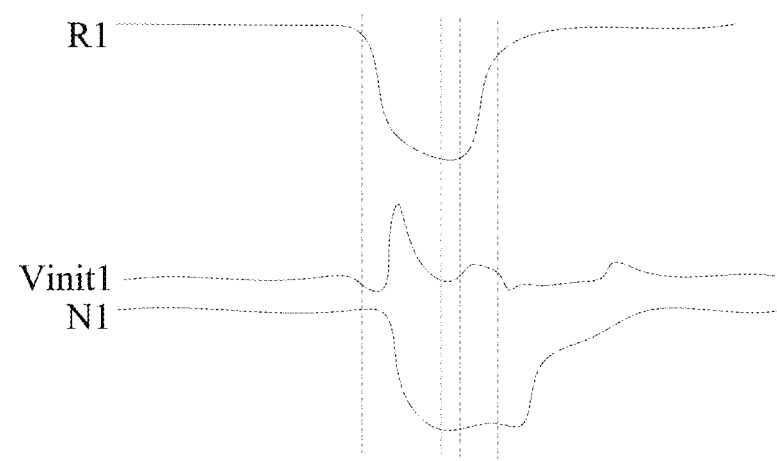
FIG. 9 is a schematic time sequence diagram of charging N1 node by the first initialization signal transmission layer according to an embodiment of the present disclosure.

More specifically, as shown in FIG. 9, the simulation is performed using a grid design for the initialization signal transmission layer. During the period when the reset signal inputted by the reset terminal is at a valid low level, the initialization signal transmitted by the initialization signal transmission layer can fully written to realize the reset of the N1 node.

Figure 10:
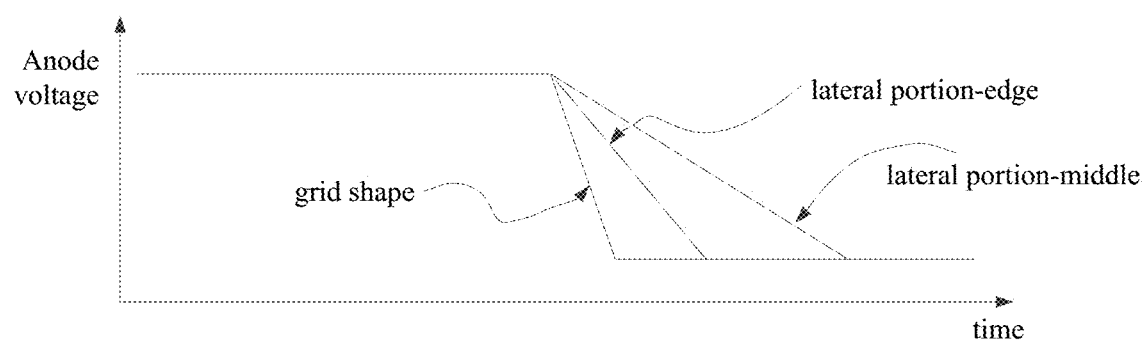
FIG. 10 is a schematic diagram of a reset speed of the anode which is reset by the grid-shaped initialization signal transmission layer and an existing initialization signal transmission layer according to an embodiment of the present disclosure.
Figure 11:
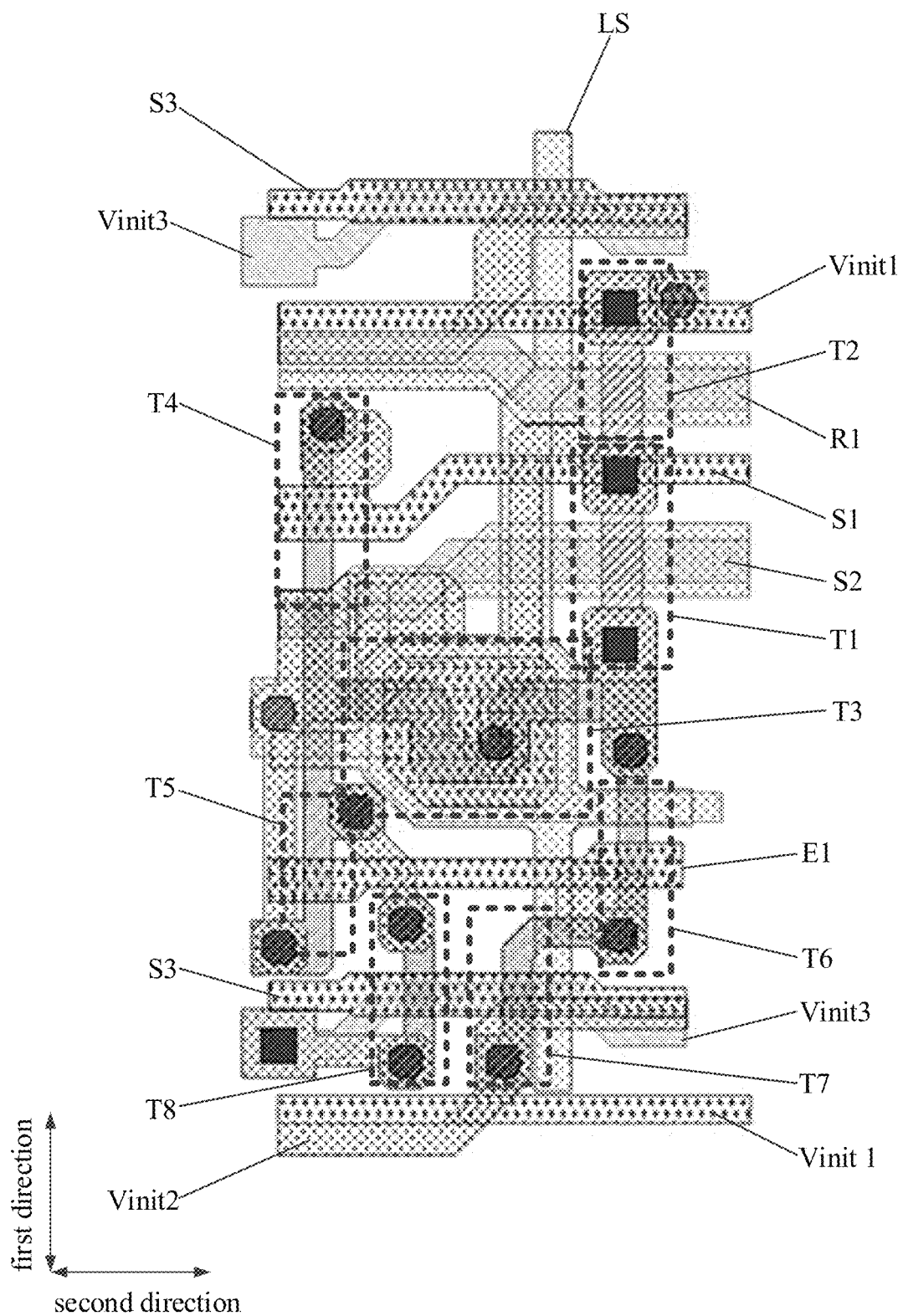
FIG. 11 is a schematic diagram of a first layout of sub-pixels according to an embodiment of the present disclosure.
Figure 12:
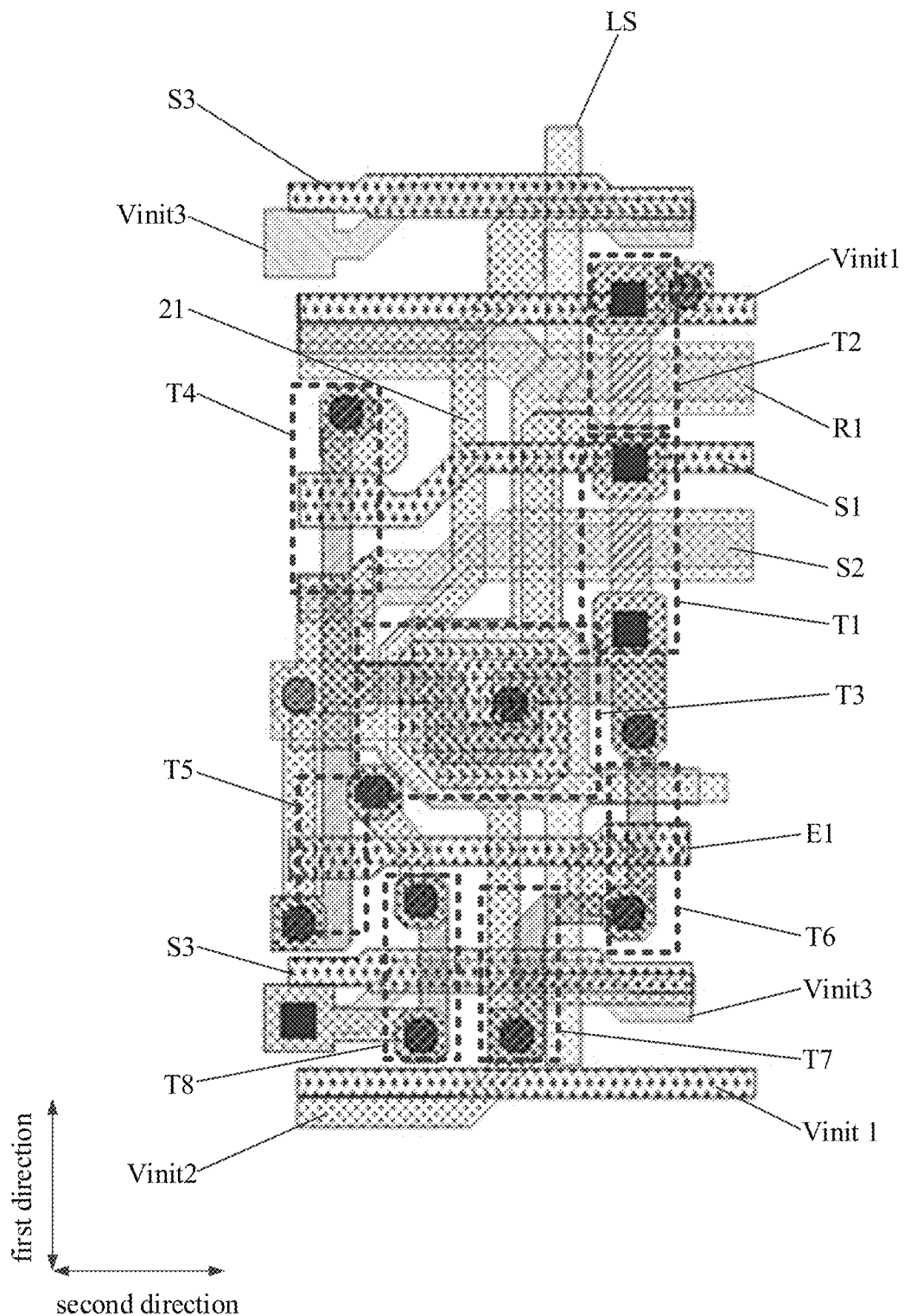
FIG. 12 is a schematic diagram of a second layout of sub-pixels according to an embodiment of the present disclosure.
Figure 13:
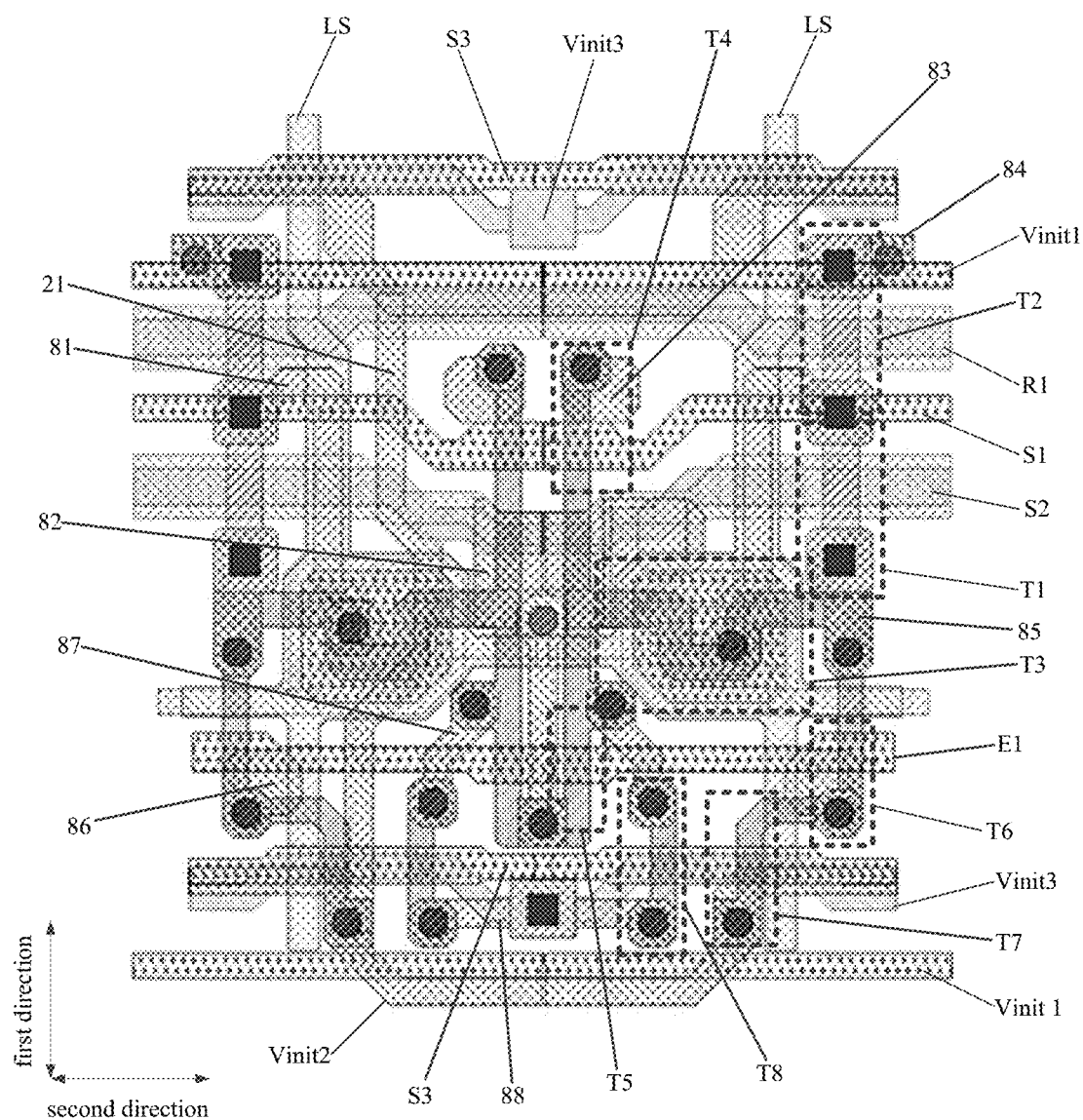
FIG. 13 is a schematic diagram of the layout of two adjacent sub-pixels according to an embodiment of the present disclosure.
Figure 14:
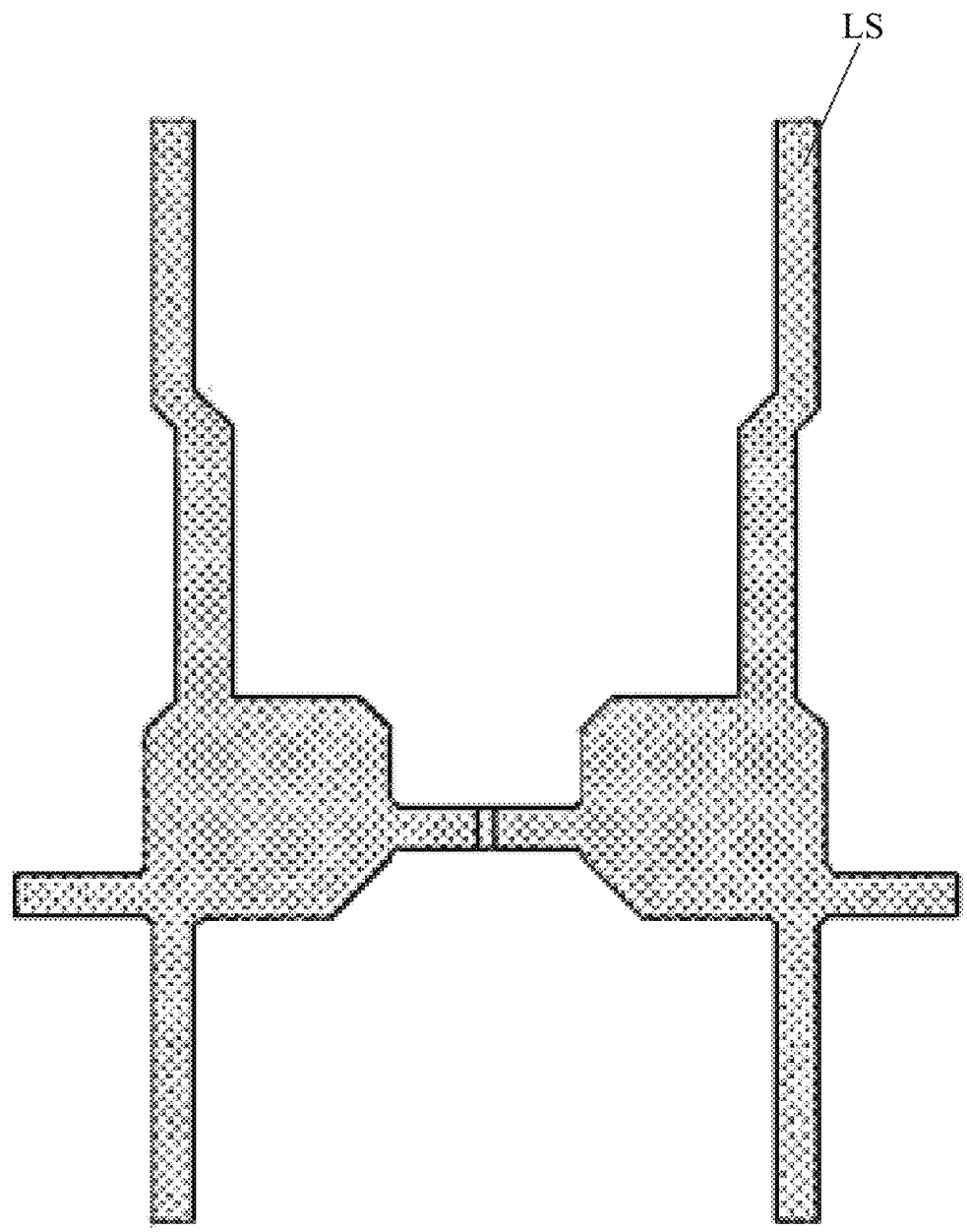
FIG. 14 is a schematic diagram of the layout of the light shielding layer in FIG. 13.

As shown in FIG. 10, the reset speed when the grid-shaped initialization signal transmission layer is used is faster than that when the initialization signal transmission layer including only the lateral portion is used. When the initialization signal transmission layer including only the lateral portion is used, the reset speed that can be achieved at the edge of the lateral portion is faster than the reset speed that can be achieved at the middle portion of the lateral portion.

In the display substrate provided by the embodiment of the present disclosure, the plurality of first transmission portions 20 include a target transmission portion 201, and the second transmission portion 21 located between the target transmission portion 201 and the adjacent previous first transmission portion 20 is staggered in the second direction with the second transmission portion 21 located between the target transmission portion 201 and the adjacent next first transmission portion 20. This arrangement is beneficial to increase the spacing between the adjacent second transmission portions 21 along the first direction, reduce the layout density of the second transmission portions 21, and overcome the problem of insufficient layout space.

Figure 5:
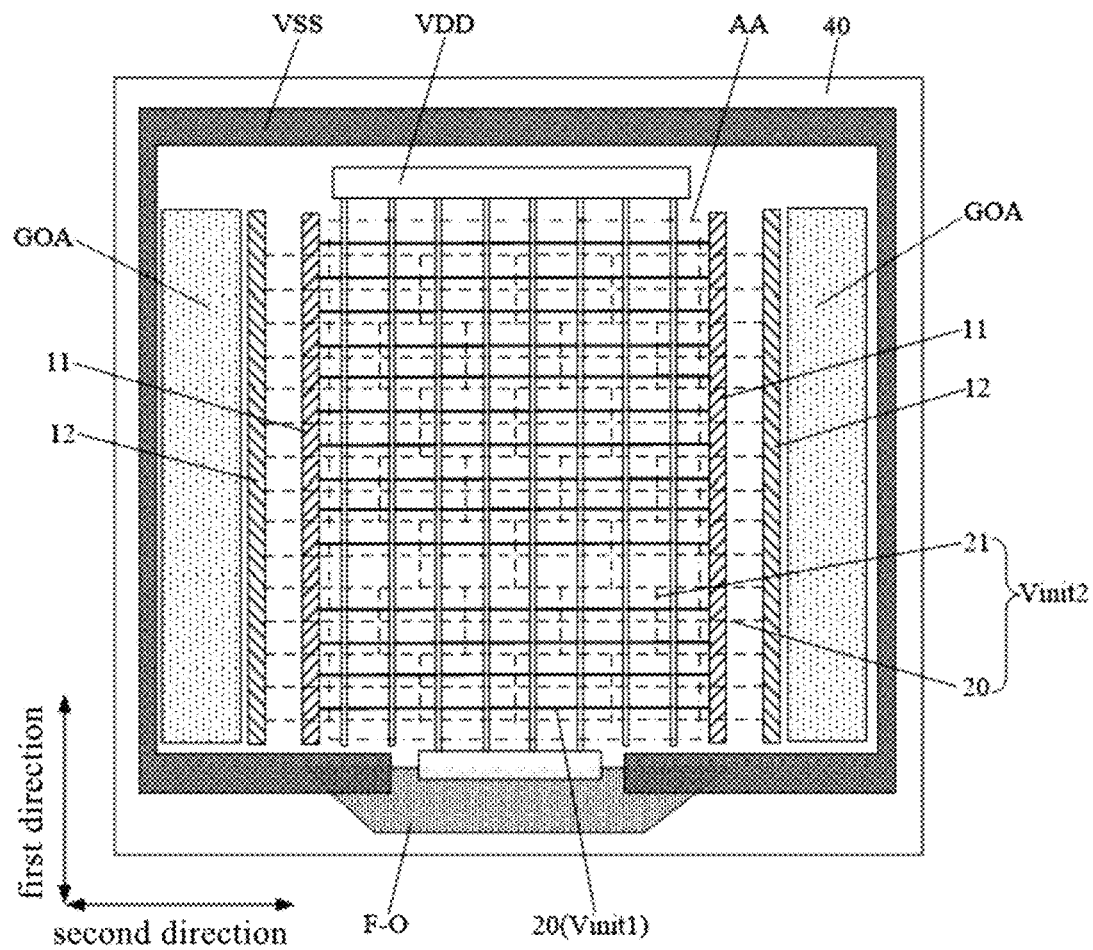
FIG. 5 is a schematic diagram of a second structure of a display substrate provided by an embodiment of the present disclosure.
Figure 6:
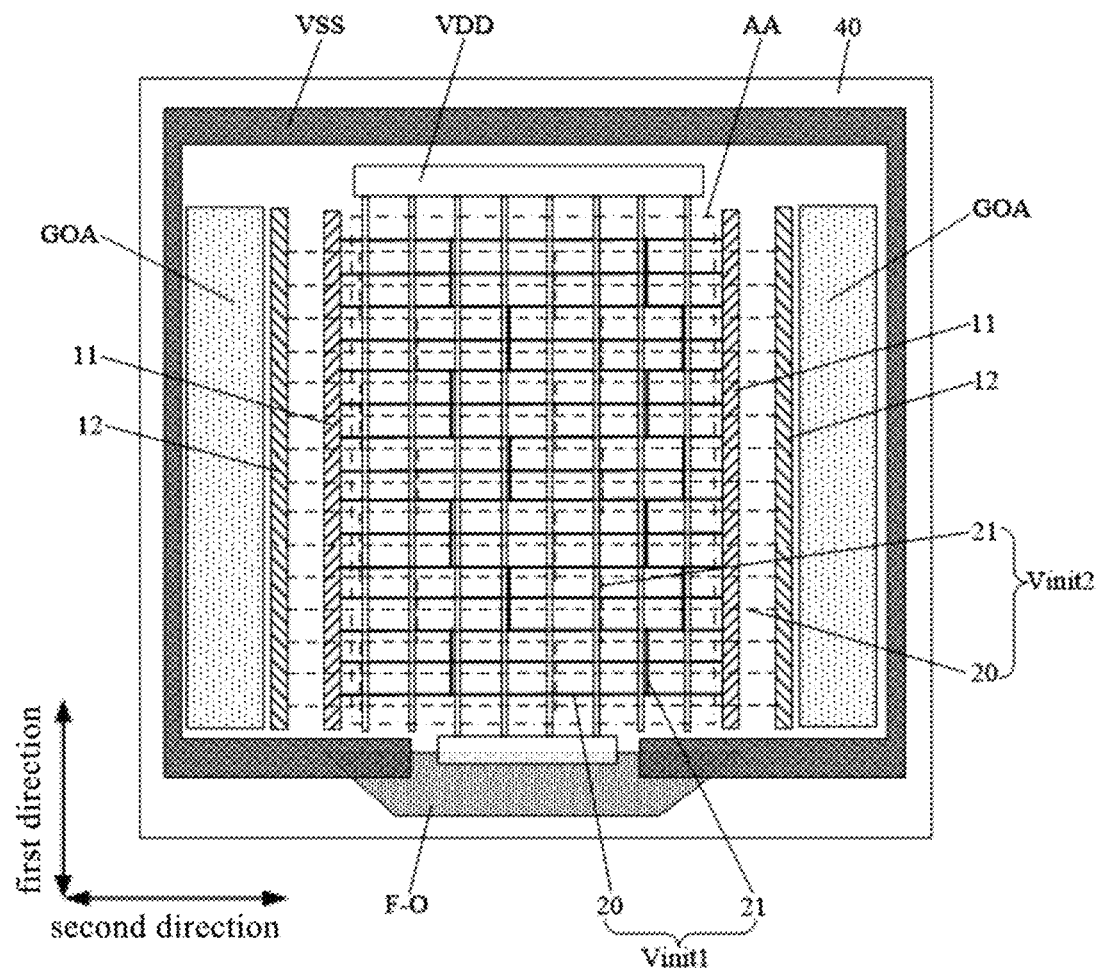
FIG. 6 is a schematic diagram of a third structure of a display substrate provided by an embodiment of the present disclosure.

As shown in FIG. 5 and FIG. 6, in some embodiments, the display substrate includes a first initialization signal transmission layer Vinit1 and a second initialization signal transmission layer Vinit2;

The initialization signal transmission layer is the first initialization signal transmission layer Vinit1 or the second initialization signal transmission layer Vinit2; or, The display substrate includes at least two initialization signal transmission layers, the first one of the at least two initialization signal transmission layers is the first initialization signal transmission layer Vinit1, and the second one of the at least two initialization signal transmission layers is the second initialization signal transmission layer Vinit2.

Exemplarily, the first initialization signal transmission layer Vinit1 is used for transmitting a first initialization signal, and the second initialization signal transmission layer Vinit2 is used for transmitting a second initialization signal.

Exemplarily, the initialization signal transmission layer is the first initialization signal transmission layer Vinit1 or the second initialization signal transmission layer Vinit2, so that the first initialization signal transmission layer Vinit1 or the second initialization signal transmission layer Vinit2 includes the first transmission unit 20 and the second transmission unit 21, so that the first initialization signal transmission layer Vinit1 or the second initialization signal transmission layer Vinit2 is formed in a grid shape.

Exemplarily, the display substrate includes at least two initialization signal transmission layers, the first one of the at least two initialization signal transmission layers is the first initialization signal transmission layer Vinit1, and the second one of the at least two initialization signal transmission layers is the second initialization signal transmission layer Vinit2, so that both the first initialization signal transmission layer Vinit1 and the second initialization signal transmission layer Vinit2 include the first transmission portion 20 and the second transmission portion 21, so that each of the first initialization signal transmission layer Vinit1 and the second initialization signal transmission layer Vinit2 is formed in a grid shape.

Exemplarily, the first initialization signal transmission layer Vinit1 and the second initialization signal transmission layer Vinit2 are insulated from each other.

The above setting method enables at least one of the first initialization signal transmission layer Vinit1 and the second initialization signal transmission layer Vinit2 to be formed into a grid structure, which is beneficial to reduce the loading of the first initialization signal transmission layer Vinit1 and the second initialization signal transmission layer Vinit2.

Figure 8:
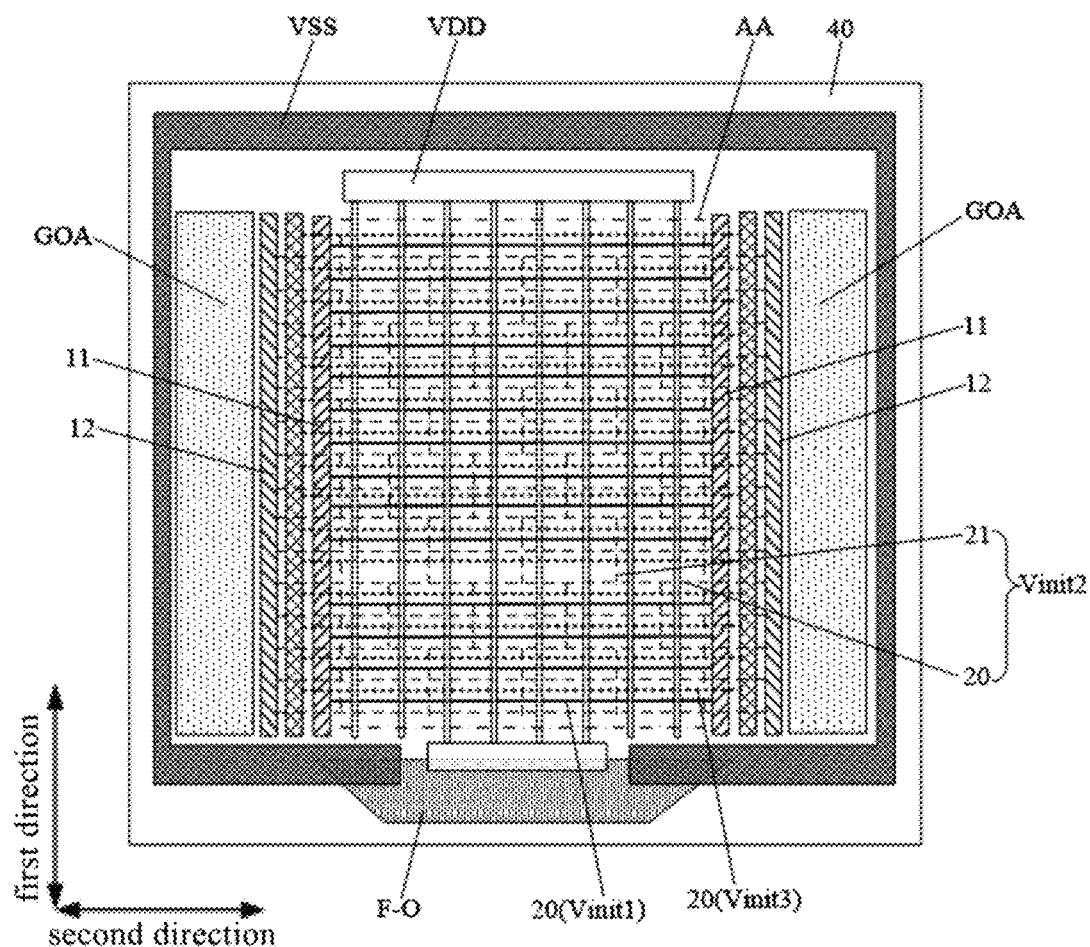
FIG. 8 is a schematic diagram of a fourth structure of a display substrate provided by an embodiment of the present disclosure.

As shown in FIG. 8, in some embodiments, the display substrate further includes a third initialization signal transmission layer Vinit3.

Exemplarily, the third initialization signal transmission layer Vinit3 is used to transmit a third initialization signal.

Exemplarily, the first initialization signal, the second initialization signal and the third initialization signal are different from each other.

Exemplarily, at least two of the first initialization signal, the second initialization signal and the third initialization signal are different.

Exemplarily, the third initialization signal may be a high level signal.

Exemplarily, the third initialization signal transmission layer Vinit3 only includes a plurality of the first transmission portions 20, so that when laying out the first initialization signal transmission layer Vinit1, the second initialization signal transmission layer Vinit2 and the third initialization signal transmission layer Vinit3, the overall layout space occupied by the first initialization signal transmission layer Vinit1, the second initialization signal transmission layer Vinit2 and the third initialization signal transmission layer Vinit3 are reduced, and the layout difficulty of the first initialization signal transmission layer Vinit1, the second initialization signal transmission layer Vinit2 and the third initialization signal transmission layer Vinit Vinit3 are reduced.

In some embodiments, the third one of the at least two initialization signal transmission layers is the third initialization signal transmission layer Vinit3.

Exemplarily, the display substrate includes two initialization signal transmission layers, one of the two initialization signal transmission layers is the first initialization signal transmission layer Vinit1, and the other of the two initialization signal transmission layers is the third initialization signal transmission layer Vinit3, the second initialization signal transmission layer Vinit2 only includes a plurality of the first transmission portions 20.

Exemplarily, the display substrate includes two initialization signal transmission layers, one of the two initialization signal transmission layers is the second initialization signal transmission layer Vinit2, and the other of the two initialization signal transmission layers is the third initialization signal transmission layer Vinit3, the first initialization signal transmission layer Vinit1 only includes a plurality of the first transmission portions 20.

Exemplarily, the display substrate includes three initialization signal transmission layers, the first one of the three initialization signal transmission layers is the first initialization signal transmission layer Vinit1, and the second one of the three initialization signal transmission layers is the second initialization signal transmission layer Vinit2, and the third one of the three initialization signal transmission layers is the third initialization signal transmission layer Vinit3.

In the display substrate provided by the above embodiment, among the first initialization signal transmission line, the second initialization signal transmission line and the third initialization signal transmission line, at least two initialization signal transmission lines are of the grid structure, which is beneficial to reduce loading of the first initialization signal transmission layer Vinit1, the second initialization signal transmission layer Vinit2 and/or the third initialization signal transmission layer Vinit3.

As shown in FIG. 8, in some embodiments, the display substrate is configured to include a first initialization signal transmission layer Vinit1, a second initialization signal transmission layer Vinit2 and a third initialization signal transmission layer Vinit3; the initialization signal transmission layer is one of the first initialization signal transmission layer Vinit1, the second initialization signal transmission layer Vinit2 and the third initialization signal transmission layer Vinit3.

Exemplarily, the initialization signal transmission layer is one of the first initialization signal transmission layer Vinit1, the second initialization signal transmission layer Vinit2 and the third initialization signal transmission layer Vinit3. The remaining two of the first initialization signal transmission layer Vinit1, the second initialization signal transmission layer Vinit2 and the third initialization signal transmission layer Vinit3 only include a plurality of the first transmission portions 20.

The above setting method is not only conducive to reducing the loading of the initialization signal transmission line, but also can overcome the problem of insufficient layout space and reduce the layout difficulty.

As shown in FIG. 2 and FIG. 3, in some embodiments, the plurality of first transmission portions 20 include a non-target transmission portion 202, the second transmission portion 21 located between the non-target transmission portion 202 and the adjacent previous first transmission portion 202 and the second transmission portion 21 located between the non-target transmission portion 202 and the adjacent next first transmission portion 20 are arranged in the same column along the first direction.

Exemplarily, the plurality of first transmission portions 20 include a plurality of non-target transmission portions 202, and the plurality of non-target transmission portions 202 include at least two adjacent non-target transmission portions 202, that is, there is no target transmission portion 201 between at least two adjacent non-target transmission portions 202.

Exemplarily, second transmission portions 21 that are not staggered may across 2-3 sub-pixel driving circuit layout areas along the first direction, that is, the second transmission portions 21 that are not staggered may access two sub-pixel driving circuit layout areas located in the same column along the first direction, or three sub-pixel driving circuits located in the same column.

Taking the second initialization signal transmission layer Vint2 including the first transmission portion 20 and the second transmission portion 21 as an example, the second transmission portion 21 can be electrically connected to two or three sub-pixel driving circuits located in the same column along the first direction at the same time.

Exemplarily, the second transmission portion 21 located between the non-target transmission portion 202 and the adjacent previous first transmission portion 20 and the second transmission portion 21 located between the non-target transmission portion 202 and the adjacent next first transmission portion 20 are formed as an integral structure.

Exemplarily, the second transmission portion 21 located between the non-target transmission portion 202 and the adjacent previous first transmission portion 20 and the second transmission portion 21 located between the non-target transmission portion 202 and the adjacent next first transmission portion 20 are not staggered along the second direction. The above setting method can effectively utilize the limited layout space, realize the initialization signal lines of the grid shape, and more effectively reduce the loading of the initialization signal lines.

As shown in FIG. 6, in some embodiments, the second transmission portion 21 in the first initialization signal transmission layer Vinit1 and the second transmission portion 21 in the second initialization signal transmission layer Vinit2 are staggered along the second direction.

Exemplarily, the staggered distance along the second direction between the second transmission portion 21 in the first initialization signal transmission layer Vinit1 and the second transmission portion 21 in the second initialization signal transmission layer Vinit2 is greater than or equal to the maximum layout space occupied by one sub-pixel driving circuit in the second direction.

The above setting method can not only reduce the mutual interference between the first initialization signal transmission layer Vinit1 and the second initialization signal transmission layer Vinit2, but also reduce the layout difficulty of the first initialization signal transmission layer Vinit1 and the second initialization signal transmission layer Vinit2.

In some embodiments, an orthographic projection of the second transmission portion 21 in the first initialization signal transmission layer Vinit1 on the base substrate at least partially overlaps an orthographic projection of the second transmission portion 21 in the second initialization signal transmission layer Vinit2 on the base substrate.

The above setting method can utilize the effective layout space, so that the first initialization signal transmission layer Vinit1 and the second initialization signal transmission layer Vinit2 can realize the grid-like layout in a better way.

In some embodiments, the second transmission portion 21 in the first initialization signal transmission layer Vinit1 and the second transmission portion 21 in the second initialization signal transmission layer Vinit2 are staggered in the second direction; and/or, The second transmission portion 21 in the first initialization signal transmission layer Vinit1 and the second transmission portion 21 in the third initialization signal transmission layer Vinit3 are staggered in the second direction; and/or, The second transmission portion 21 in the second initialization signal transmission layer Vinit2 and the second transmission portion 21 in the third initialization signal transmission layer Vinit3 are staggered in the second direction.

Exemplarily, the second transmission portion 21 in the first initialization signal transmission layer Vinit1 and the second transmission portion 21 in the second initialization signal transmission layer Vinit2 are staggered in the second direction; the second transmission portion 21 in the first initialization signal transmission layer Vinit1 and the second transmission portion 21 in the third initialization signal transmission layer Vinit3 are staggered in the second direction; the second transmission portion 21 in the second initialization signal transmission layer Vinit2 and the second transmission portion 21 in the third initialization signal transmission layer Vinit3 is staggered in the second direction.

Exemplarily, the two second transmission portions 21 being "staggered" mentioned in the present disclosure means that the sub-pixel driving circuit layout areas where the two second transmission portions 21 are respectively located are not in the same column.

Exemplarily, the second transmission portion 21 in the first initialization signal transmission layer Vinit1 and the second transmission portion 21 in the second initialization signal transmission layer Vinit2 are staggered in the second direction; or, the second transmission portion 21 in the first initialization signal transmission layer Vinit1 and the second transmission portion 21 in the third initialization signal transmission layer Vinit3 are staggered in the second direction; or, the second transmission portion 21 in the second initialization signal transmission layer Vinit2 and the second transmission portion 21 in the third initialization signal transmission layer Vinit3 are staggered in the second direction.

Exemplarily, the second transmission portion 21 in the first initialization signal transmission layer Vinit1 and the second transmission portion 21 in the second initialization signal transmission layer Vinit2 are staggered in the second direction; the second transmission portion 21 in the first initialization signal transmission layer Vinit1 and the second transmission portion 21 in the third initialization signal transmission layer Vinit3 are staggered in the second direction; the second transmission portion 21 in the second initialization signal transmission layer Vinit2 and the second transmission portion 21 in the third initialization signal transmission layer Vinit3 are not staggered in the second direction.

Exemplarily, the second transmission portion 21 in the first initialization signal transmission layer Vinit1 and the second transmission portion 21 in the second initialization signal transmission layer Vinit2 are staggered in the second direction; the second transmission portion 21 in the first initialization signal transmission layer Vinit1 and the second transmission portion 21 in the third initialization signal transmission layer Vinit3 are not staggered in the second direction; the second transmission portion 21 in the second initialization signal transmission layer Vinit2 and the second transmission portion 21 in the third initialization signal transmission layer Vinit3 are staggered in the second direction.

Exemplarily, the second transmission portion 21 in the first initialization signal transmission layer Vinit1 and the second transmission portion 21 in the second initialization signal transmission layer Vinit2 are not staggered in the second direction; the second transmission portion 21 in the first initialization signal transmission layer Vinit1 and the second transmission portion 21 in the third initialization signal transmission layer Vinit3 are staggered in the second direction; the second transmission portion 21 in the second initialization signal transmission layer Vinit2 and the second transmission portion 21 in the third initialization signal transmission layer Vinit3 are staggered in the second direction.

Exemplarily, the second transmission portion 21 in the first initialization signal transmission layer Vinit1 and the second transmission portion 21 in the second initialization signal transmission layer Vinit2 are not staggered in the second direction; the second transmission portion 21 in the first initialization signal transmission layer Vinit1 and the second transmission portion 21 in the third initialization signal transmission layer Vinit3 are not staggered in the second direction; the second transmission portion 21 in the second initialization signal transmission layer Vinit2 and the second transmission portion 21 in the third initialization signal transmission layer Vinit3 are staggered in the second direction.

Exemplarily, the second transmission portion 21 in the first initialization signal transmission layer Vinit1 and the second transmission portion 21 in the second initialization signal transmission layer Vinit2 are not staggered in the second direction; the second transmission portion 21 in the first initialization signal transmission layer Vinit1 and the second transmission portion 21 in the third initialization signal transmission layer Vinit3 are staggered in the second direction; the second transmission portion 21 in the second initialization signal transmission layer Vinit2 and the second transmission portion 21 in the third initialization signal transmission layer Vinit3 are not staggered in the second direction.

Exemplarily, the second transmission portion 21 in the first initialization signal transmission layer Vinit1 and the second transmission portion 21 in the second initialization signal transmission layer Vinit2 are staggered in the second direction; the second transmission portion 21 in the first initialization signal transmission layer Vinit1 and the second transmission portion 21 in the third initialization signal transmission layer Vinit3 are not staggered in the second direction; the second transmission portion 21 in the second initialization signal transmission layer Vinit2 and the second transmission portion 21 in the third initialization signal transmission layer Vinit3 are not staggered in the second direction.

Exemplarily, the second transmission portion 21 in the first initialization signal transmission layer Vinit1 and the second transmission portion 21 in the second initialization signal transmission layer Vinit2 are not staggered in the second direction; the second transmission portion 21 in the first initialization signal transmission layer Vinit1 and the second transmission portion 21 in the third initialization signal transmission layer Vinit3 are not staggered in the second direction; the second transmission portion 21 in the second initialization signal transmission layer Vinit2 and the second transmission portion 21 in the third initialization signal transmission layer Vinit3 are not staggered in the second direction.

The above setting method can utilize the effective layout space, so that the first initialization signal transmission layer Vinit1 and the second initialization signal transmission layer Vinit2 can realize the grid-like layout in a better way.

In some embodiments, the display substrate further includes a plurality of sub-pixels, and the sub-pixels include sub-pixel driving circuits; the plurality of sub-pixel driving circuits included in the plurality of sub-pixels are divided into a plurality of rows of sub-pixel driving circuits, and each sub-pixel driving circuit in each row of sub-pixel driving circuits is coupled to a corresponding first transmission portion 20;

The adjacent first transmission portions 20 are coupled through a plurality of the second transmission portions 21, among the plurality of the second transmission portions 21, the distance between adjacent second transmission portions 21 is greater than or equal to the maximum width in the second direction of the orthographic projection of one sub-pixel driving circuit on the base substrate.

Exemplarily, the sub-pixel driving circuit includes structures such as 7T1C (i.e., seven transistors and one capacitor) or 8T1C (i.e., eight transistors and one capacitor), but is not limited thereto.

Exemplarily, the adjacent first transmission portions 20 are coupled through a plurality of the second transmission portions 21, and among the plurality of the second transmission portions 21, the distance between the adjacent second transmission portions 21 is equal to the maximum width in the second direction of the orthographic projection of two sub-pixel driving circuits on the base substrate.

Exemplarily, the adjacent first transmission portions 20 are coupled through a plurality of the second transmission portions 21, and among the plurality of the second transmission portions 21, the distance between the adjacent second transmission portions 21 is equal to the maximum width in the second direction of the orthographic projection of four sub-pixel driving circuits on the base substrate.

The above setting method can utilize the effective layout space, so that the first initialization signal transmission layer Vinit1 and the second initialization signal transmission layer Vinit2 can realize the grid-like layout in a better way.

As shown in FIG. 13 to FIG. 26, in some embodiments, adjacent sub-pixel driving circuits in the same row of sub-pixel driving circuits are arranged symmetrically as a whole; the sub-pixels further include a plurality of data lines and a plurality of power supply lines VDD, data lines adjacent in the second direction are symmetrically arranged, and power supply lines adjacent in the second direction are symmetrically arranged.

It should be noted that symmetrically arranged as the whole means that the channels of the transistors are symmetrically arranged, and the sub-pixel driving circuit is generally symmetrical as a whole, but each film layer is not required to be completely symmetrical. For example, the second conductive portion 82 made of the second source-drain metal layer is asymmetrical.

Exemplarily, the display substrate further includes: a plurality of first scan lines S1, a plurality of second scan lines S2, a plurality of third scan lines S3, a plurality of reset lines R1 and a plurality of light emitting control lines E1. The display substrate includes a plurality of driving circuit layout areas, and a corresponding sub-pixel driving circuit is arranged in each driving circuit layout area. A part of the first scan lines S1 located in two adjacent driving circuit layout areas along the second direction are symmetrical, and the symmetry axis is located at the junction of the two adjacent driving circuit layout areas and extends along the first direction.

A part of the second scan lines S2 located in two adjacent driving circuit layout areas along the second direction are symmetrical, and the symmetry axis is located at the junction of the two adjacent driving circuit layout areas and extends along the first direction.

A part of the third scan lines S3 located in two adjacent driving circuit layout areas along the second direction are symmetrical, and the symmetry axis is located at the junction of the two adjacent driving circuit layout areas and extends along the first direction.

A part of the reset lines R1 located in two adjacent driving circuit layout areas along the second direction are symmetrical, and the symmetry axis is located at the junction of the two adjacent driving circuit layout areas and extends along the first direction.

A part of the light-emitting control lines E1 located in two adjacent driving circuit layout areas along the second direction are symmetrical, and the symmetry axis is located at the junction of the two adjacent driving circuit layout areas and extends along the first direction.

Exemplarily, the sub-pixel further includes a light-emitting element, and the light-emitting element includes an anode, and the anode is arranged at a side of the sub-pixel driving circuit away from the base substrate.

The above arrangement makes the structures under the anode (that is, between the anode and the base substrate, such as the sub-pixel driving circuit, the first scan line S1, the second scan line S2, the third scan line S3, the reset line R1, the light emitting control line E1, the data line and the power line VDD, etc.) are arranged symmetrically, which can improve the flatness of the anode 50 and improve the transmittance of the pixels.

Figure 26:
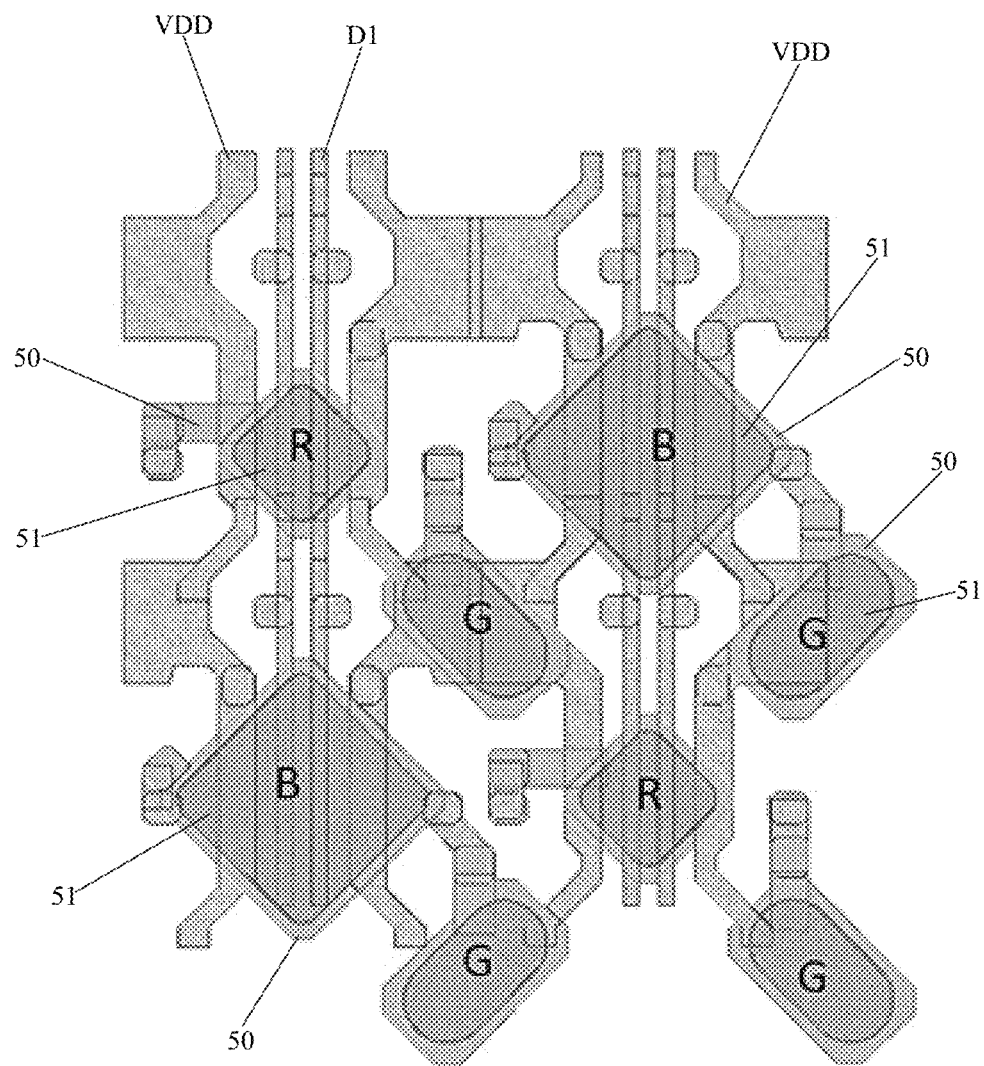
FIG. 26 is a schematic diagram of the layout of the second source-drain metal layer and an anode layer according to an embodiment of the present disclosure.
Figure 27:
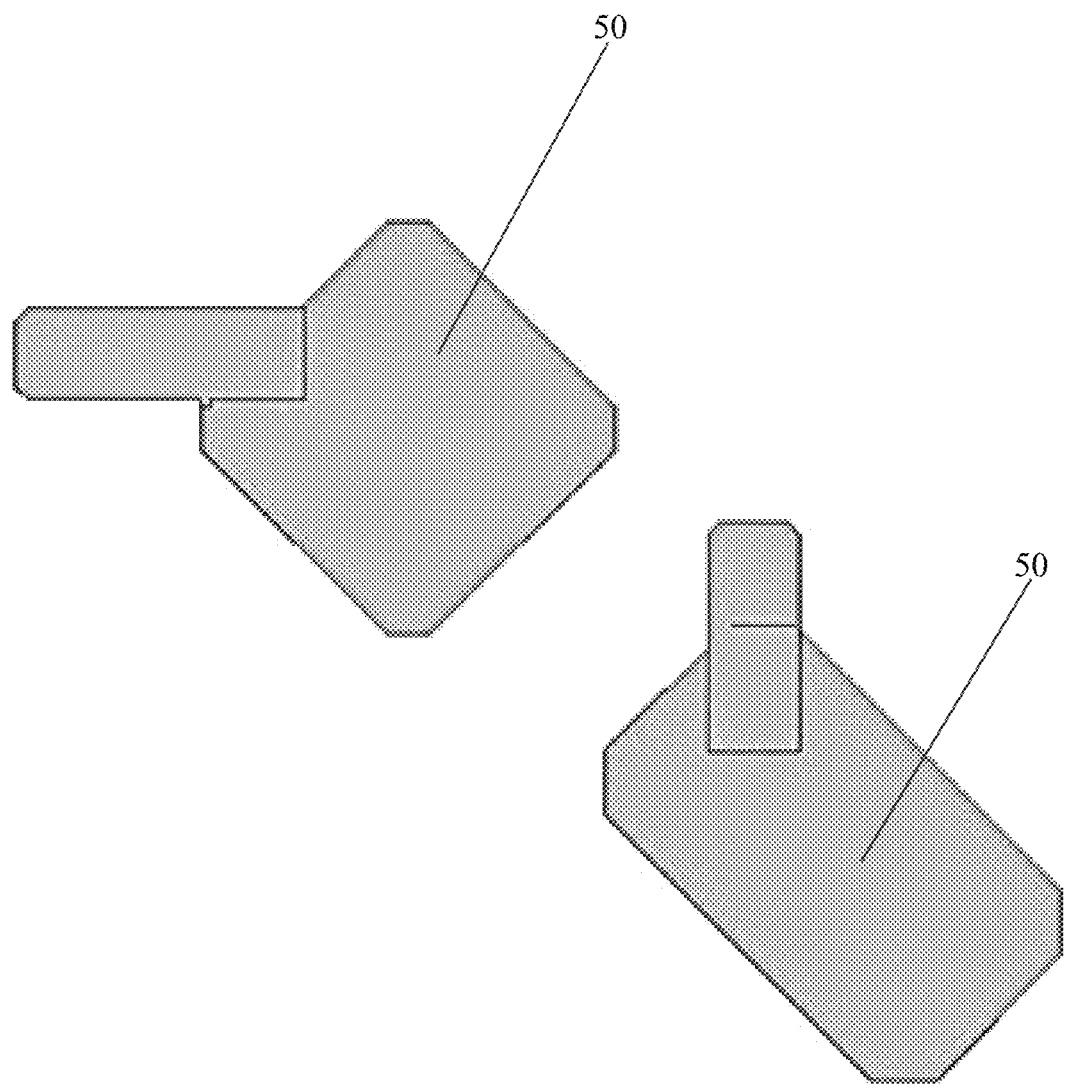
FIG. 27 is a schematic diagram of the layout of the anode layer provided by an embodiment of the present disclosure.
Figure 28:
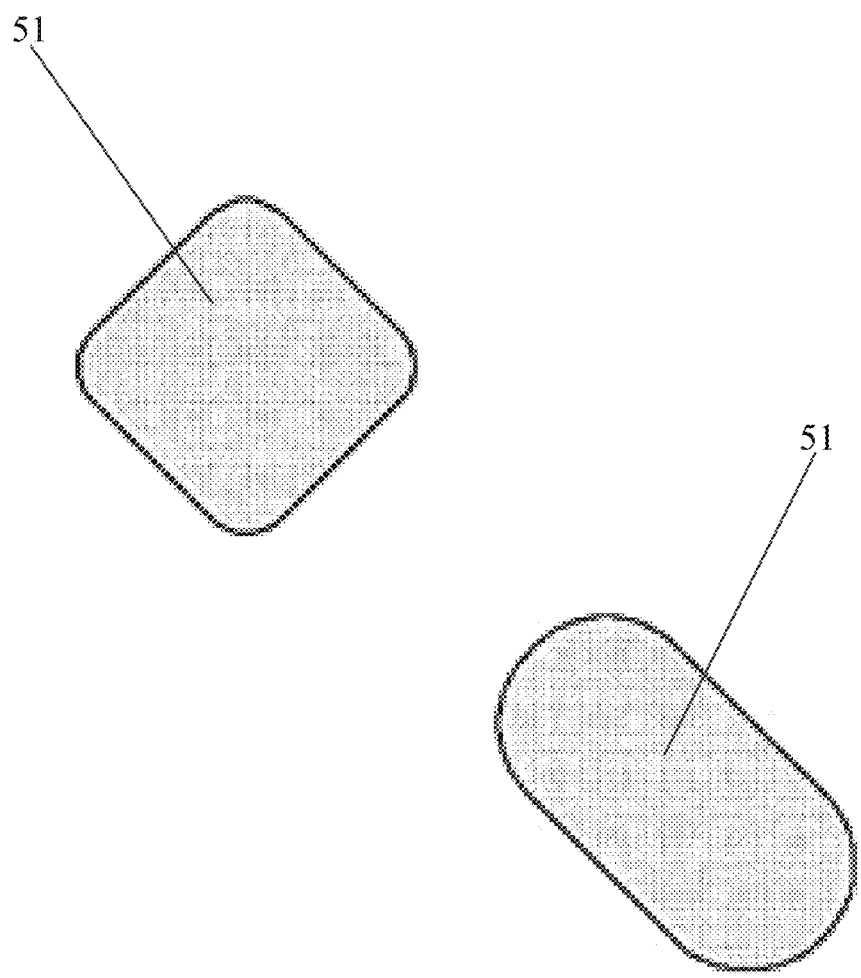
FIG. 28 is a schematic diagram of the layout of a pixel opening provided by an embodiment of the present disclosure.

It should be noted that, as shown in FIGS. 26 to 28, the display substrate includes a pixel defining layer, and the pixel defining layer defines a pixel opening 51.

In some embodiments, the first transmission portion 20 and the second transmission portion 21 form an integral structure.

The above arrangement enables the first transmission portion 20 and the second transmission portion 21 to be formed at the same time in the same patterning process and to be connected to each other, thereby simplifying the manufacturing process of the initialized signal transmission layer and reducing the production cost.

In some embodiments, as shown in FIG. 7, the sub-pixel driving circuit includes a storage capacitor C, a first transistor T1, a second transistor T2, a third transistor T3, a fourth transistor T4, a fifth transistor T5, a sixth transistor T6, a seventh transistor T7 and an eighth transistor T8.

The storage capacitor C is coupled to the power line VDD and the gate electrode of the third transistor T3, respectively. Exemplarily, the gate electrode of the third transistor T3 is multiplexed as the first electrode plate of the storage capacitor C, and the second electrode plate C-2 of the storage capacitor C is coupled to the power line VDD.

A gate electrode of the first transistor T1 is coupled to the second scan line S2, a first electrode of the first transistor T1 is coupled to a second electrode of the third transistor T3, and a second electrode of the first transistor T1 is coupled to a gate electrode of the third transistor T3;

A gate electrode of the second transistor T2 is coupled to the reset line R1, a first electrode of the second transistor T2 is coupled to the first initialization signal transmission layer Vinit1, and a second electrode of the second transistor T2 is coupled to the gate electrode of the third transistor T3;

A gate electrode of the fourth transistor T4 is coupled to the first scan line S1, a first electrode of the fourth transistor T4 is coupled to the light-emitting control line E1, and a second electrode of the fourth transistor T4 coupled to a first electrode of the third transistor T3;

A gate electrode of the fifth transistor T5 is coupled to the light-emitting control line E1, a first electrode of the fifth transistor T5 is coupled to the power line VDD, and a second electrode of the fifth transistor T5 is coupled to the first electrode of the third transistor T3;

A gate electrode of the sixth transistor T6 is coupled to the light-emitting control line E1, a first electrode of the sixth transistor T6 is coupled to the second electrode of the third transistor T3, and a second electrode of the sixth transistor T6 is coupled to the light-emitting element O1.

A gate electrode of the seventh transistor T7 is coupled to the third scan line S3, a first electrode of the seventh transistor T7 is coupled to the second initialization signal transmission layer Vinit2, and a second electrode of the seventh transistor T7 is coupled to the light-emitting element O1.

A gate electrode of the eighth transistor T8 is coupled to the third scan line S3, a first electrode of the eighth transistor T8 is coupled to the third initialization signal transmission layer Vinit3, and a second electrode of the eighth transistor T8 is coupled to the first electrode or the second electrode of the third transistor T3.

It should be noted that the N1 node is also shown in FIG. 7, the N1 node is a node connected to the gate electrode of the third transistor T3, and the third transistor T3 is a driving transistor.

In some embodiments, the first transistor T1 and the second transistor T2 are oxide thin film transistors.

Exemplarily, the first transistor T1 and the second transistor T2 include oxide transistors, that is, the pixel driving circuit may include both low temperature polysilicon (LTPS) and oxide transistors, that is, LTPO technology is adopted.

The first transistor T1 and the second transistor T2 are oxide thin film transistors, which is beneficial to reduce the gate leakage of the driving transistor and ensure the stability of the potential of the gate electrode of the driving transistor.

Figure 30:
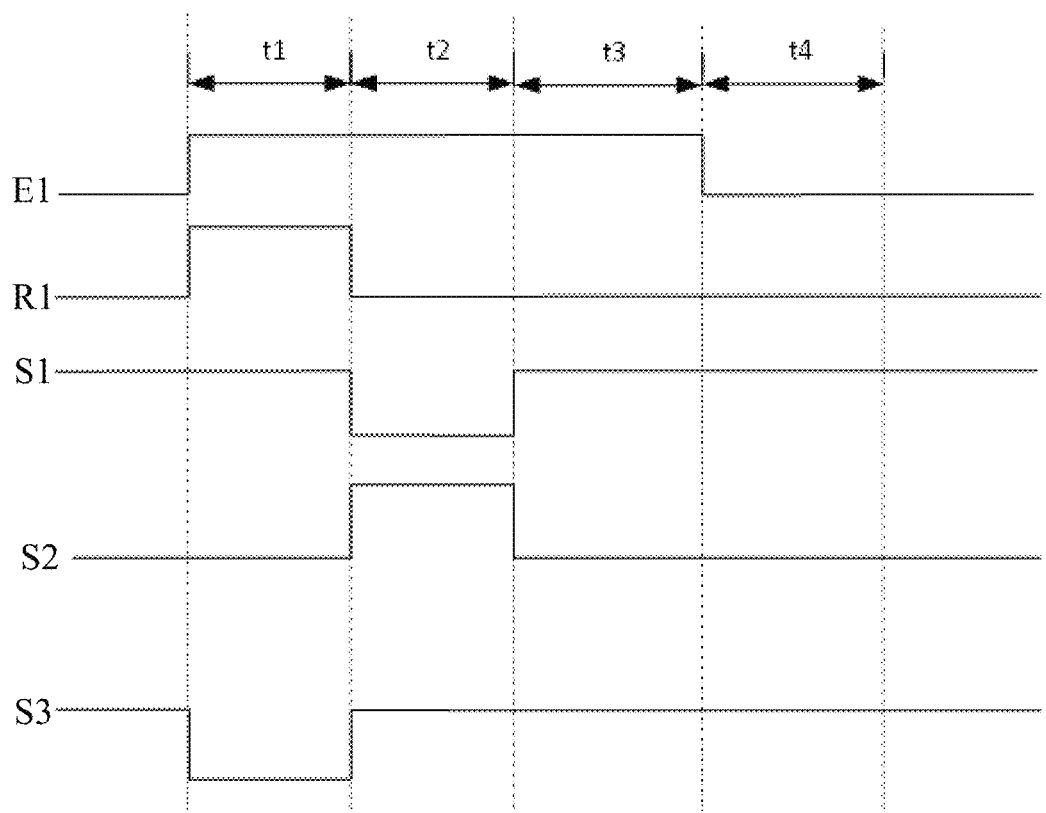
FIG. 30 is a driving timing diagram of a sub-pixel driving circuit provided by an embodiment of the present disclosure.
Figure 31A:
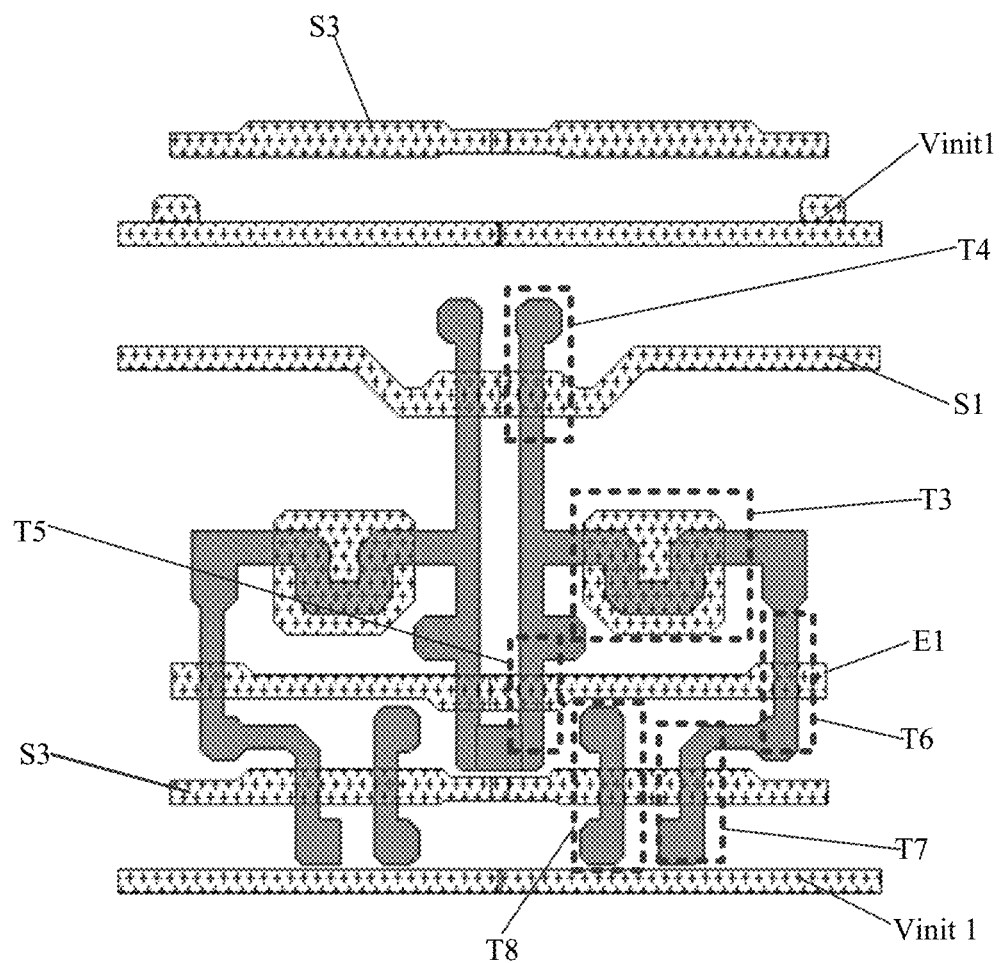
FIG. 31a is a schematic diagram of the layout of the poly active layer and the first gate metal layer in FIG. 13.
Figure 31B:
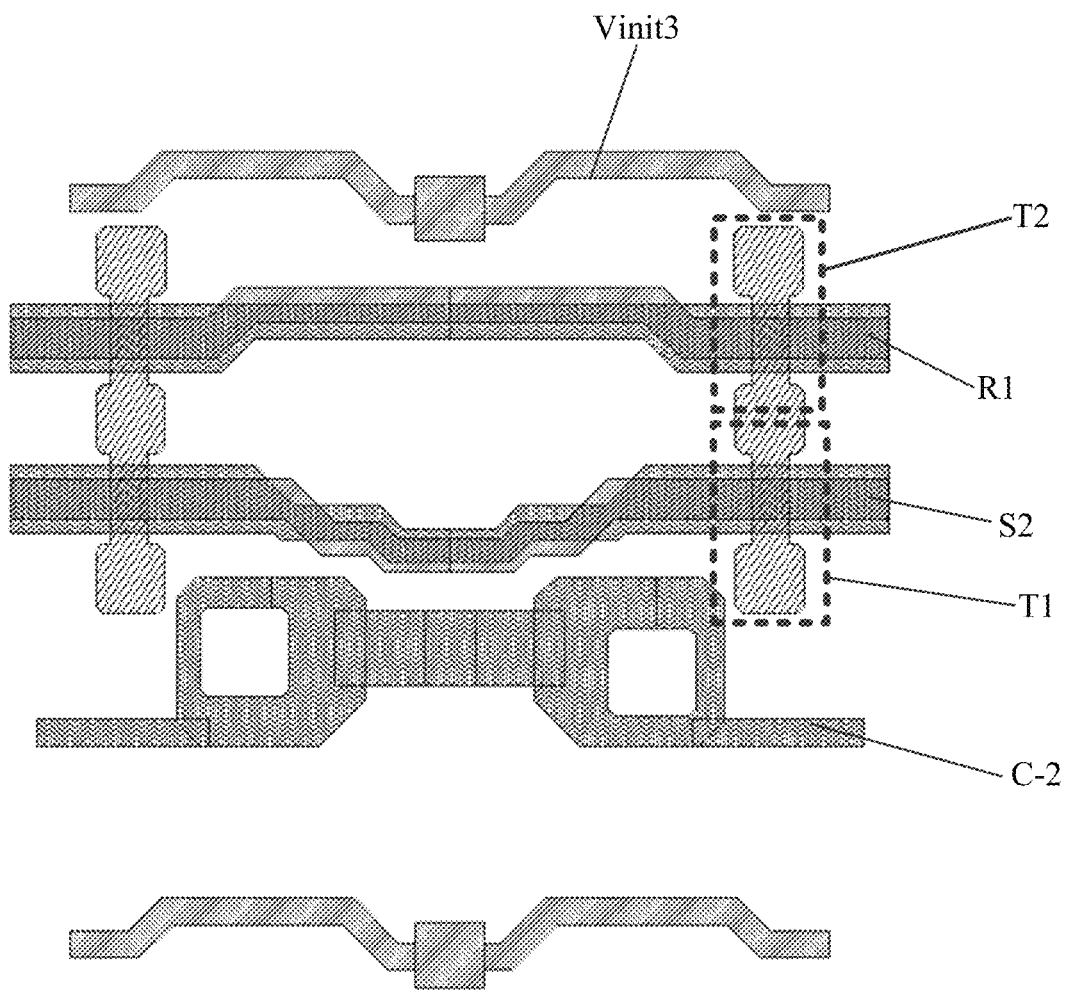
FIG. 31b is a schematic diagram of the layout of the oxide active layer, the second gate metal layer and the third gate metal layer in FIG. 13.
Figure 32:
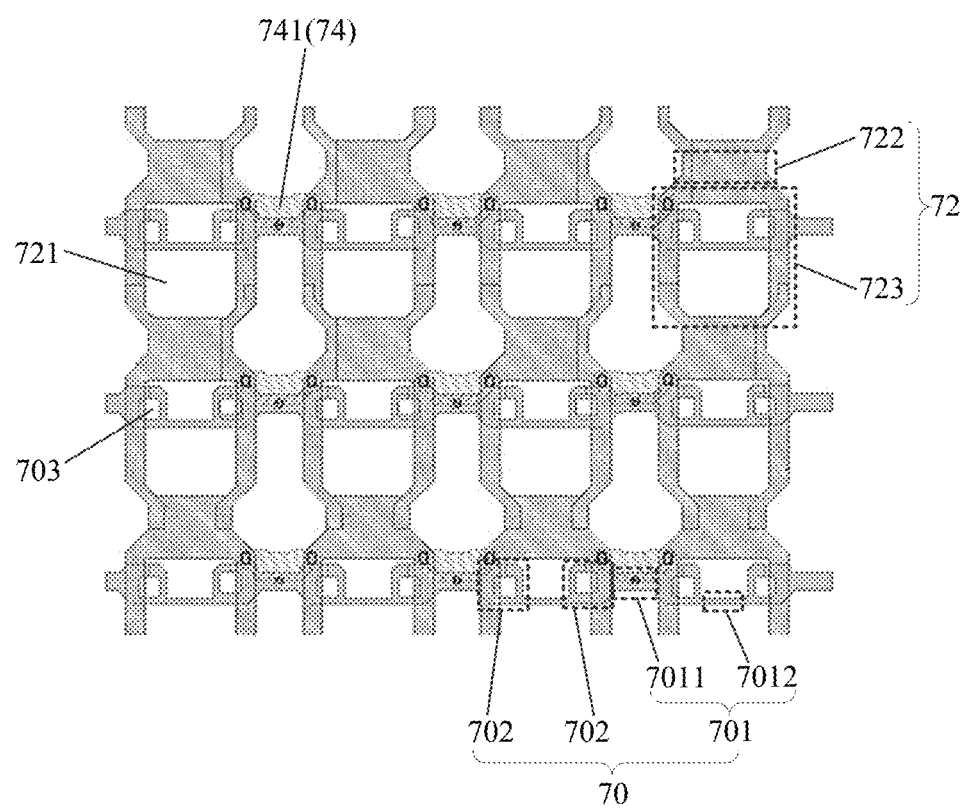
FIG. 32 is a first schematic diagram of a signal line film layer provided by an embodiment of the present disclosure.

FIG. 30 is a timing diagram corresponding to the driving method of the sub-pixel driving circuit in FIG. 7, the driving method may include four phases: a reset phase t1, a threshold compensation phase t2, a buffer phase t3, and a light-emitting phase t4.

In the reset phase t1, the light-emitting control line E1, the reset line R1, and the first scan line S1 output a high-level signal, the second scan line S2 and the third scan line S3 output a low-level signal, and the second transistor T2, the seventh transistor T7, and the eighth transistor T8 are turned on, the first initialization signal transmission layer Vinit1 inputs the first initialization signal, the power line VDD inputs the power supply signal, the second initialization signal transmission layer Vinit2 inputs the second initialization signal, voltage of the first initialization signal and voltage of the second initialization signal can be the same or different.

In the threshold compensation phase t2: the light-emitting control line E1, the second scan line S2, and the third scan line S3 output a high-level signal, the reset line R1 and the first scan line S1 output a low-level signal, the first transistor T1 and the fourth transistor T4 are turned on, and the data line D1 writes the compensation voltage Vdata+Vth to the first node N1, wherein Vdata is the voltage value corresponding to the data signal, and Vth is the threshold voltage of the driving transistor.

In the buffer phase t3: the light-emitting control line E1, the third scan line S3, and the first scan line S1 output a high-level signal, the second scan line S2 and the reset line R1 output a low-level signal, and all transistors are turned off.

In the light-emitting phase t4: the third scan line S3 and the first scan line S1 output a high-level signal, the light-emitting control line E1, the second scan line S2, and the reset line R1 output a low-level signal, the fifth transistor T5 and the sixth transistor T6 are turned on, and the driving transistor emits light under the action of the voltage Vdata+ Vth stored in the storage capacitor C.

It should be understood that, in other exemplary embodiments, the driving method may not include a buffer phase; the second transistor T2 and the seventh transistor T7 may also be turned on in different phases. In the threshold compensation phase t2, the duration of the active level (low level) corresponding to the first scan line S1 may be shorter than the duration of the active level (high level) corresponding to the second scan line S2. In the threshold compensation phase t2, the first scan line S1 can scan one row of sub-pixel driving circuits, and the second scan line S2 can scan multiple rows of sub-pixel driving circuits row by row, for example, two rows of sub-pixel driving circuits.

A high potential is applied to the source electrode of the driving transistor through T8, which can effectively improve the afterimage problem in the sub-pixel driving circuit caused by the difference in gate-source voltage of the driving transistor under different data signals.

Exemplarily, the reset line R1 includes two layers, wherein one layer is made of the second gate metal layer, and the other layer is made of the third gate metal layer.

Exemplarily, the second scan line S2 includes two layers, wherein one layer is made of the second gate metal layer, and the other layer is made of the third gate metal layer.

As shown in FIGS. 11 to 25, in some embodiments, the display substrate further includes a plurality of sub-pixels; the sub-pixel includes a sub-pixel driving circuit, and the sub-pixel driving circuit includes a driving transistor (i.e., the third transistor T3).

The orthographic projection of the second transmission portion 21 on the base substrate partially overlaps the orthographic projection of the corresponding gate electrode of the driving transistor (i.e., the gate electrode T3-g of the third transistor T3) on the base substrate.

Figure 15:
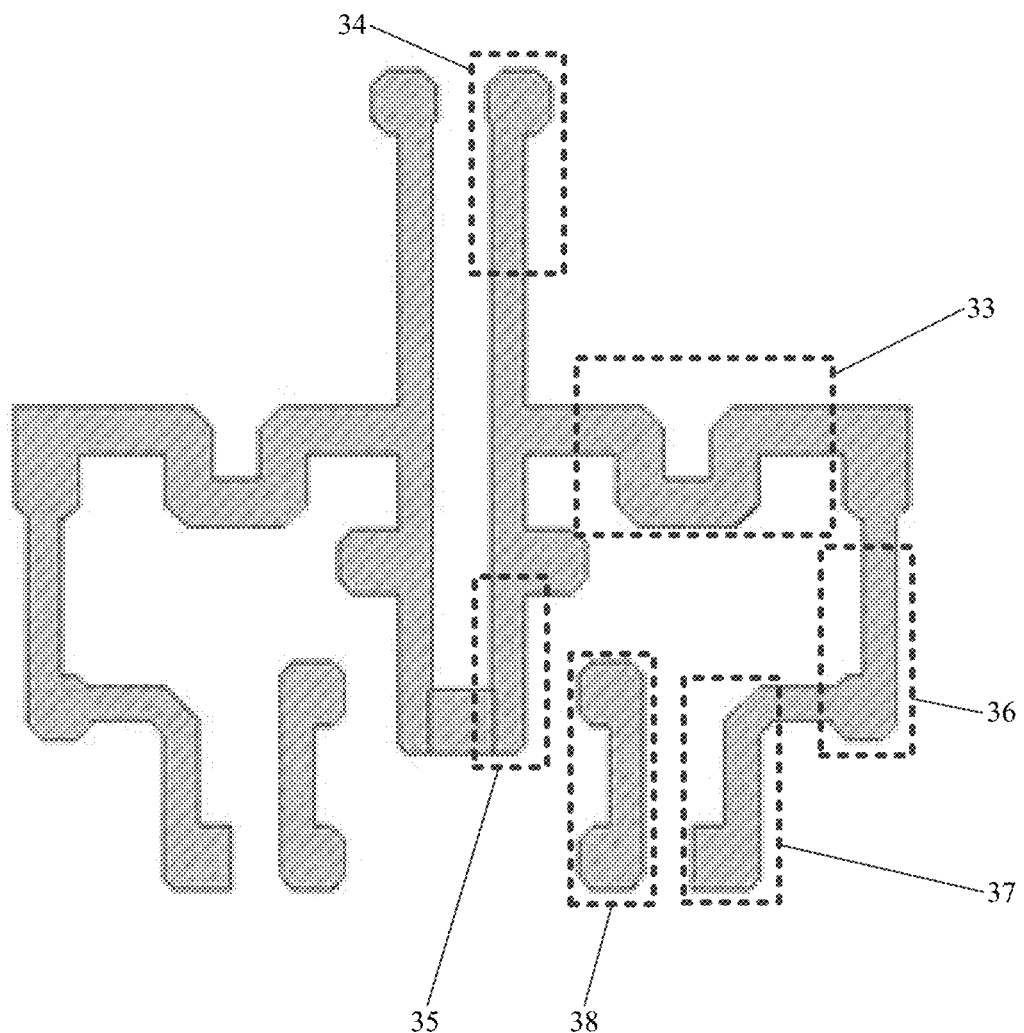
FIG. 15 is a schematic diagram of the layout of the poly active layer in FIG. 13.
Figure 16:
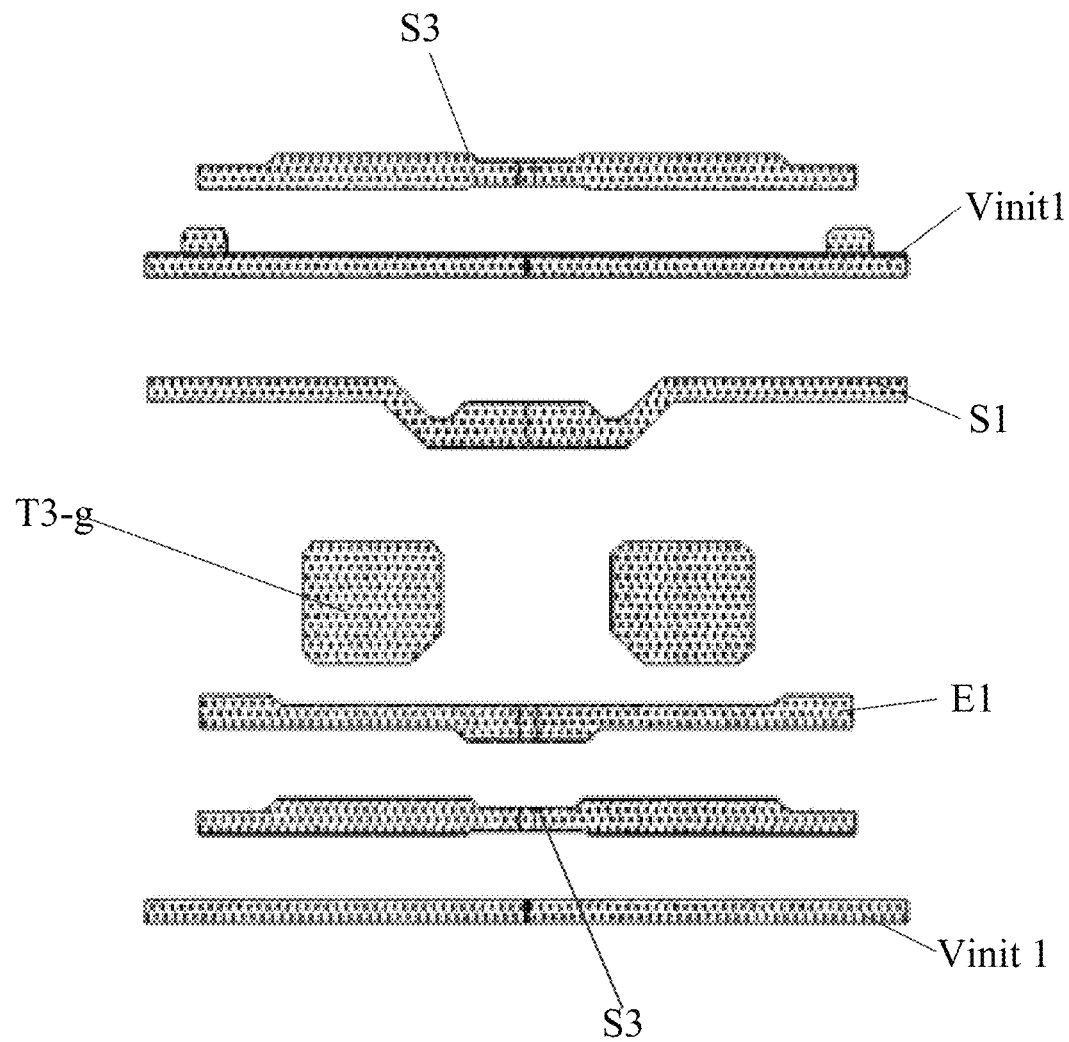
FIG. 16 is a schematic diagram of the layout of the first gate metal layer in FIG. 13.
Figure 17:
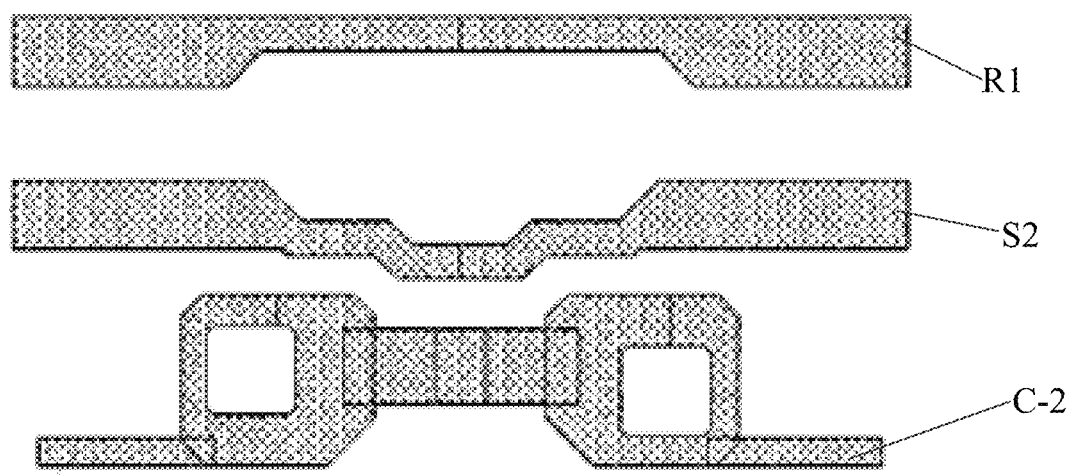
FIG. 17 is a schematic diagram of the layout of the second gate metal layer in FIG. 13.
Figure 18:
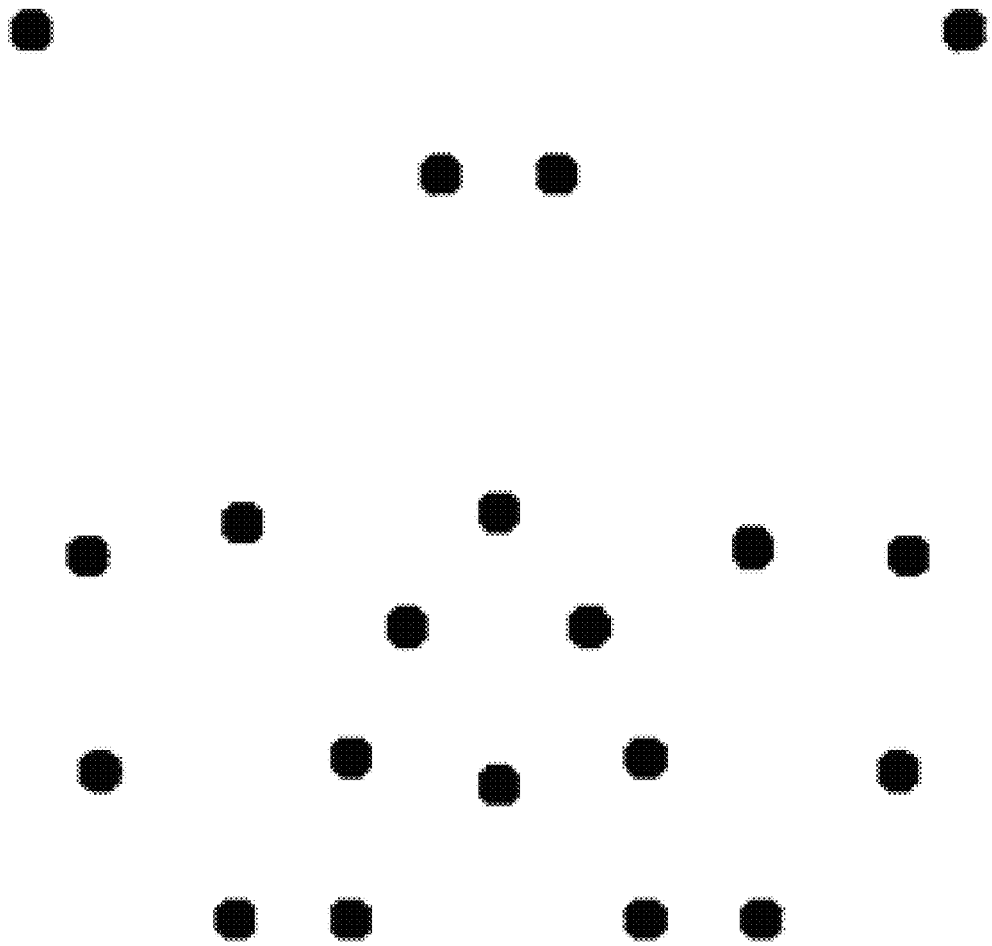
FIG. 18 is a schematic diagram of the layout of the first connection hole in FIG. 13.
Figure 19:
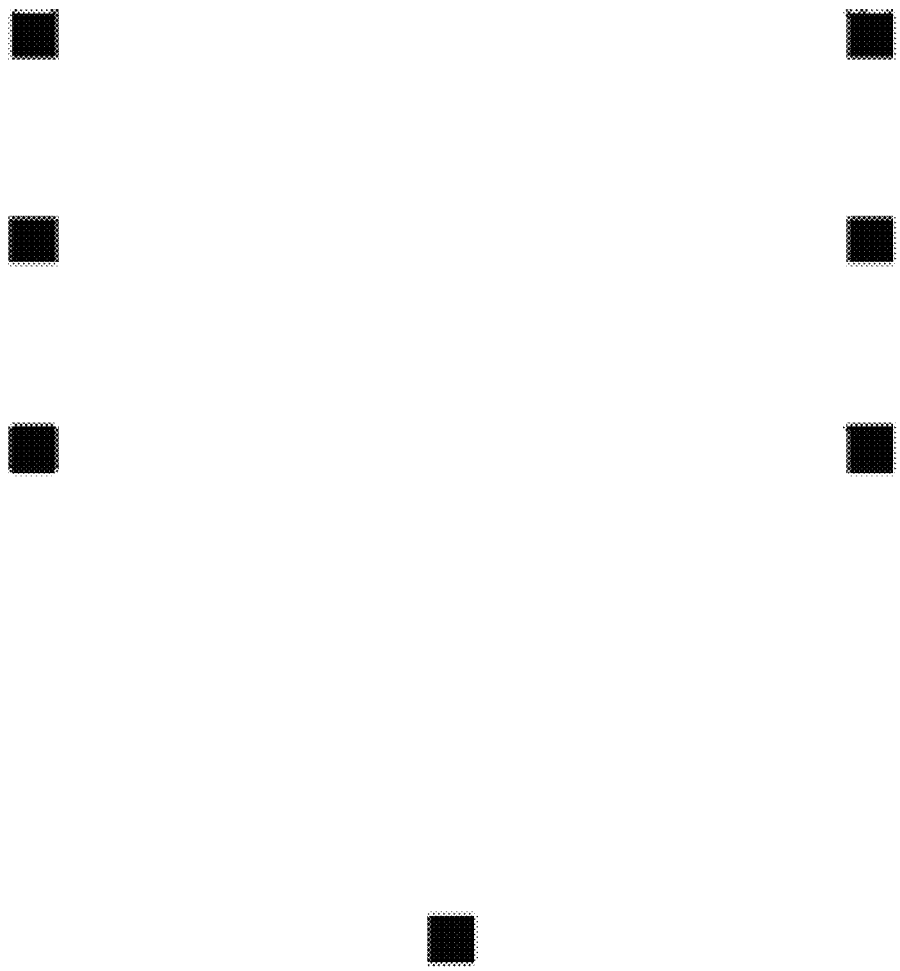
FIG. 19 is a schematic diagram of the layout of the second connection hole in FIG. 13.
Figure 20:
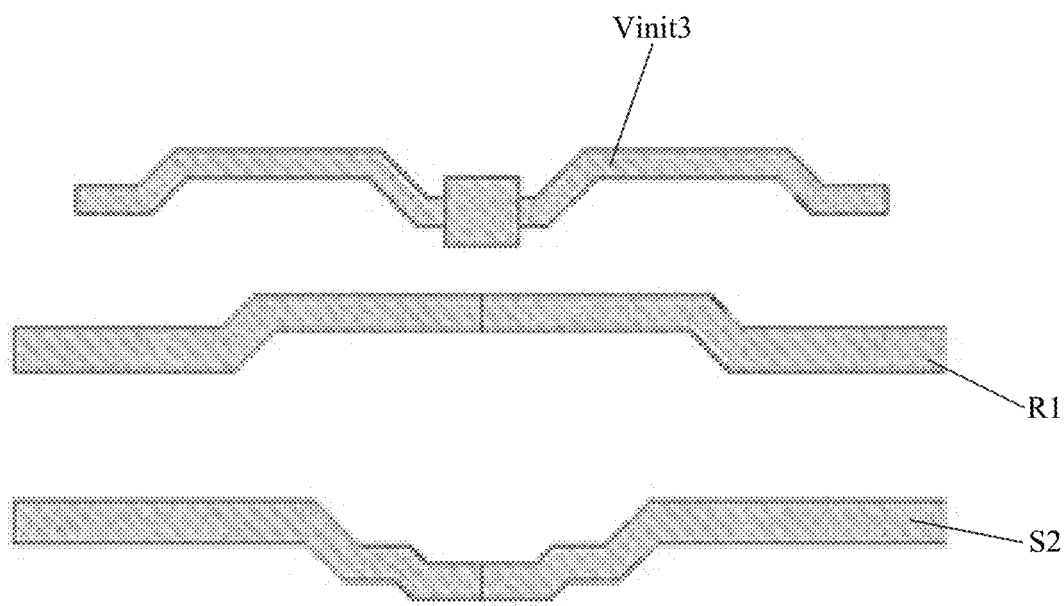
FIG. 20 is a schematic diagram of the layout of the third gate metal layer in FIG. 13.
Figure 21:
FIG. 21 is a schematic diagram of the layout of the oxide active layer in FIG. 13.
Figure 22:
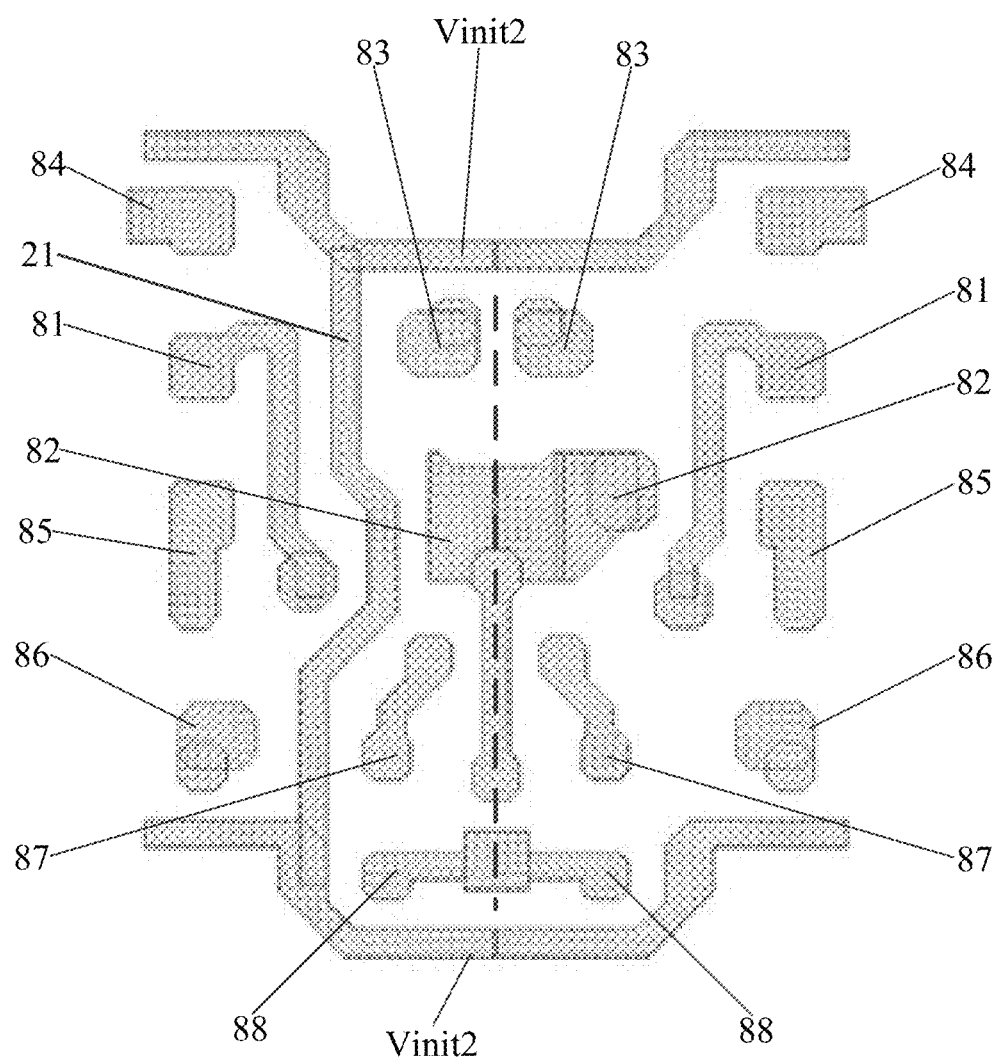
FIG. 22 is a schematic diagram of the layout of the first source-drain metal layer in FIG. 13.
Figure 23:
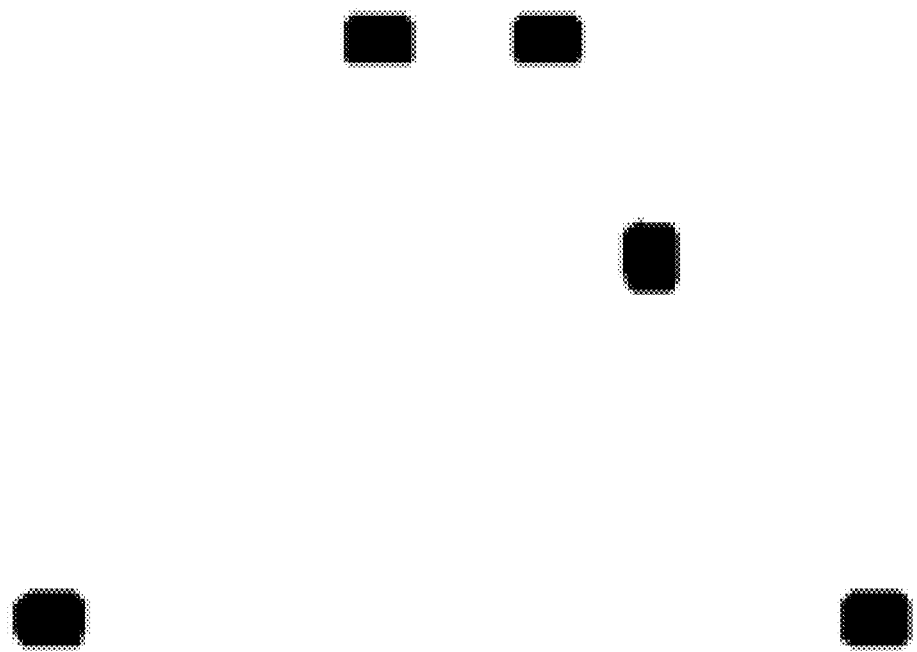
FIG. 23 is a schematic diagram of the layout of the via holes formed by the first planarization layer in FIG. 13.
Figure 24:
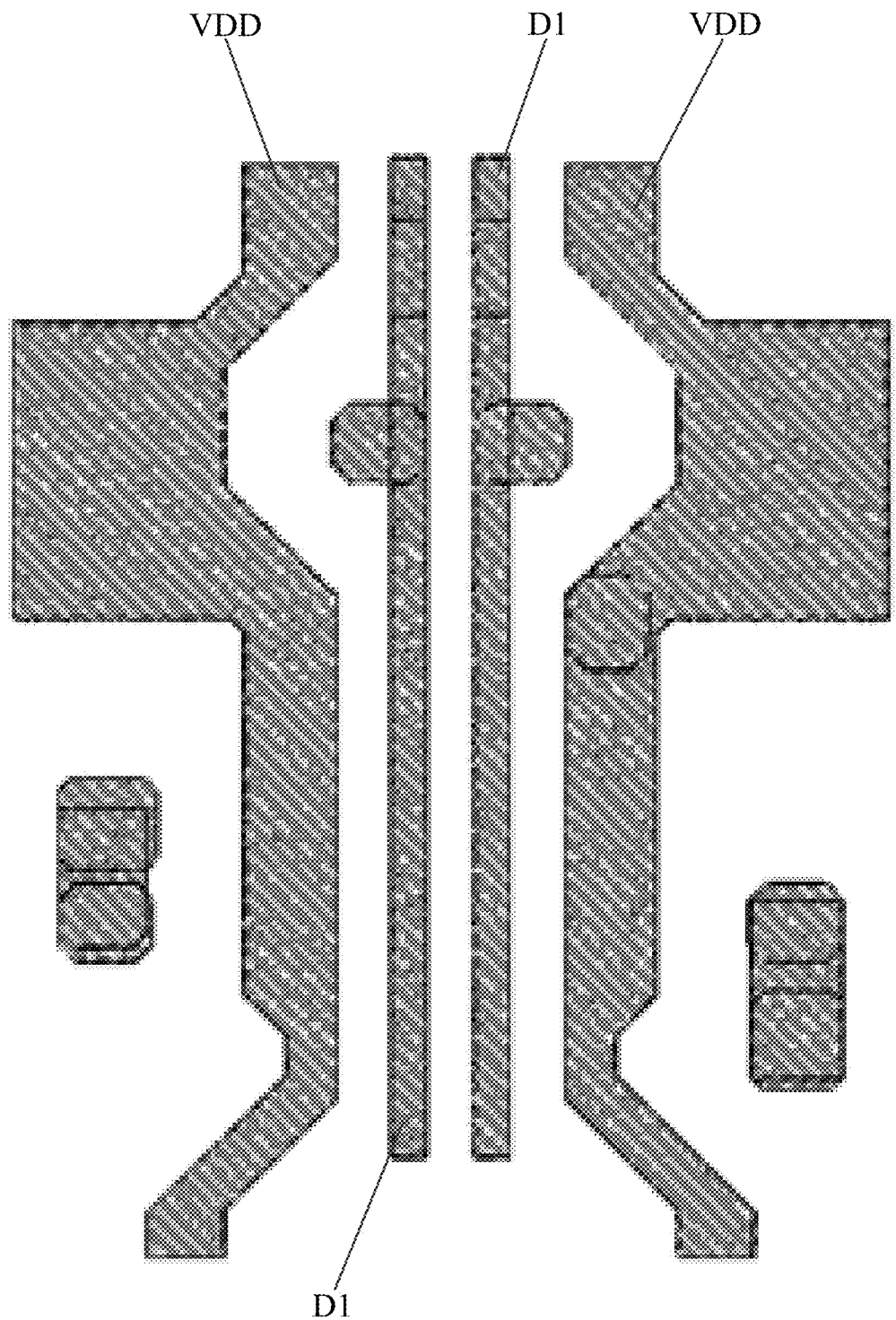
FIG. 24 is a schematic diagram of the layout of the second source-drain metal layer in FIG. 13.
Figure 25:
FIG. 25 is a schematic diagram of the layout of the via holes formed by the second planarization layer in FIG. 13.
Figure 25:

It should be noted that the third active layer 33 and the seventh active layer 37 are shown in FIG. 15. The second active layer 32 is shown in FIG. 21.

As shown in FIG. 12 to FIG. 25, in some embodiments, the display substrate includes a plurality of data lines D1, and at least part of the data line D1 extends along the first direction;

The sub-pixel driving circuit further includes: a first transistor T1 and a fourth transistor T4, the first transistor T1 is respectively coupled to the first electrode and the second electrode of the driving transistor, and the fourth transistor T4 is respectively connected to the first electrode of the driving transistor and the corresponding data line; the first transistor T1 includes a first active layer 31, and the fourth transistor T4 includes a fourth active layer 34;

At least part of the orthographic projection of the second transmission portion 21 on the base substrate is located between the orthographic projection of the first active layer 31 on the base substrate and the orthographic projection of the fourth active layer 34 on the base substrate.

As shown in FIG. 12 to FIG. 25, in some embodiments, the display substrate further includes a power supply line VDD; the sub-pixel further includes a light-emitting element O1; the sub-pixel driving circuit further includes a fifth transistor T5 and a sixth transistor T6, the fifth transistor T5 is respectively coupled to the first electrode of the driving transistor and the corresponding power supply line VDD, the sixth transistor T6 is respectively connected to the second electrode of the driving transistor and the light emitting element O1; the fifth transistor T5 includes a fifth active layer 35, and the sixth transistor T6 includes a sixth active layer 36;

At least part of the orthographic projection of the second transmission portion 21 on the base substrate is located between the orthographic projection of the fifth active layer 35 on the base substrate and the orthographic projection of the sixth active layer 36 on the base substrate.

As shown in FIG. 12 to FIG. 25, in some embodiments, the plurality of sub-pixels are divided into a plurality of sub-pixel groups, and each sub-pixel group includes a first sub-pixel and a second sub-pixel;

Both the first sub-pixel and the second sub-pixel include a second conductive portion 82, and the second conductive portion 82 in the first sub-pixel is coupled to the second conductive portion 82 in the second sub-pixel;

The fifth transistor T5 in the first sub-pixel is coupled to the second conductive portion 82; the fifth transistor T5 in the second sub-pixel is coupled to the second conductive portion 82, the second conductive portion 82 in the second sub-pixel is coupled to the corresponding power supply line VDD;

At least part of the second transmission portion 21 is located in the sub-pixel driving circuit layout area in the first sub-pixel, and the orthographic projection of the second transmission portion 21 on the base substrate does not overlap the orthographic projection of the second conductive portion 82 in the first sub-pixel on the base substrate.

As shown in FIG. 13, FIG. 22, FIG. 31a, FIG. 31b, the first transistor T1 and the second transistor T2 are coupled to the gate electrode of the third transistor T3 through the first conductive portion 81. The fifth transistor T5 is coupled to the power line VDD through the second conductive portion 82. The fourth transistor T4 is coupled to the corresponding data line through the third conductive portion 83. The second transistor T2 is coupled to the first initialization signal transmission layer Vinit1 through the fourth conductive portion 84. The first transistor T1 is coupled to the third transistor T3 through the fifth conductive portion 85. The sixth transistor T6 and the seventh transistor T7 are coupled to the anode through the sixth conductive portion 86. The eighth transistor T8 is coupled to the third transistor T3 through the seventh conductive portion 87. The eighth transistor T8 is coupled to the third initialization signal transmission layer Vinit3 through the eighth conductive portion 88.

Exemplarily, at least part of the second transmission portion 21 is located in the sub-pixel driving circuit layout area in the first sub-pixel, and the second transmission portion 21 is not located in the sub-pixel driving circuit layout area in the second sub-pixel.

Exemplarily, the second conductive portion 82 in the first sub-pixel and the second conductive portion 82 in the second sub-pixel form an integral structure.

Exemplarily, an area of the second conductive portion 82 in the first sub-pixel is smaller than an area of the second conductive portion 82 in the second sub-pixel.

Exemplarily, the orthographic projection of the second transmission portion 21 on the base substrate does not overlap the orthographic projection of the second conductive portion 82 in the first sub-pixel on the base substrate. Exemplarily, the orthographic projection of the second transmission portion 21 on the base substrate and the orthographic projection of the second conductive portion 82 in the first sub-pixel on the base substrate are arranged in a second direction.

The above arrangement is beneficial to compensate the symmetry of the second conductive portions 82 in the first sub-pixel and the second sub-pixel.

As shown in FIG. 12 to FIG. 25, in some embodiments, the sub-pixel driving circuit further includes an eighth transistor T8, and the eighth transistor T8 is coupled to the first electrode or the second electrode of the driving transistor, the eighth transistor T8 is used for resetting the first electrode or the second electrode;

The eighth transistor T8 includes an eighth active layer 38, at least a portion of the orthographic projection of the second transmission portion 21 on the base substrate, and the orthographic projection of the eighth active layer 38 on the base substrate arranged along the second direction.

Exemplarily, in the same sub-pixel, the orthographic projection of the second transmission portion 21 on the base substrate is located between the projection of the seventh active layer 37 on the base substrate and the orthographic projection of the eighth active layer 38 on the base substrate.

In some embodiments, the orthographic projection of the second transmission portion 21 on the base substrate partially overlaps the orthographic projection of the reset line R1 on the base substrate.

In some embodiments, the orthographic projection of the second transmission portion 21 on the base substrate partially overlaps the orthographic projection of the first scan line S1 on the base substrate.

In some embodiments, the orthographic projection of the second transmission portion 21 on the base substrate partially overlaps the orthographic projection of the second scan line S2 on the base substrate.

In some embodiments, the orthographic projection of the second transmission portion 21 on the base substrate partially overlaps the orthographic projection of the third scan line S3 on the base substrate.

In the display substrate provided by the above-mentioned embodiment, the layout of the second transmission portion 21 at the above-mentioned position is beneficial to reduce the difficulty of the layout of the second transmission portion 21, and at the same time, it is beneficial to the overall working stability of the sub-pixel driving circuit.

As shown in FIG. 1, in some embodiments, the display substrate includes a plurality of sub-pixels, and the sub-pixel includes a light-emitting element O1 and a sub-pixel driving circuit; the sub-pixel driving circuit includes a driving transistor, and further includes:
 a second transistor T2, the second transistor T2 is respectively coupled to the gate electrode of the driving transistor and the initialization signal transmission layer;
 A seventh transistor T7, the seventh transistor T7 is respectively coupled to the light-emitting element O1 and the initialization signal transmission layer.

Exemplarily, the second transistor T2 is respectively coupled to the gate electrode of the driving transistor and the first initialization signal transmission layer Vinit1; the seventh transistor T7 is respectively coupled to the light emitting element O1 and the first initialization signal transmission layer Vinit1.

As shown in FIG. 4, in some embodiments, the display substrate includes a plurality of sub-pixels, and the sub-pixels include a light-emitting element O1 and a sub-pixel driving circuit; the sub-pixel driving circuit includes a driving transistor, and further includes:
 a second transistor T2, the second transistor T2 is respectively coupled to the gate electrode of the driving transistor and the first initialization signal transmission layer Vinit1;
 A seventh transistor T7, the seventh transistor T7 is respectively coupled to the light emitting element O1 and the second initialization signal transmission layer Vinit2.

As shown in FIG. 7, in some embodiments, the display substrate includes a plurality of sub-pixels, and the sub-pixels include a light-emitting element O1 and a sub-pixel driving circuit; the sub-pixel driving circuit includes a driving transistor, and further includes:
 a second transistor T2, the second transistor T2 is respectively coupled to the gate electrode of the driving transistor and the first initialization signal transmission layer Vinit1;
 a seventh transistor T7, the seventh transistor T7 is respectively coupled to the light-emitting element O1 and the second initialization signal transmission layer Vinit2;
 an eighth transistor T8, the eighth transistor T8 is respectively coupled to the first electrode of the driving transistor and the third initialization signal transmission layer Vinit3.

As shown in FIG. 2, in some embodiments, the display substrate further includes a display area AA and a peripheral area 40 surrounding the display area AA, and the display substrate further includes:
 a first signal line 11, the first signal line 11 is located in the peripheral area 40 of the display substrate, the first signal line 11 includes at least a portion extending along the first direction, the first signal line 11 is coupled to the first initialization signal transmission layer Vinit1;

The first signal line 11 is made of a second source-drain metal layer, and the first transmission portion 20 included in the first initialization signal transmission layer Vinit1 is made of a first gate metal layer.

Exemplarily, the first signal line 11 is located on the left and right sides of the display area AA, the left side and the right side are arranged along the second direction, and the display area AA is located between the first signal lines 11.

Exemplarily, the first signal line 11 is coupled to the first transmission portion 20 of the first initialization signal transmission layer Vinit1.

Exemplarily, the display substrate includes: a light shielding layer LS, an isolation layer, a first buffer layer, a poly active layer, a first gate insulating layer, a first gate metal layer, a second gate insulating layer, a second gate metal layer, a first interlayer insulating layer, a second buffer layer, an oxide active layer (such as IGZO), a third gate insulating layer, a third gate metal layer, a second interlayer insulating layer, a first source-drain metal layer, a passivation layer, a first planarization layer, a second source-drain metal layer, a second planarization layer, an anode layer, a pixel defining layer, a spacer layer, a light-emitting functional layer, a cathode layer and an encapsulation layer that are stacked on the base substrate along a direction away from the base substrate.

Exemplarily, the orthographic projection of the light shielding layer on the base substrate at least partially overlaps the orthographic projection of the channel portion of the third transistor T3 on the base substrate, which can shield light from the channel portion, and at the same time can shield the influence of charges on the channel portion. Exemplarily, the light shielding layer has a stable potential, such as a power supply potential. Exemplarily, the light shielding layer is formed as a whole-layer structure.

Exemplarily, the first signal line 11 and the first initialization signal transmission layer Vinit1 are coupled through a conductive connection portion, and the conductive connection portion is respectively coupled to the first signal line 11 and the first transmission portion 20 of the first initialization signal transmission layer Vinit1 through a via hole.

Exemplarily, the conductive connection portion is made of the first source-drain metal layer.

As shown in FIG. 5 and FIG. 6, in some embodiments, the display substrate further includes:

a second signal line 12, the second signal line 12 is located in the peripheral area 40 of the display substrate, the second signal line 12 includes at least a portion extending along the first direction, the orthographic projection of the first signal line 11 on the base substrate is located between the display area AA and the orthographic projection of the second signal line 12 on the base substrate, and the second signal line 12 is coupled to the second initialization signal transmission layer Vinit2;

The second signal line 12 and the first transmission portion 20 included in the second initialization signal transmission layer Vinit2 are both made of a first source-drain metal layer.

Exemplarily, the second signal lines 12 are located on the left and right sides of the display area AA, the left side and the right side are arranged along the second direction, and the display area AA is located between the second signal lines 12.

Exemplarily, the second signal line 12 is coupled to the first transmission portion 20 of the second initialization signal transmission layer Vinit2.

Exemplarily, the second signal line 12 and the first transmission portion 20 of the second initialization signal transmission layer Vinit2 form an integral structure.

As shown in FIG. 8, in some embodiments, the display substrate further includes:

a third signal line 13, the orthographic projection of the third signal line 13 on the base substrate is located between the orthographic projection of the first signal line 11 on the base substrate and the orthographic projection of the second signal line 12 on the base substrate, the third signal line 13 is coupled to the third initialization signal transmission layer Vinit3;

The third signal line 13 is made of a first source-drain metal layer, and the third initialization signal transmission layer Vinit3 is made of a third gate metal layer.

Exemplarily, the third signal lines 13 are located on the left and right sides of the display area AA, the left side and the right side are arranged along the second direction, and the display area AA is located between the third signal lines 13.

Exemplarily, the third signal line 13 is coupled to the first transmission portion 20 of the third initialization signal transmission layer Vinit3.

Exemplarily, the third signal line 13 is coupled to the first transmission portion 20 of the third initialization signal transmission layer Vinit3 through a via hole.

Exemplarily, the first signal line, the second signal line and the third signal line may be arranged only in a frame area at one side of the display substrate, for example, a left frame, a right frame, an upper frame or a lower frame.

Embodiments of the present disclosure further provide a display device including the display substrate provided by the above embodiments.

Exemplarily, the display device includes an active matrix organic light emitting diode display device.

It should be noted that the display device can be any product or component with a display function, such as a TV, a monitor, a digital photo frame, a mobile phone, a tablet computer, etc., wherein the display device also includes a flexible circuit board, a printed circuit board and a back panel.

In the display substrate provided by the above embodiment, the initialization signal transmission layer is set to include a plurality of first transmission portions 20 and a plurality of second transmission portions 21; the first transmission portion 20 includes at least a portion extending along the second direction, the second transmission portion 21 includes at least a portion extending along the first direction, and adjacent first transmission portions 20 are coupled through at least one of the second transmission portions 21. The above-mentioned setting method makes the initialization signal transmission layer formed into a grid shape. Compared with the conventional initialization signal transmission layer only including the lateral portion, the grid-shaped initialization signal transmission layer can reduce the initialization signal loading by about 20%, which makes the charging of the initialization signal faster, and the reset effect for the corresponding node better. This beneficial effect is more pronounced for large-screen high-frequency panels.

In the display substrate provided in the above-mentioned embodiment, the plurality of first transmission portions 20 include a target transmission portion 201, and the second transmission portion 21 located between the target transmission portion 201 and the adjacent previous first adjacent first transmission portion 20 and the second transmission portion 21 located between the target transmission portion 201 and the adjacent next first transmission portion 20 are staggered in the second direction. This arrangement is beneficial to increase the spacing between the adjacent second transmission portions 21 along the first direction, reduce the layout density of the second transmission portions 21, and overcome the problem of insufficient layout space.

Therefore, when the display device provided by the embodiment of the present disclosure includes the above-mentioned display substrate, it also has the above-mentioned beneficial effects, which will not be repeated here.

In the related art, some signal line film layers have a large voltage drop when transmitting signals, so that the display product cannot meet the performance requirements of the screen in a high-brightness display mode, resulting in poor display uniformity.

Referring to FIGS. 32 to 37, an embodiment of the present disclosure provides a display substrate, including: a base substrate and a signal line film layer arranged on the base substrate; the signal line film layer includes:

a first conductive layer (including a first conductive pattern 70 and a second conductive pattern 71) and a second conductive layer (including a third conductive pattern 72) that are stacked; and, a conductive connection layer (including a conductive connection pattern 74), the conductive connection layer is arranged at a different layer from each of the first conductive layer and the second conductive layer, and the orthographic projection of the conductive connection layer on the base substrate at least partially overlaps the orthographic projection of the first conductive layer on the base substrate, and the orthographic projection of the conductive connection layer on the base substrate at least partially overlaps the orthographic projection of the second conductive layer on the base substrate, the conductive connection layer is respectively coupled to the first conductive layer and the second conductive connection layer.

Exemplarily, the signal line film layer is used to transmit a DC signal with a fixed potential.

Exemplarily, the signal line film layer includes a positive power supply signal line film layer (i.e., a power supply line VDD), and the positive power supply signal line film layer is used to transmit a positive power supply signal.

Exemplarily, at least part of the conductive connection layer is located between the first conductive layer and the second conductive layer.

Exemplarily, the first conductive layer, the second conductive layer and the conductive connection layer are all made of metal materials.

Exemplarily, both the first conductive layer and the second conductive layer are formed in a grid structure.

Exemplarily, there is an overlapping area between the orthographic projection of the conductive connection layer on the base substrate and the orthographic projection of the first conductive layer on the base substrate, and the conductive connection layer and the first conductive layer are coupled through at least one via hole in the overlapping area.

Exemplarily, there is an overlapping area between the orthographic projection of the conductive connection layer on the base substrate and the orthographic projection of the second conductive layer on the base substrate, and the conductive connection layer and the second conductive layer are coupled through at least one via hole in the overlapping area.

According to the specific structure of the display substrate provided by the embodiment of the present disclosure, in the display substrate provided by the embodiment of the present disclosure, the signal line film layer includes a first conductive layer, a conductive connection layer and a second conductive layer that are stacked. In this arrangement, the signal line film layer is formed into a multi-layer network stacked structure, which effectively reduces the voltage drop generated when the signal line film layer transmits signals. When the display substrate is applied to a display product, the display uniformity of the display product in a high-brightness display mode is ensured. Moreover, the signal line film layer is formed into a multi-layer network stacked structure, which facilitates the heat dissipation of the display product in the high-brightness display mode.

Referring to FIGS. 32 to 38, in some embodiments, the conductive connection layer includes a plurality of conductive connection patterns 74;

The first conductive layer includes a plurality of first conductive patterns 70 arranged in a first direction; the first conductive patterns 70 include at least a portion extending in a second direction, the second direction intersecting the first direction, the first conductive pattern 70 includes a plurality of first hollow regions 703; the first conductive pattern 70 is coupled to the corresponding conductive connection pattern 74.

Exemplarily, the conductive connection layer includes a plurality of conductive connection patterns 74, and the plurality of conductive connection patterns 74 are independent of each other.

Exemplarily, the plurality of conductive connection patterns 74 are arranged in an array.

Exemplarily, the structures of the plurality of conductive connection patterns 74 are completely the same.

Exemplarily, among the plurality of conductive connection patterns 74, at least part of the conductive connection patterns 74 have different shapes.

Exemplarily, the display substrate includes a display area and a peripheral area surrounding the display area. The display area is divided into a plurality of display sub-areas, the plurality of display sub-areas are in one-to-one correspondence with the plurality of conductive connection patterns 74, and the conductive connection patterns 74 are located in the corresponding display sub-areas.

Exemplarily, the first direction includes a longitudinal direction, and the second direction includes a lateral direction.

Figure 39:
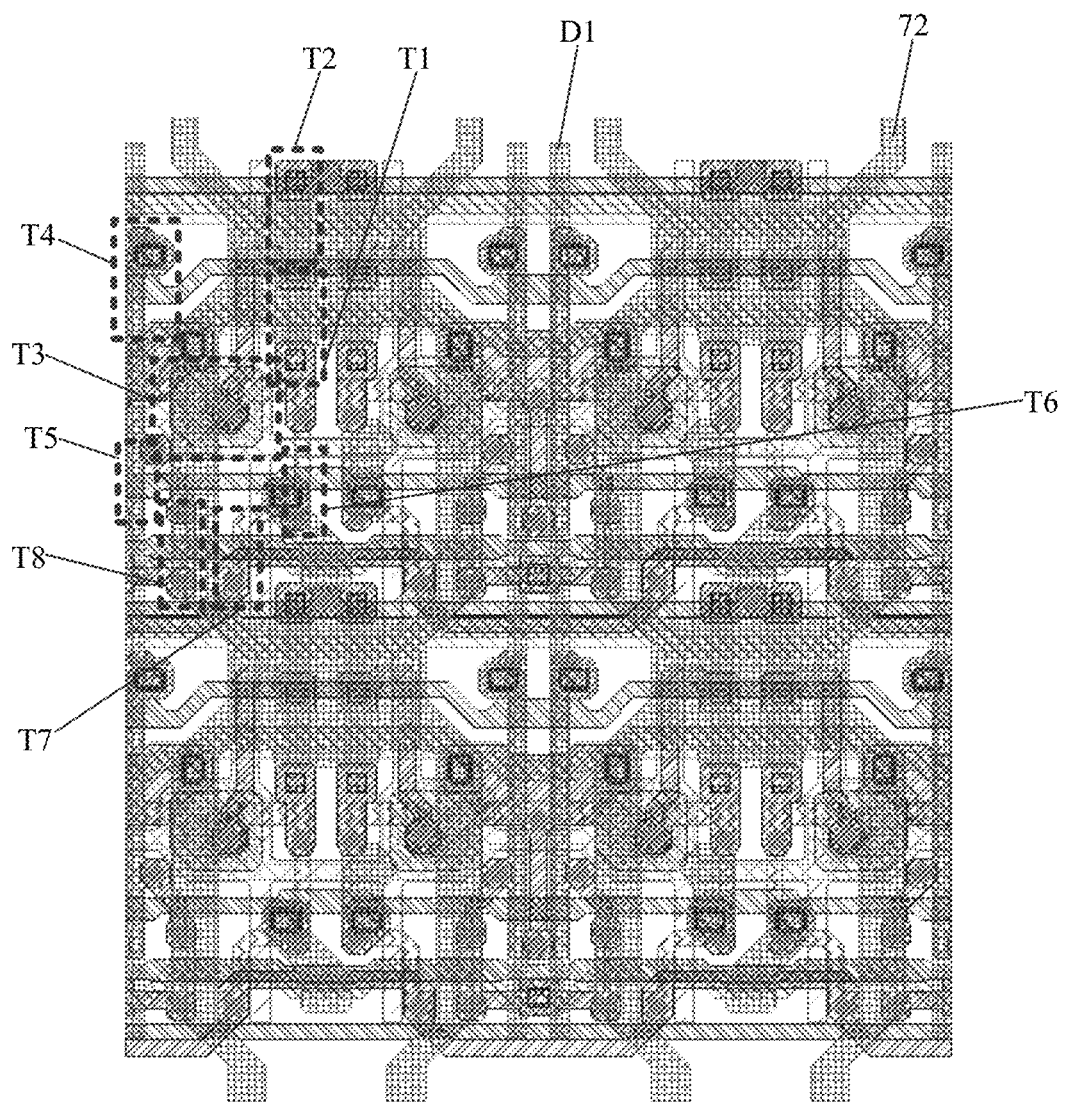
FIG. 39 is a schematic diagram of the layout of the display substrate provided by an embodiment of the present disclosure.
Figure 40:
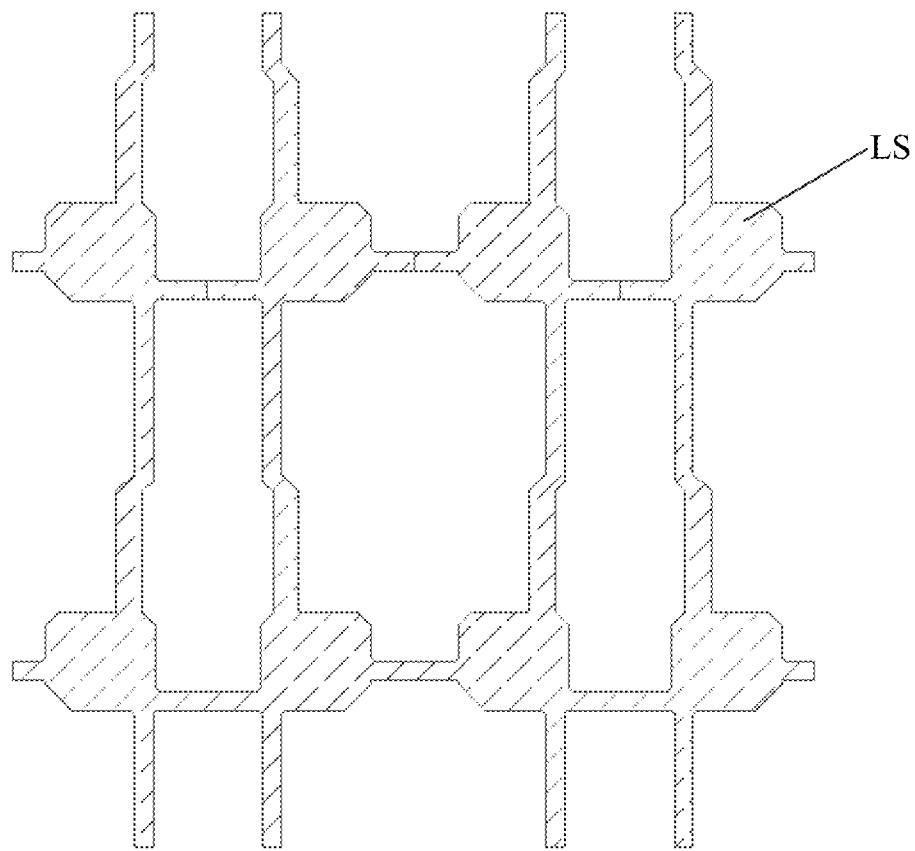
FIG. 40 is a schematic diagram of the layout of the light-shielding layer in FIG. 39.
Figure 41:
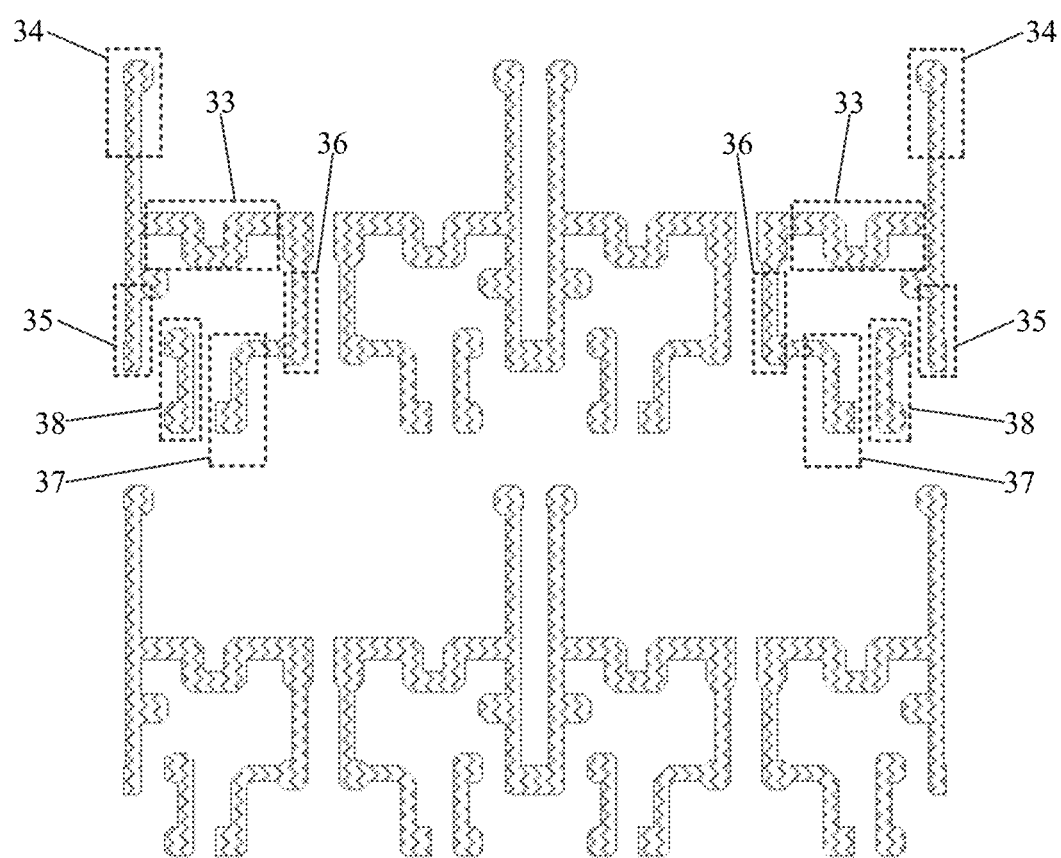
FIG. 41 is a schematic diagram of the layout of the poly active layer in FIG. 39.
Figure 42:
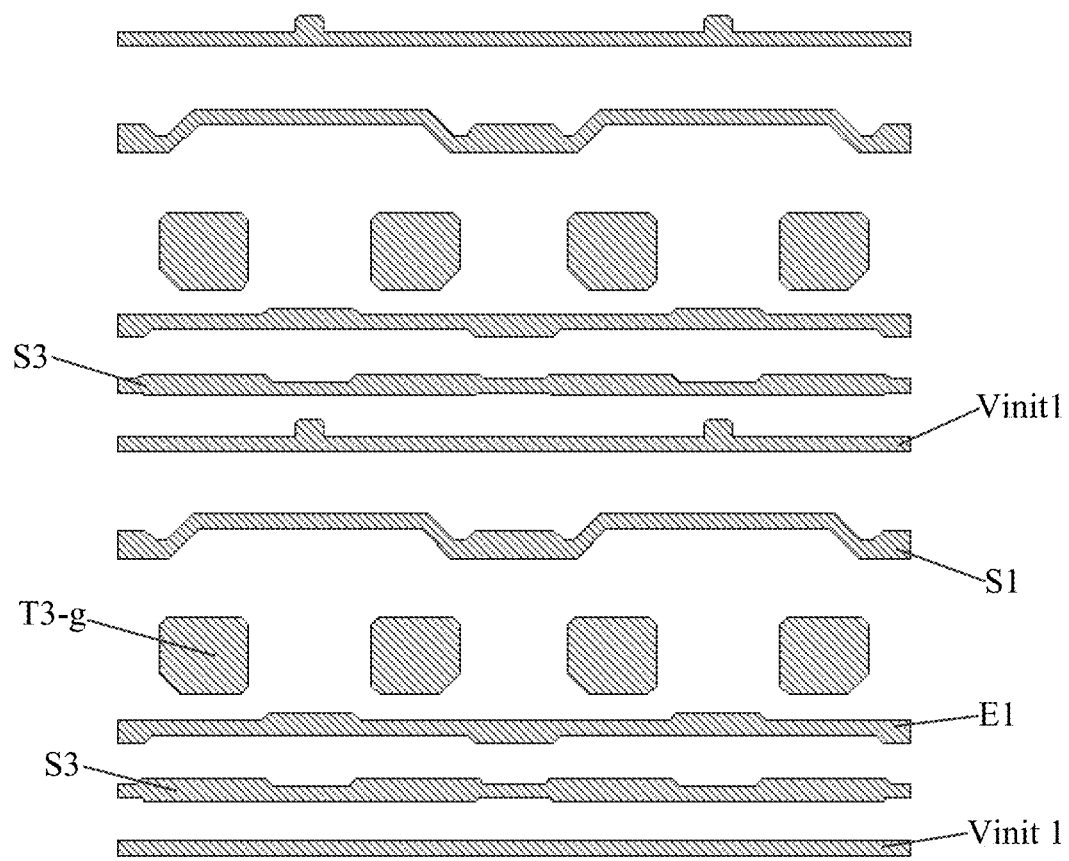
FIG. 42 is a schematic diagram of the layout of the first gate metal layer in FIG. 39.
Figure 43:
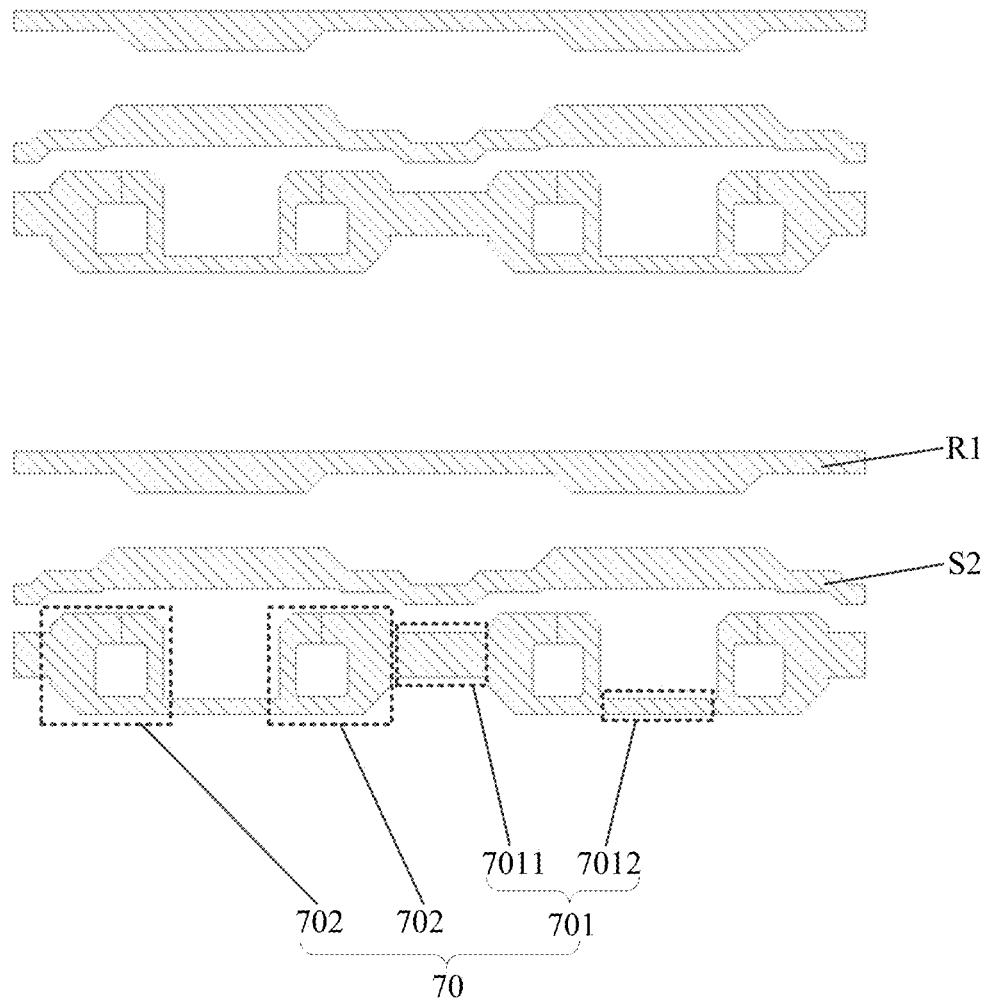
FIG. 43 is a schematic diagram of the layout of the second gate metal layer in FIG. 39.
Figure 44:
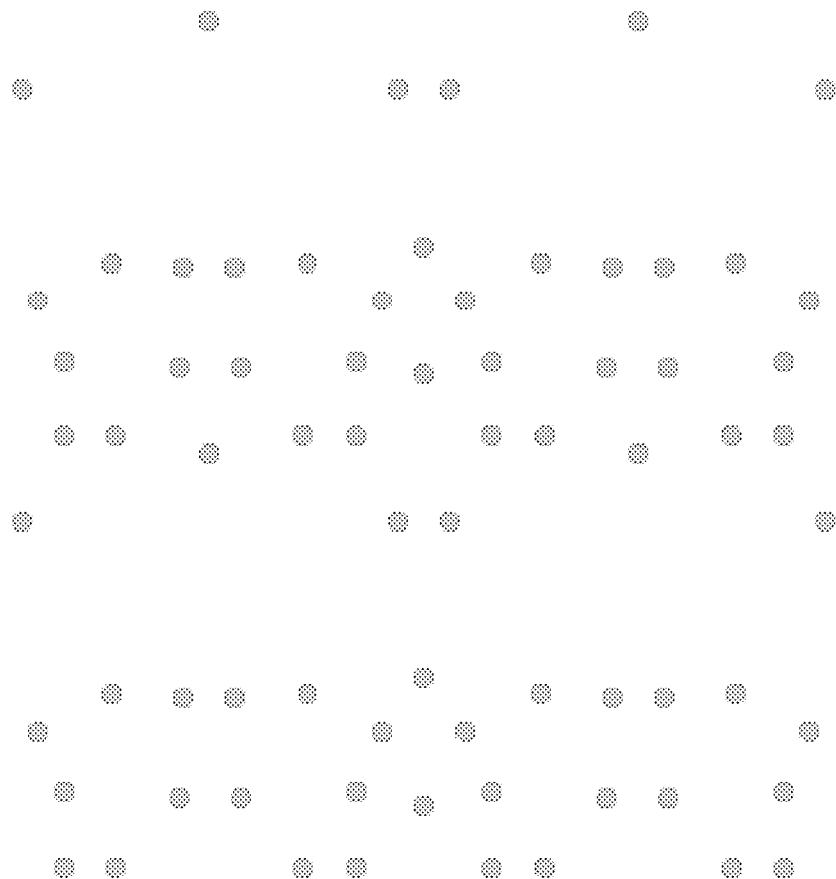
FIG. 44 is a schematic diagram of the layout of the first connection hole in FIG. 39.
Figure 45:
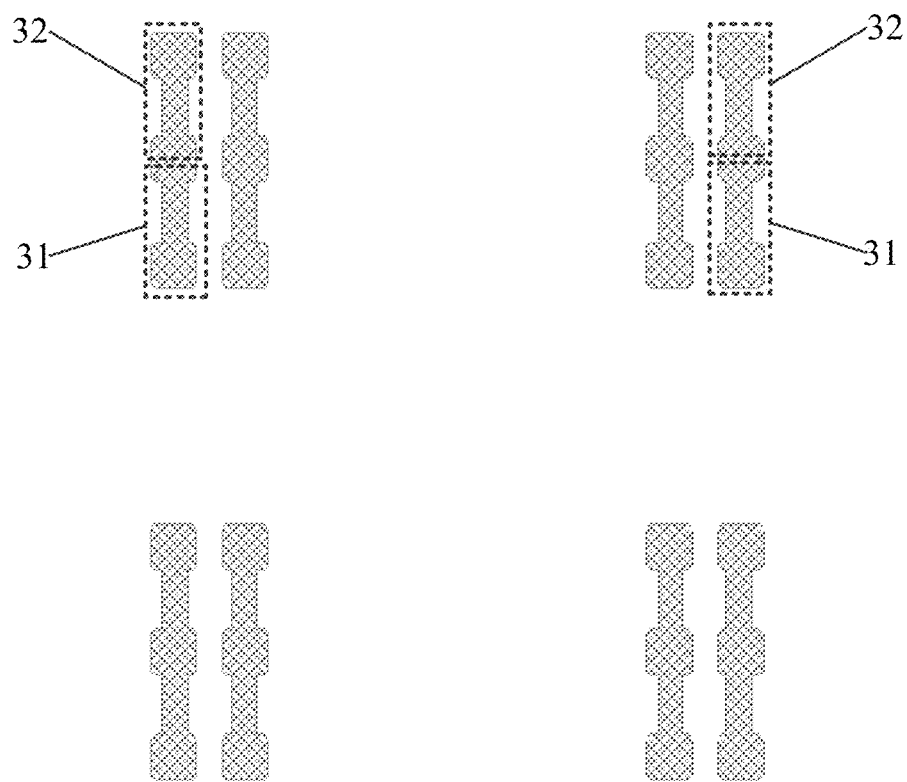
FIG. 45 is a schematic diagram of the layout of the oxide active layer in FIG. 39.
Figure 46:
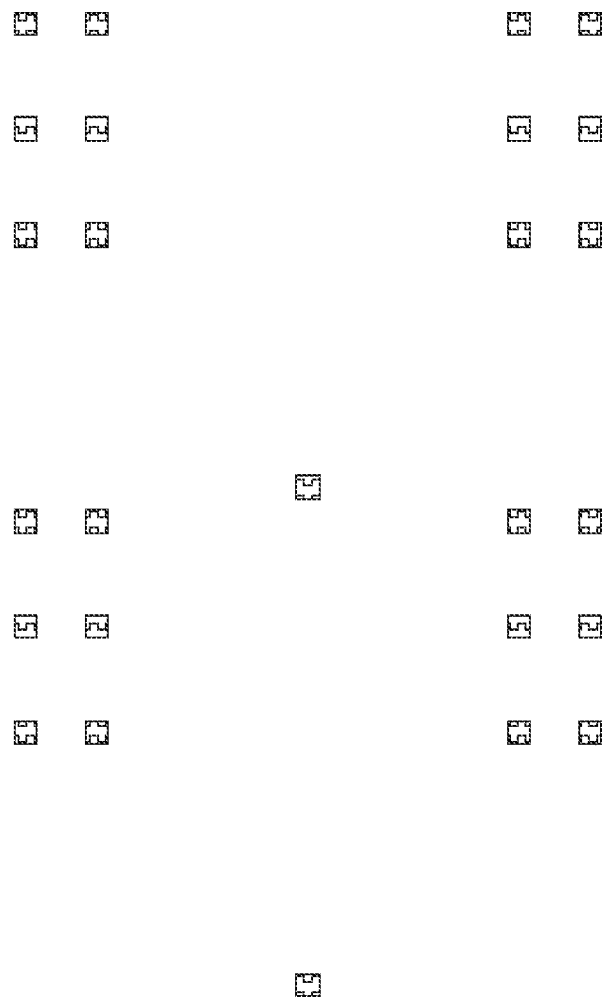
FIG. 46 is a schematic diagram of the layout of the second connection hole in FIG. 39.
Figure 47:
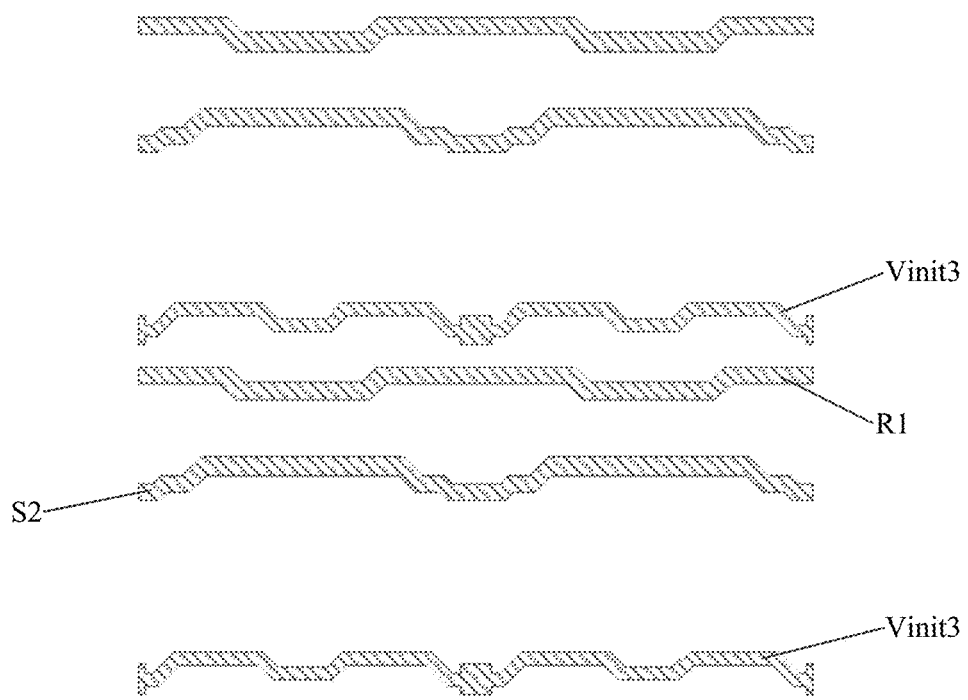
FIG. 47 is a schematic diagram of the layout of the third gate metal layer in FIG. 39.
Figure 48:
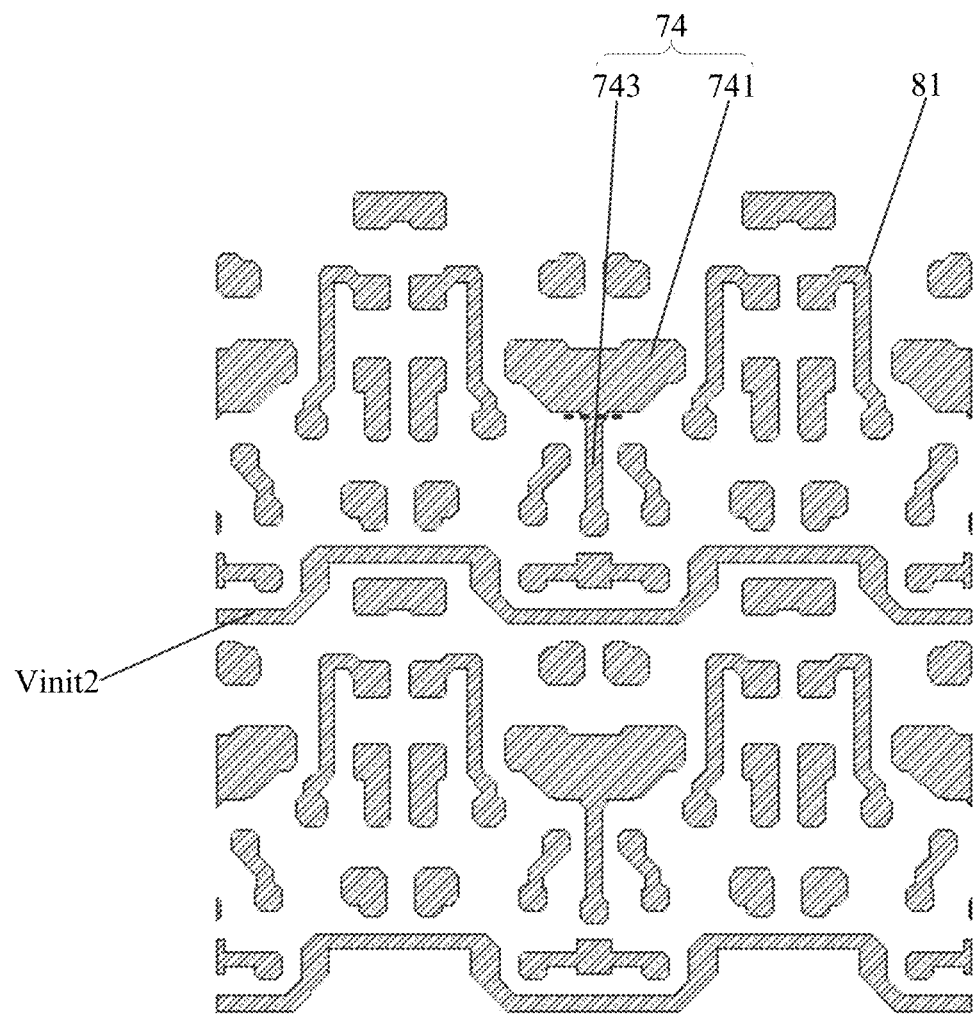
FIG. 48 is a schematic diagram of the layout of the first source-drain metal layer in FIG. 39.
Figure 49:
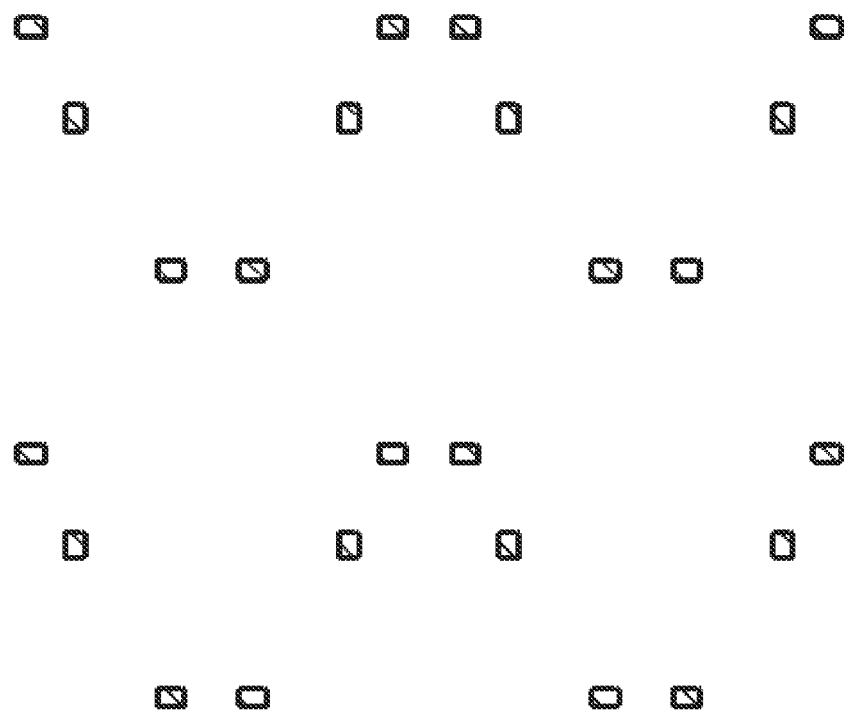
FIG. 49 is a schematic diagram of the layout of the via holes formed by the first planarization layer in FIG. 39.
Figure 50:
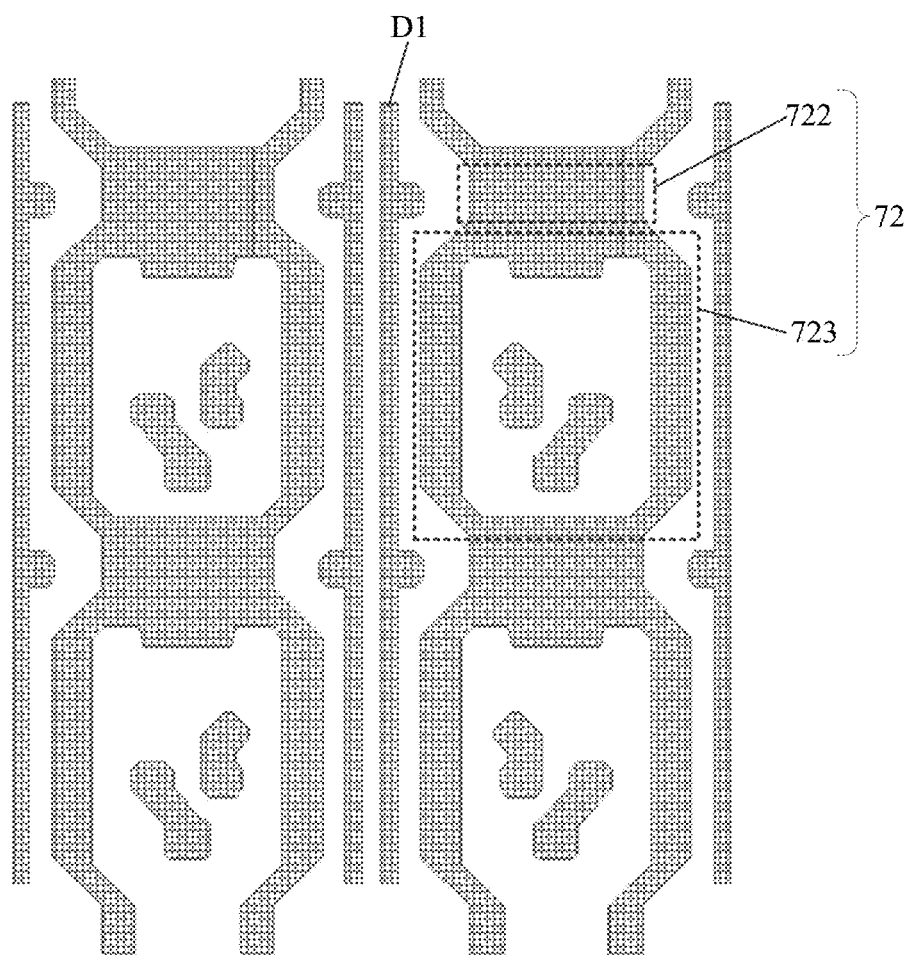
FIG. 50 is a schematic diagram of the layout of the second source-drain metal layer in FIG. 39.
Figure 52:
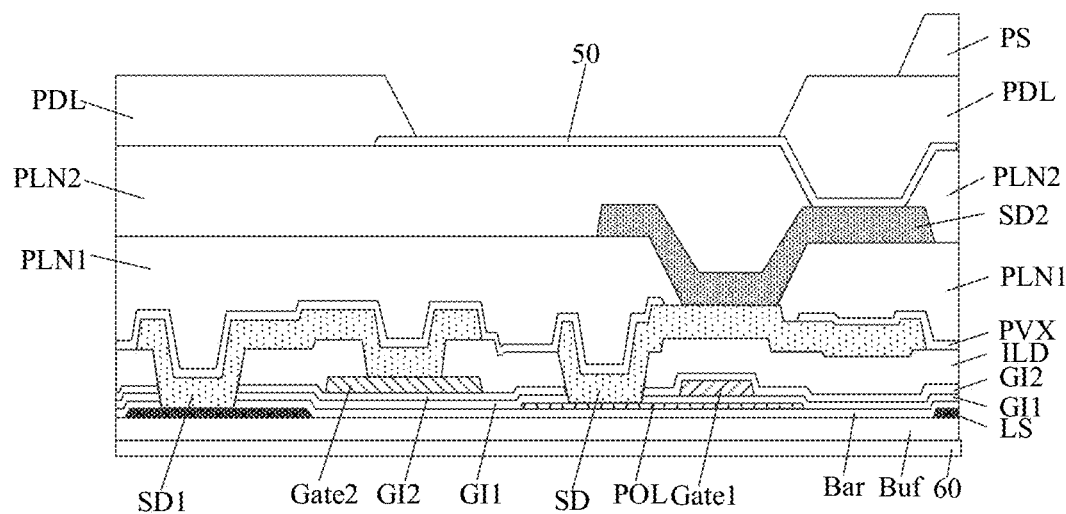
FIG. 52 is a schematic cross-sectional view of the display substrate provided by an embodiment of the present disclosure.

As shown in FIG. 39 and FIG. 52, exemplarily, the display substrate includes a plurality of gate lines and a plurality of data lines D1, the gate line includes at least a portion extending along the second direction, the data line D1 includes at least a portion extending along the first direction.

Exemplarily, the display substrate includes a plurality of sub-pixels, and the sub-pixels include sub-pixel driving circuits. The plurality of sub-pixel driving circuits included in the plurality of sub-pixels are divided into a plurality of rows of sub-pixel driving circuit arranged along the first direction. The first conductive layer includes a plurality of first conductive patterns 70 arranged along the first direction. The plurality of first conductive patterns 70 are in one-to-one correspondence with the plurality of rows of sub-pixel driving circuits.

Exemplarily, the first conductive pattern 70 is arranged in the layout area where the corresponding row of sub-pixel driving circuits is located.

Exemplarily, each of the first conductive patterns 70 corresponds to at least one conductive connection pattern 74, and the first conductive pattern 70 is coupled to the corresponding conductive connection pattern 74.

Exemplarily, each of the first conductive patterns 70 corresponds to a plurality of conductive connection patterns 74, and the first conductive patterns 70 are respectively coupled to the corresponding plurality of conductive connection patterns 74. Exemplarily, the plurality of conductive connection patterns 74 are arranged at intervals along the second direction.

Exemplarily, the first conductive pattern 70 includes a plurality of first hollow regions 703. The sub-pixel driving circuit includes a first node. The first node is located in the first hollow region 703.

Exemplarily, the orthographic projection of the boundary of the first hollow region 703 on the base substrate 60 surrounds the orthographic projection of the first node on the base substrate 60. The first node can be coupled to other conductive structures through the hollow region.

In the display substrate provided by the above embodiment, the first conductive layer includes a plurality of first conductive patterns 70 arranged along the first direction, and the first conductive patterns 70 are coupled to the corresponding conductive connection patterns 74, the first conductive pattern 70 includes a plurality of first hollow regions 703; the first conductive layer is formed into a grid structure, thereby effectively reducing the voltage drop generated by the signal line film layer when transmitting signals. When the display substrate is applied to a display product, the display uniformity of the display product in a high-brightness display mode is ensured. Moreover, forming the first conductive layer into a grid structure facilitates heat dissipation of the display product in a high-brightness display mode.

Referring to FIGS. 32 to 38 and FIG. 52, in some embodiments, the first conductive pattern 70 includes a plurality of first portions 701 and a plurality of second portions 702, the first portions 701 and the second portions 702 are alternately arranged along the second direction;

The width of the first portion 701 in the direction perpendicular to the second direction is smaller than a distance between two boundaries of the second portion 702 that are farthest apart in the direction perpendicular to the second direction; the second portion 702 includes the first hollow region 703.

Exemplarily, the first portion 701 and the second portion 702 are formed as an integral structure.

Exemplarily, the first portion 701 includes a strip-shaped pattern extending along the second direction.

Exemplarily, the second portion 702 includes a block pattern.

Exemplarily, the orthographic projection of the first portion 701 on the base substrate 60 does not overlap the orthographic projection of the second conductive layer on the base substrate 60.

Exemplarily, the orthographic projection of the first portion 701 on the base substrate 60 at least partially overlaps the orthographic projection of the second conductive layer on the base substrate 60.

Exemplarily, the orthographic projection of the second portion 702 on the base substrate 60 at least partially overlaps the orthographic projection of the second conductive layer on the base substrate 60.

Exemplarily, there is an overlapping area between the orthographic projection of the first portion 701 on the base substrate 60 and the orthographic projection of the corresponding conductive connection pattern 74 on the base substrate 60, and the first portion 701 are coupled to the corresponding conductive connection patterns 74 in the overlapping area.

Exemplarily, there is an overlapping area between the orthographic projection of the second portion 702 on the base substrate 60 and the orthographic projection of the corresponding conductive connection pattern 74 on the base substrate 60, and the second portion 702 is coupled to the corresponding conductive connection pattern 74 in the overlapping area.

Exemplarily, the width of the first portion 701 in the direction perpendicular to the second direction is smaller than the minimum distance between the two boundaries of the second portion 702 that are farthest apart in the direction perpendicular to the second direction.

Exemplarily, the width of the first portion 701 in the direction perpendicular to the second direction is smaller than the maximum distance between the two boundaries of the second portion 702 that are farthest apart in the direction perpendicular to the second direction.

In the display substrate provided by the above embodiment, the first conductive pattern 70 includes a plurality of first portions 701 and a plurality of second portions 702, and the first portions 701 and the second portions 702 are alternately arranged along the second direction; and the width of the first portion 701 in the direction perpendicular to the second direction is smaller than the distance between the two boundaries of the second portion 702 that are farthest apart in the direction perpendicular to the second direction; so that the first conductive layer effectively utilizes the limited layout space under the condition of avoiding short circuit with the surrounding conductive structure, realizes the grid structure of the first conductive layer, and reduces the voltage drop of the first conductive transmission layer when transmitting signals.

In the display substrate provided by the above embodiment, the width of the first portion 701 in the direction perpendicular to the second direction is set to be smaller than the distance between the two boundaries of the second portion 702 that are farthest apart in the direction perpendicular to the second direction. The second portion 702 includes the first hollow region 703; a large area hollow region may be formed and the difficulty of forming the hollow region can be effectively reduced.

Referring to FIGS. 32 to 38, in some embodiments, the plurality of first portions 701 includes a plurality of first target portions 7011 and a plurality of second target portions 7012, the first target portions 7011 and the second target portions 7012 are alternately arranged, and the width of the first target portion 7011 in the direction perpendicular to the second direction is greater than the width of the second target portion 7012 in the direction perpendicular to the second direction; the first target portion 7011 is coupled to the corresponding conductive connection pattern 74.

Exemplarily, the second conductive layer includes a plurality of third conductive patterns 72 arranged along the second direction, the third conductive pattern 72 includes at least a portion extending along the first direction, and the third conductive pattern 72 includes a plurality of second hollow regions 721. The orthographic projection of the boundary of the second hollow region 721 on the base substrate 60 surrounds the orthographic projection of the second target portion 7012 on the base substrate 60.

Exemplarily, the orthographic projection of the second hollow region 721 on the base substrate 60 does not overlap the orthographic projection of the first target portion 7011 on the base substrate 60.

Exemplarily, the orthographic projection of the second hollow region 721 on the base substrate 60 at least partially overlaps the orthographic projection of the second target portion 7012 on the base substrate 60.

Exemplarily, the first hollow region 703 at least partially overlaps the second hollow region 721.

Exemplarily, the first target portion 7011 or the second target portion 7012 is arranged between the adjacent second portions 702.

Exemplarily, the second portion 702 is arranged between the adjacent first target portion 7011 and the second target portion 7012.

Exemplarily, in the same first conductive pattern 70, the first target portion 7011, the second portion 702, the second target portion 7012 and the second portion 702 are arranged in sequence to form a repeating unit, and the first conductive pattern 70 including a plurality of the repeating units.

Exemplarily, there is an overlapping area between the orthographic projection of the first target portion 7011 on the base substrate 60 and the orthographic projection of the corresponding conductive connection pattern 74 on the base substrate 60, and the first target portion 7011 and the corresponding conductive connection pattern 74 are coupled through via holes in the overlapping area.

In the display substrate provided by the above-mentioned embodiment, the plurality of first portions 701 include a plurality of first target portions 7011 and a plurality of second target portions 7012, and the first target portions 7011 and the second target portions 7012 are alternately arranged, the width of the first target portion 7011 in the direction perpendicular to the second direction is greater than the width of the second target portion 7012 in the direction perpendicular to the second direction; so that the first conductive layer effectively utilizes the limited layout space under the condition of avoiding short circuit with the surrounding conductive structure, realizes the grid structure of the first conductive layer, and reduces the voltage drop of the first conductive transmission layer when transmitting signals.

In the display substrate provided by the above embodiment, by setting the first target portion 7011 to be coupled to the corresponding conductive connection pattern 74, stability and reliability of electrical connection between the first conductive layer and the conductive connection pattern 74 can be ensured.

Referring to FIGS. 32 to 38, in some embodiments, the first target portion 7011 and the second target portion 7012 are staggered along the first direction.

The above arrangement enables the first conductive layer to effectively utilize the limited layout space under the condition of avoiding short circuit with the surrounding conductive structure, to realize the grid structure of the first conductive layer, and reduce the voltage drop of the first conductive transmission layer when transmitting signals.

Figure 33:
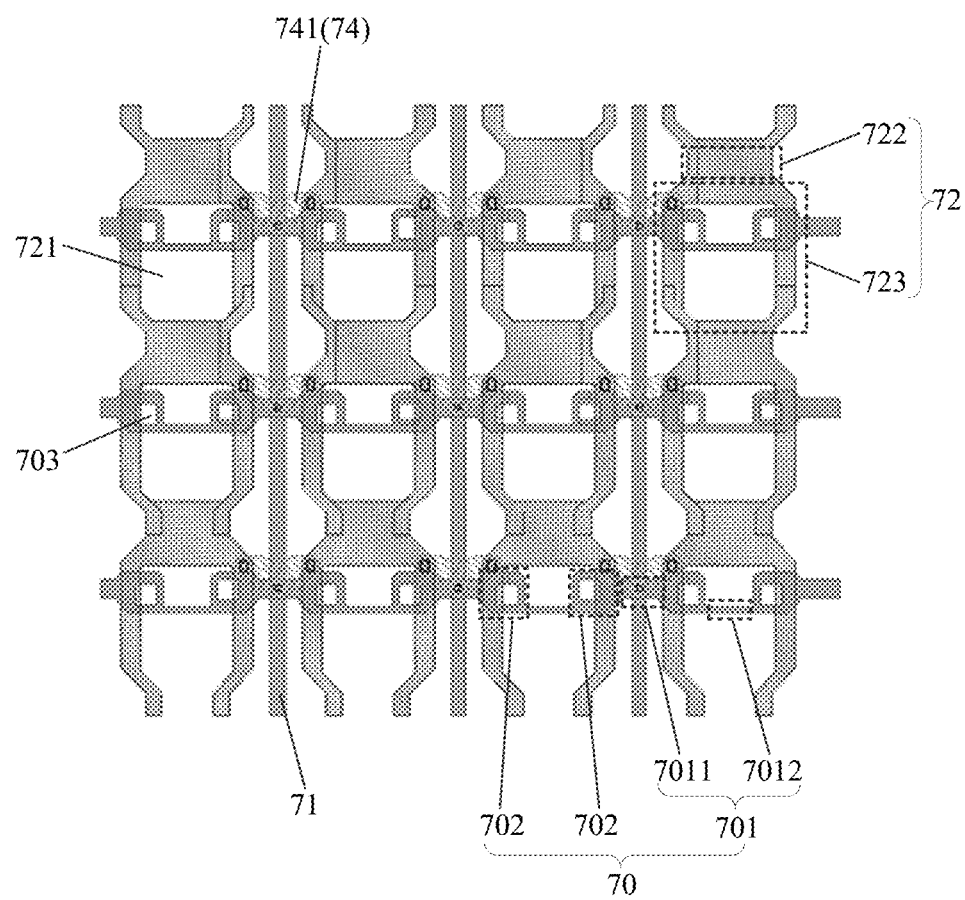
FIG. 33 is a second schematic diagram of a signal line film layer provided by an embodiment of the present disclosure.

Referring to FIG. 33, in some embodiments, the first conductive layer further includes a plurality of second conductive patterns 71, and at least one of the second conductive patterns 71 are used to couple adjacent first conductive patterns 70.

Exemplarily, the second conductive pattern 71 includes at least a portion extending along the first direction.

Exemplarily, the second conductive pattern 71 is formed into a strip-like structure.

Exemplarily, the second conductive pattern 71 and the first conductive pattern 70 form an integral structure.

Exemplarily, the second conductive patterns 71 located in the same column along the first direction are coupled in sequence to form an integral structure.

Exemplarily, the adjacent first conductive patterns 70 are coupled through a plurality of the second conductive patterns 71.

Exemplarily, the orthographic projection of the second conductive pattern 71 on the base substrate 60 at least partially overlaps the orthographic projection of the conductive connection pattern 74 on the base substrate 60.

Exemplarily, the orthographic projection of the second conductive pattern 71 on the base substrate 60 at least partially overlaps the orthographic projection of the first portion 701 on the base substrate 60.

Exemplarily, the orthographic projection of the second conductive pattern 71 on the base substrate 60 at least partially overlaps the orthographic projection of the first target portion 7011 on the base substrate 60.

Exemplarily, the orthographic projection of the second conductive pattern 71 on the base substrate 60 does not overlap the orthographic projection of the second target portion 7012 on the base substrate 60.

Exemplarily, the orthographic projection of the second conductive pattern 71 on the base substrate 60 does not overlap the orthographic projection of the second portion 702 on the base substrate 60.

Exemplarily, the second conductive pattern 71 can be made of an oxide active layer (such as an IGZO film layer), and the oxide active layer can be formed as a conductor through a conductorization process, so as to transmit the positive power signal.

In the display substrate provided by the above embodiment, the first conductive layer further includes a plurality of second conductive patterns 71, and the adjacent first conductive patterns 70 are coupled through at least one of the second conductive patterns 71. Then, the grid structure of the first conductive layer are further enlarged. The voltage drop generated when the signal line film layer transmits signals is effectively reduced. When the display substrate is applied to a display product, the display uniformity of the display product in a high-brightness display mode is ensured. Moreover, the signal line film layer is formed into a multi-layer network stacked structure, which facilitates the heat dissipation of the display product in the high-brightness display mode.

Referring to FIGS. 32 to 38, in some embodiments, the conductive connection layer includes a plurality of conductive connection patterns 74;

The second conductive layer includes a plurality of third conductive patterns 72 arranged along a second direction, the third conductive pattern 72 includes at least a portion extending along a first direction, the second direction intersects the first direction; the third conductive pattern 72 includes a plurality of second hollow regions 721; the third conductive pattern 72 is coupled to the corresponding conductive connection pattern 74.

Exemplarily, the conductive connection layer includes a plurality of conductive connection patterns 74, and the plurality of conductive connection patterns 74 are independent of each other.

Exemplarily, the plurality of conductive connection patterns 74 are arranged in an array.

Exemplarily, the structures of the plurality of conductive connection patterns 74 are completely the same.

Exemplarily, among the plurality of conductive connection patterns 74, at least some of the conductive connection patterns 74 have different shapes.

Exemplarily, the display substrate includes a display area and a peripheral area surrounding the display area. The display area is divided into a plurality of display sub-areas, the plurality of display sub-areas are in one-to-one correspondence with the plurality of conductive connection patterns 74, and the conductive connection patterns 74 are located in the corresponding display sub-areas.

Exemplarily, the first direction includes a longitudinal direction, and the second direction includes a lateral direction.

Exemplarily, the display substrate includes a plurality of gate lines and a plurality of data lines D1, the gate line includes at least a portion extending along the second direction, and the data line D1 includes at least a portion extending along the first direction.

Exemplarily, the display substrate includes a plurality of sub-pixels, and the sub-pixels include sub-pixel driving circuits. The plurality of sub-pixel driving circuits included in the plurality of sub-pixels are divided into a plurality of columns of sub-pixel driving circuit arranged along the second direction. The second conductive layer includes a plurality of third conductive patterns 72 arranged along the second direction. The plurality of third conductive patterns 72 are in one-to-one correspondence with the plurality of columns of sub-pixel driving circuits.

Exemplarily, at least part of the third conductive pattern 72 is laid out in a layout area where the corresponding column of sub-pixel driving circuits are located.

Exemplarily, each of the third conductive patterns 72 corresponds to at least one conductive connection pattern 74, and the third conductive pattern 72 is coupled to the corresponding conductive connection pattern 74.

Exemplarily, each of the third conductive patterns 72 corresponds to a plurality of conductive connection patterns 74, and the third conductive patterns 72 are respectively coupled to the plurality of conductive connection patterns 74. Exemplarily, the third conductive patterns 72 are respectively coupled to the plurality of conductive connection patterns 74 through via holes. Exemplarily, the plurality of conductive connection patterns 74 are arranged at intervals along the first direction.

Exemplarily, the adjacent third conductive patterns 72 are electrically connected through at least one of the conductive connection patterns 74.

Exemplarily, the adjacent third conductive patterns 72 are electrically connected through a plurality of the conductive connection patterns 74. The plurality of the conductive connection patterns 74 are arranged at intervals along the first direction.

In the display substrate provided by the above embodiment, the second conductive layer includes a plurality of third conductive patterns 72 arranged along the second direction, and the third conductive patterns 72 include a plurality of second hollow regions 721; the third conductive pattern 72 is coupled to the corresponding conductive connection pattern 74; the second conductive layer is formed into a grid structure, thereby effectively reducing the voltage drop generated when the signal line film layer transmits signals. When the display substrate is applied to a display product, the display uniformity of the display product in a high-brightness display mode is ensured. Moreover, forming the first conductive layer into a grid structure facilities the heat dissipation of the display product in a high-brightness display mode.

In some embodiments, the first hollow region 703 and the second hollow region 721 at least partially overlap.

The above arrangement is beneficial to improve the transmittance of the display substrate.

Referring to FIGS. 32 to 38, in some embodiments, the third conductive pattern 72 includes a plurality of third portions 722 and a plurality of fourth portions 723, the third portions 722 and the fourth portions 723 are alternately arranged along the first direction;

The width of the third portion 722 in the direction perpendicular to the first direction is smaller than the distance between the two boundaries of the fourth portion 723 that are farthest apart in the direction perpendicular to the first direction; the fourth portion 723 includes the second hollow region 721.

Exemplarily, the third portion 722 and the fourth portion 723 are formed as an integral structure.

Exemplarily, the fourth portion 723 includes a strip-shaped pattern having at least a portion extending along the first direction.

Exemplarily, the third portion 722 includes a block pattern.

Exemplarily, the orthographic projection of the third portion 722 on the base substrate 60 does not overlap the orthographic projection of the first conductive layer on the base substrate 60.

Exemplarily, the orthographic projection of the third portion 722 on the base substrate 60 at least partially overlaps the orthographic projection of the first conductive layer on the base substrate 60.

Exemplarily, the orthographic projection of the fourth portion 723 on the base substrate 60 at least partially overlaps the orthographic projection of the second conductive layer on the base substrate 60.

Exemplarily, there is an overlapping area between the orthographic projection of the third portion 722 on the base substrate 60 and the orthographic projection of the corresponding conductive connection pattern 74 on the base substrate 60, and the third portion 722 is coupled to the corresponding conductive connection pattern 74 in the overlapping area.

Exemplarily, there is an overlapping area between the orthographic projection of the fourth portion 723 on the base substrate 60 and the orthographic projection of the corresponding conductive connection pattern 74 on the base substrate 60, and the fourth portion 723 is coupled to the corresponding conductive connection patterns 74 in the overlapping area.

Exemplarily, the width of the third portion 722 in the direction perpendicular to the first direction is smaller than the minimum distance between the two boundaries of the fourth portion 723 that are farthest apart in the direction perpendicular to the first direction.

Exemplarily, the width of the third portion 722 in the direction perpendicular to the first direction is smaller than the maximum distance between the two boundaries of the fourth portion 723 that are farthest apart in the direction perpendicular to the first direction.

In the display substrate provided by the above-mentioned embodiment, the third conductive pattern 72 includes a plurality of third portions 722 and a plurality of fourth portions 723, and the third portions 722 and the fourth portions 723 are alternately arranged along the first direction; and the width of the third portion 722 in the direction perpendicular to the first direction is smaller than the distance between the two boundaries of the fourth portion 723 that are farthest apart in the direction perpendicular to the first direction, so that the second conductive layer effectively utilizes the limited layout space under the condition of avoiding short circuit with the surrounding conductive structure, realizes the grid structure of the second conductive layer, and reduces the voltage drop generated when the second conductive layer transmit signals.

In the display substrate provided by the above embodiment, the width of the third portion 722 in the direction perpendicular to the first direction is less than the distance between the two boundaries of the fourth portion 723 that are farthest apart in the direction perpendicular to the first direction; the fourth portion 723 includes the second hollow region 721; a large area hollow region can be formed, the difficulty of forming the hollow region can be effectively reduced.

Figure 34:
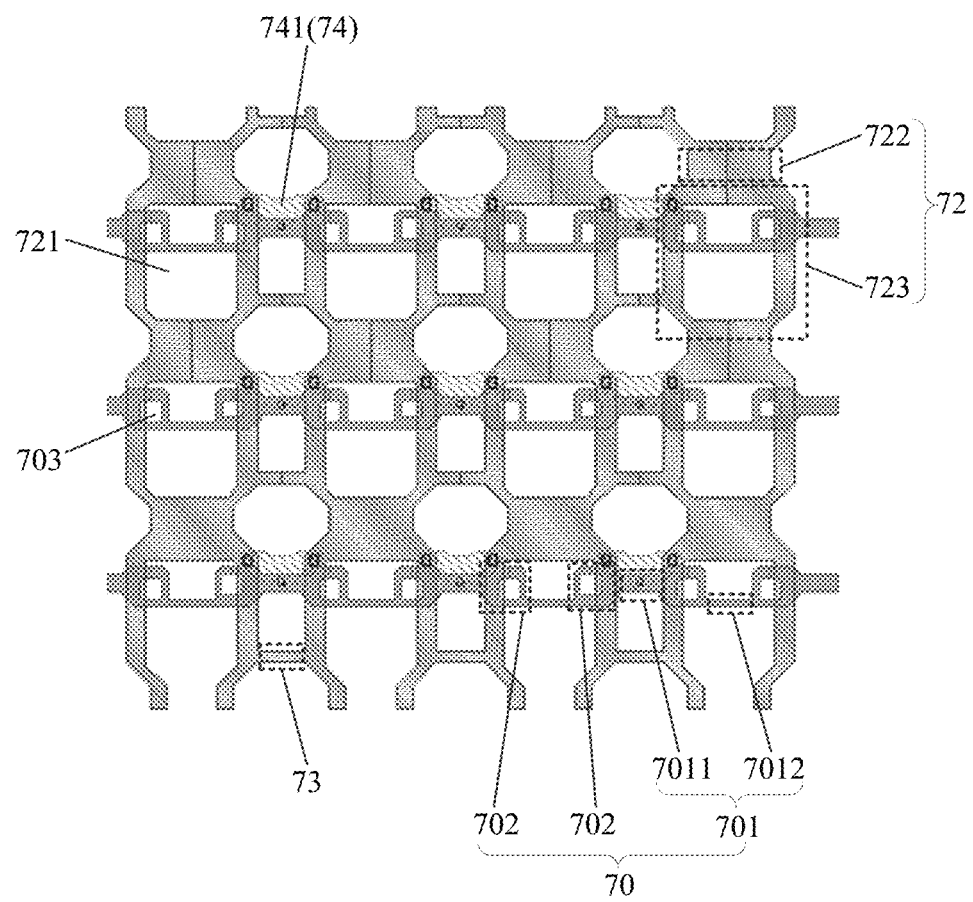
FIG. 34 is a third schematic diagram of a signal line film layer provided by an embodiment of the present disclosure.

As shown in FIG. 34, in some embodiments, the second conductive layer further includes a plurality of fourth conductive patterns 73, and adjacent third conductive patterns 72 are coupled through at least one of the fourth conductive patterns 73.

Exemplarily, the fourth conductive pattern 73 and the third conductive pattern 72 form an integral structure.

Exemplarily, the fourth conductive pattern 73 includes a stripe-shape pattern extending along the second direction.

Exemplarily, the adjacent third conductive patterns 72 are coupled through a plurality of the fourth conductive patterns 73, and the plurality of the fourth conductive patterns 73 are arranged at intervals along the first direction.

Exemplarily, the fourth conductive patterns 73 and the conductive connection patterns 74 are alternately arranged along the first direction.

Exemplarily, the orthographic projection of the fourth conductive pattern 73 on the base substrate 60 at least partially overlaps the orthographic projection of the conductive connection pattern 74 on the base substrate 60.

Exemplarily, the orthographic projection of the fourth conductive pattern 73 on the base substrate 60 does not overlap the orthographic projection of the conductive connection pattern 74 on the base substrate 60.

Exemplarily, the orthographic projection of the fourth conductive pattern 73 on the base substrate 60 at least partially overlaps the orthographic projection of the second conductive pattern 71 on the base substrate 60.

Exemplarily, the orthographic projection of the fourth conductive pattern 73 on the base substrate 60 does not overlap the orthographic projection of the first conductive pattern 70 on the base substrate 60.

In the display substrate provided by the above embodiment, the second conductive layer further includes a plurality of fourth conductive patterns 73, and the adjacent third conductive patterns 72 are coupled through at least one of the fourth conductive patterns 73; the grid structure of the second conductive layer is further extended. The voltage drop generated when the signal line film layer transmits signals is effectively reduced. When the display substrate is applied to a display product, the display uniformity of the display product in a high-brightness display mode is ensured. Moreover, the signal line film layer is formed into a multi-layer network stacked structure, which facilitates the heat dissipation of the display product in the high-brightness display mode.

Referring to FIGS. 32 to 36, in some embodiments, the conductive connection pattern 74 includes a main portion 741, and the main portion 741 is respectively coupled to the corresponding first conductive pattern 70 and the third conductive pattern 72.

Exemplarily, the main portion 741 includes block pattern.

Exemplarily, the orthographic projection of the main portion 741 on the base substrate 60 at least partially overlaps the orthographic projection of the first conductive pattern 70 on the base substrate 60. The orthographic projection of the main portion 741 on the base substrate 60 at least partially overlaps the orthographic projection of the third conductive pattern 72 on the base substrate 60.

Exemplarily, the main portion 741 is respectively coupled to the corresponding first conductive pattern 70 and the third conductive pattern 72 through via holes.

Figure 37:
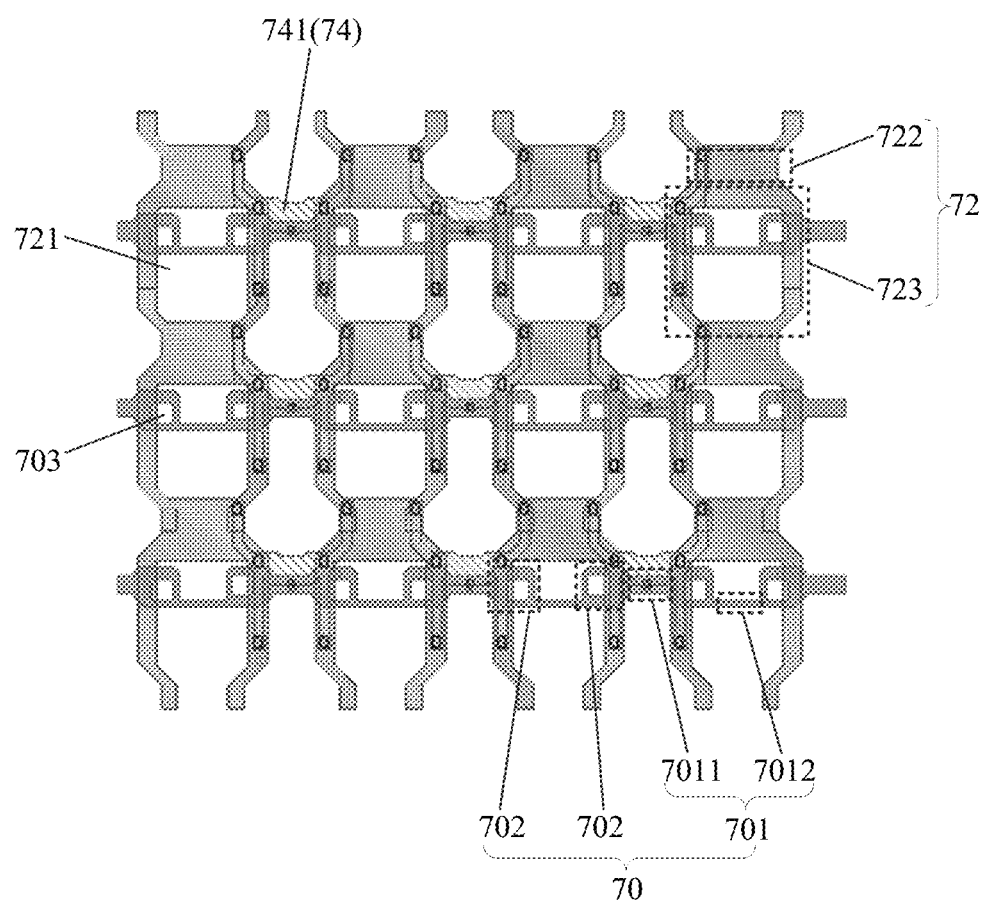
FIG. 37 is a fifth schematic diagram of a signal line film layer provided by an embodiment of the present disclosure.
Figure 38:
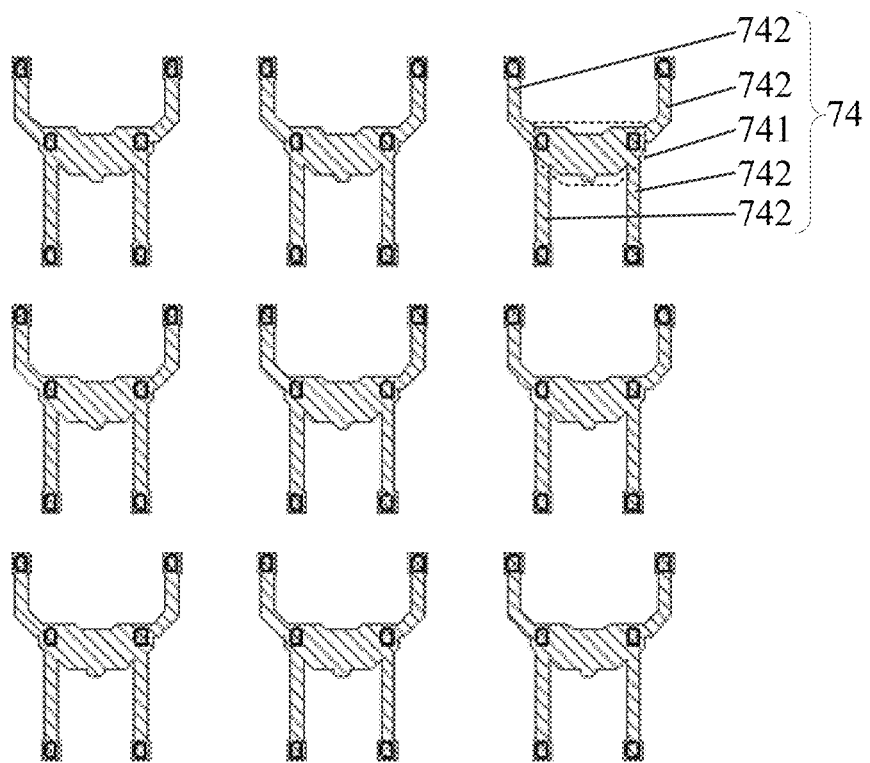
FIG. 38 is the schematic diagram of the layout of the conductive connection pattern in FIG. 37.

As shown in FIGS. 37 and 38, in some embodiments, the conductive connection pattern 74 further includes at least one first extension portion 742 extending from the main portion 741.

Exemplarily, the main portion 741 and the first extension portion 742 are formed as an integral structure.

Exemplarily, the first extension portion 742 includes at least a portion extending along the first direction.

Exemplarily, the conductive connection pattern 74 includes four first extension portions 742.

In the display substrate provided in the above-mentioned embodiment, the conductive connection pattern 74 further includes at least one first extension portion 742 extending from the main portion 741, so that the conductive connection pattern 74 has a plurality of branch lines, which facilitates the heat dissipation of the conductive connection pattern 74.

Figure 54:
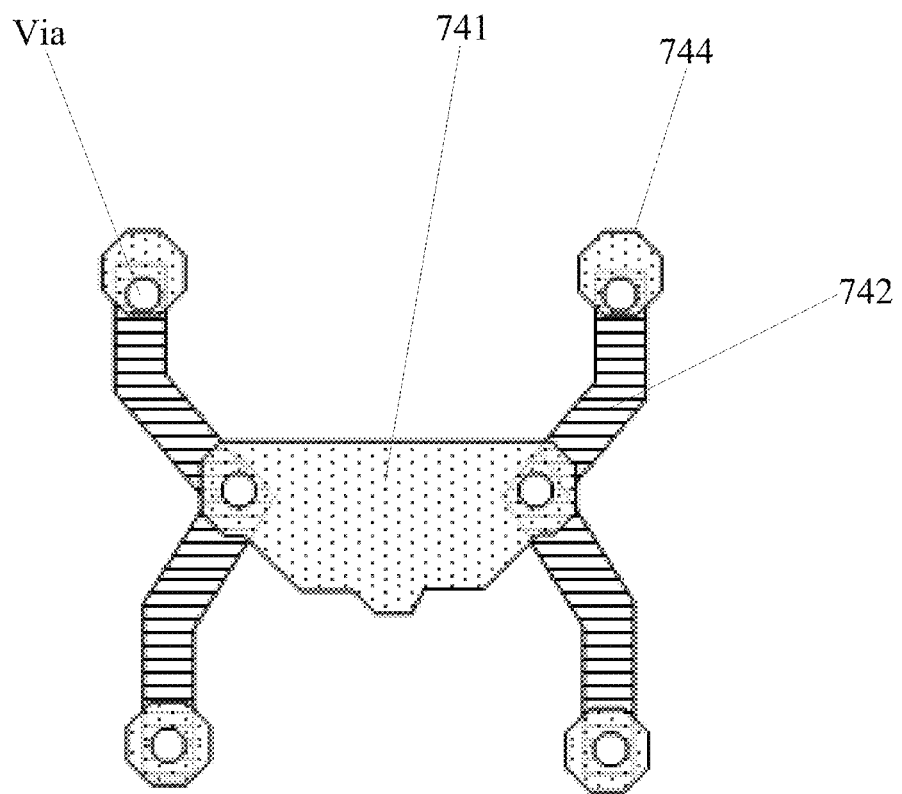
FIG. 54 is a schematic diagram of a conductive connection pattern provided by an embodiment of the present disclosure.

As shown in FIG. 54, in some embodiments, the conductive connection pattern 74 further includes a first extension portion 742, and the first extension portion 742 is made of an oxide active layer (e.g., an IGZO film layer). The oxide active layer may be formed as a conductor through a conductorization process. Two ends of the first extension portion formed by using the conductive oxide active layer can be respectively electrically connected to the main portion (made by the first source-drain metal layer) and the third conductive pattern 72 (made by the second source-drain metal layer) through via holes, to realize the transmission of the positive power signal.

Figure 51:
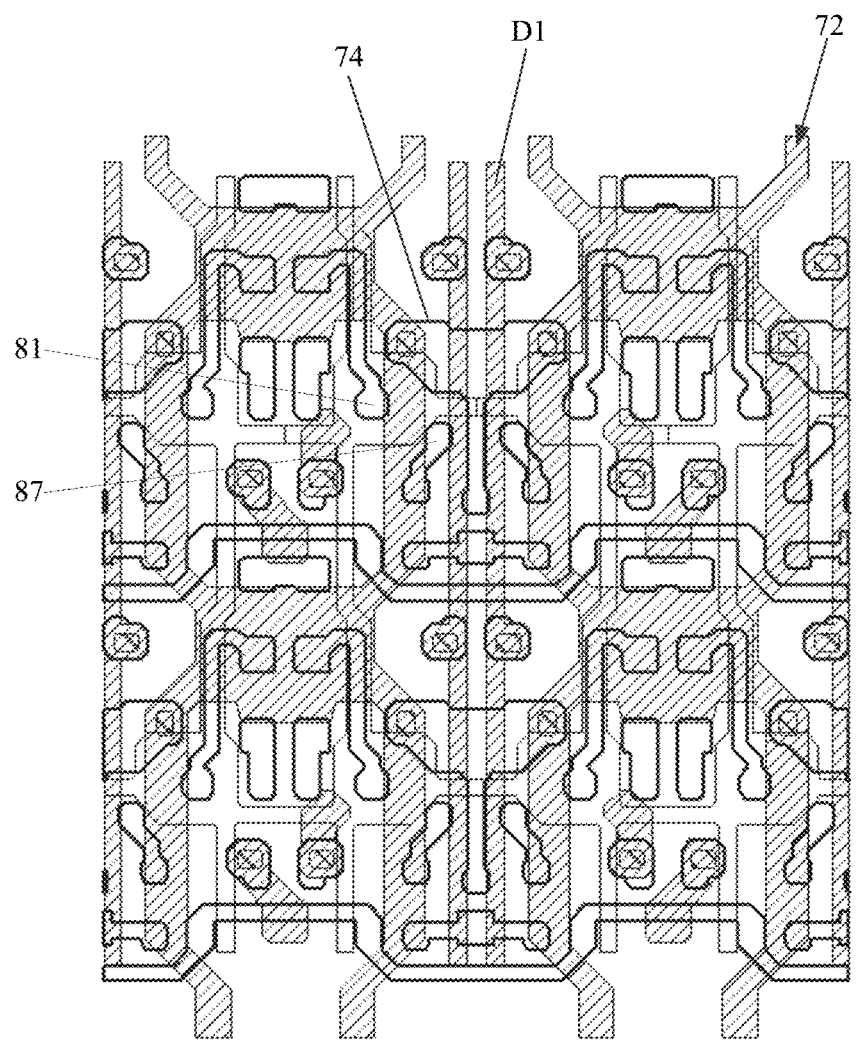
FIG. 51 is a schematic diagram of the layout the first source-drain metal layer and the second source-drain metal layer in FIG. 39.

As shown in FIG. 51 and FIG. 54, for example, the conductive connection pattern 74 further includes a connection portion 744, and the first extension portion 742 is coupled to the connection portion 744 through the via hole Via.

Exemplarily, the connecting portion 744 and the main portion 741 are arranged at the same layer and made of the same material.

The above-mentioned use of the conductive oxide active layer to form the first extension portion can avoid the first conductive portion 81 and the seventh conductive portion 87, which is beneficial to improve the yield of the display substrate.

As shown in FIGS. 37 and 38, in some embodiments, the orthographic projection of the first extension portion 742 on the base substrate 60 at least partially overlaps the orthographic projection of the second conductive layer on the base substrate 60.

Exemplarily, the orthographic projection of the first extension portion 742 on the base substrate 60 is located inside the orthographic projection of the second conductive layer on the base substrate 60.

Exemplarily, the orthographic projection of the first extension portion 742 on the base substrate 60 does not overlap the orthographic projection of the second conductive pattern 71 on the base substrate 60.

Exemplarily, the orthographic projection of a portion of the first extension portion 742 on the base substrate 60 at least partially overlaps the orthographic projection of the first conductive pattern 70 on the base substrate 60.

In the display substrate provided by the above embodiment, by setting the orthographic projection of the first extending portion 742 on the base substrate 60 at least partially overlapping the orthographic projection of the second conductive layer on the base substrate 60, the layout difficulty of the first extension portion 742 is effectively reduced.

As shown in FIGS. 37 and 38, in some embodiments, the first extension portion 742 is coupled to the second conductive layer through a via hole.

Exemplarily, there is an overlapping area between the orthographic projection of the first extension portion 742 on the base substrate 60 and the orthographic projection of the second conductive layer on the base substrate 60 and the first extension portion 742 is coupled to the second conductive layer through a via hole in the overlapping area.

The above arrangement of the first extension portion 742 to be coupled to the second conductive layer through the via hole increases the area of the second conductive layer at the via hole, thereby effectively reducing the voltage drop of the signal line film layer.

Figure 35:
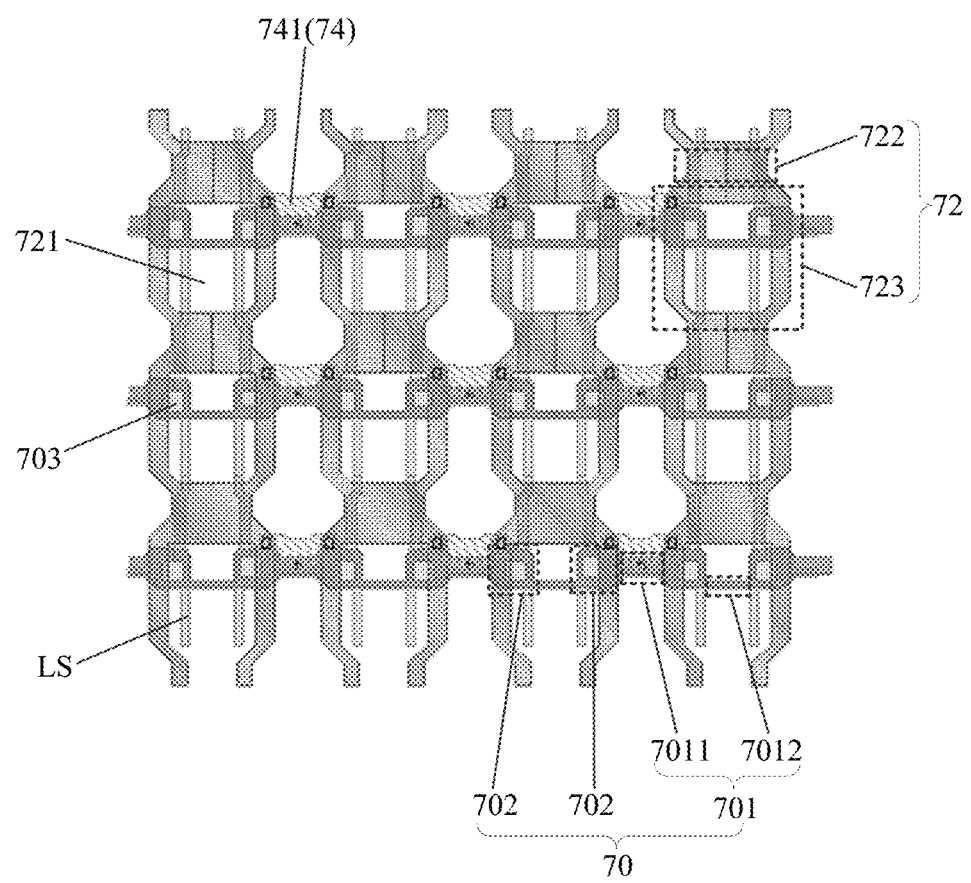
FIG. 35 is a fourth schematic diagram of a signal line film layer provided by an embodiment of the present disclosure.
Figure 36:
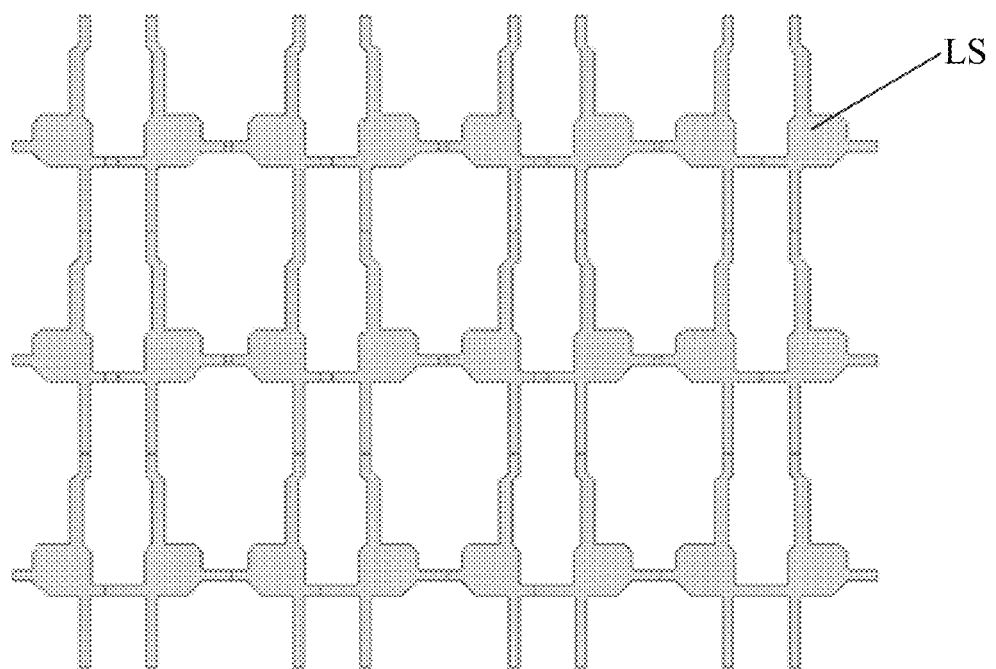
FIG. 36 is the schematic diagram of the layout of the light-shielding layer in FIG. 35.

As shown in FIG. 35 and FIG. 36, in some embodiments, the display substrate further includes:

A light shielding layer LS, wherein the light shielding layer LS is formed into a grid structure, and the light shielding layer LS is coupled to the signal line film layer.

Exemplarily, the light shielding layer is located between the sub-pixel driving circuit and the base substrate 60. The sub-pixel driving circuit includes a driving transistor (e.g., the third transistor T3), and the orthographic projection of the light shielding layer on the base substrate 60 at least partially overlaps the orthographic projection of the channel portion of the driving transistor on the base substrate 60. This arrangement enables the light shielding layer to block light from emitting to the channel portion from the base substrate 60 side, so as to ensure stable characteristics of the driving transistor.

The light-shielding layer is coupled to the signal line film layer, so that the light-shielding layer has a stable potential, the light-shielding layer can properly shield the influence of peripheral charges on the channel portion and ensure the stable characteristics of the driving transistor.

The light shielding layer is coupled to the signal line film layer, it is equivalent to further expanding the grid structure of the signal line film layer on another spatial level, which effectively reduces the voltage drop of the signal line film layer when transmitting signals. When the display substrate is applied to a display product, the display uniformity of the display product in a high-brightness display mode is ensured. Moreover, the signal line film layer is formed into a multi-layer network stacked structure, which facilitates the heat dissipation of the display product in the high-brightness display mode.

In some embodiments, the display substrate further includes a peripheral signal line, the peripheral signal line is located in a peripheral region of the display substrate, and the peripheral signal line is coupled to the signal line film layer;

The light shielding layer includes a peripheral portion located in the peripheral region, and the peripheral portion is coupled to the peripheral signal line.

Exemplarily, the display substrate further includes a driving chip, the peripheral signal line is coupled to the driving chip, the peripheral signal line is further coupled to the signal line film layer, and the peripheral signal line is used to connect the signal provided by the driving chip is transmitted to the signal line film layer.

Exemplarily, the orthographic projection of the peripheral signal line on the base substrate 60 and the orthographic projection of the peripheral portion of the light shielding layer on the base substrate 60 have an overlapping area, and in the overlapping area, the peripheral The signal line is coupled with the peripheral portion of the light shielding layer through the via hole. The light shielding layer LS is coupled to the signal line film layer in the peripheral region through peripheral signal lines.

In some embodiments, the first conductive layer is made of a second gate metal layer, the second conductive layer is made of a second source-drain metal layer, and the conductive connection layer is made of a first source-drain metal layer.

As shown in FIG. 52, exemplarily, the display substrate includes: a first buffer layer Buf, a light shielding layer LS, an isolation layer Bar, a poly active layer POL, a first gate insulating layer GI1, a first gate metal layer Gate1, a second gate insulating layer GI2, a second gate metal layer Gate2, a first interlayer insulating layer ILD, a second buffer layer, an oxide active layer (such as IGZO), a third gate insulating layer, a third gate metal layer, a second interlayer insulating layer, a first source-drain metal layer SD1, a passivation layer PVX, a first planarization Layer PLN1, a second source-drain metal layer SD2, a second planarization layer PLN2, an anode layer 50, a pixel defining layer PDL, a spacer layer PS, a light emitting functional layer, a cathode layer and encapsulation layer which are stacked on the base substrate 60 (e.g., a polyimide substrate) along a direction away from the base substrate 60.

In the display substrate provided by the above embodiment, the first conductive layer is made of a second gate metal layer, the second conductive layer is made of a second source-drain metal layer, and the conductive connection layer is made of a first source-drain metal layer. The signal line film layer is formed by using the existing film layer in the display substrate without adding an additional patterning process, thereby effectively simplifying the manufacture process of the display substrate and reducing the manufacture cost of the display substrate.

In the display substrate provided by the above-mentioned embodiment, the first conductive layer is made of a second gate metal layer, the second conductive layer is made of a second source-drain metal layer, and the conductive connection layer is made of a first source-drain metal layer, the conductive connection layer acts as a bridge and is coupled to the second conductive layer through a via hole penetrating the passivation layer and the first planarization layer, and is coupled to the first the first conductive layer through a via hole penetrating the first interlayer insulating layer, the second buffer layer, the third gate insulating layer and the second interlayer insulating layer.

Exemplarily, 13mask processes are applied to the display substrate, and the sequence of the process includes:

Using a rigid or flexible substrate;

Forming a buffer layer on the base substrate by using materials such as SiOx and SiNx;

Forming the light shielding layer LS by using the Mo metal material through 1mask process;

Forming the poly active layer by using the P—Si material through 2mask process;

Forming the first gate insulating layer GI1 by using the SiO x material;

Forming the first gate metal layer Gate1 by using the Mo metal material through 3mask process;

Forming the second gate insulating layer GI2 by using the materials such as SiOx and SiNx;

Forming the second gate metal layer Gate2 by using the Mo metal material through 4mask process;

Forming the interlayer insulating layer ILD by using materials such as SiOx and SiNx through 5mask process;

Forming a via hole between the first source-drain metal layer SD1 and the light shielding layer LS through 6mask process;

Forming the first source-drain metal layer SD1 of the Ti—Al—Ti stacked structure through 7mask process;

Forming the passivation layer PVX by using materials such as SiOx and SiNx through 8mask process;

Forming the first planarization layer PLN1 by using organic materials through 9mask process;

Forming the second source-drain metal layer SD2 of the Ti—Al—Ti stacked structure through 10mask process;

Forming the second planarization layer PLN2 by using organic materials through 11mask process;

Forming the anode layer 50 by using indium tin oxide through 12mask process;

Forming the pixel defining layer PDL and the spacer layer PS by using organic materials through 13mask process.

As shown in FIGS. 39 to 53, in some embodiments, the conductive connection pattern 74 includes a main portion 741 and a second extension portion 743 extending from the main portion 741. The main portion 741 includes at least a portion extending along the second direction, the second extending portion 743 includes at least a portion extending along a first direction, the first direction intersects the second direction;

The display substrate further includes a plurality of sub-pixels, the sub-pixels include a sub-pixel driving circuit, the sub-pixel driving circuit includes a driving transistor and a fifth transistor T5, and a first electrode of the fifth transistor T5 is coupled to the corresponding second extension portion 743, and a second electrode of the fifth transistor T5 is coupled to the first electrode of the driving transistor.

Exemplarily, the main portion 741 and the second extension portion 743 are formed as an integral structure.

Exemplarily, the second extension portion 743 includes a strip-shaped structure extending along the first direction.

Exemplarily, the display substrate further includes a plurality of light-emitting control lines E1, and the light-emitting control line E1 includes at least portions extending along the second direction.

Exemplarily, the plurality of sub-pixel driving circuits in the display substrate are divided into a plurality of rows of sub-pixel driving circuits, and the plurality of rows of sub-pixel driving circuits are in one-to-one correspondence with the plurality of light-emitting control lines E1.

Exemplarily, the gate electrodes of the fifth transistors T5 included in each row of the sub-pixel driving circuits are respectively coupled to the corresponding light-emitting control lines E1. The first electrode of the fifth transistor T5 is coupled to the corresponding second extension portion 743, and the second electrode of the fifth transistor T5 is coupled to the first electrode of the driving transistor.

The above-mentioned coupling the first electrode of the fifth transistor T5 to the corresponding second extension portion 743 can reduce the layout difficulty of the display substrate, and at the same time realize that the first electrode of the fifth transistor T5 is connected to the power supply signal, As shown in FIG. 39 to FIG. 53, in some embodiments, the plurality of sub-pixel driving circuits included in the plurality of sub-pixels is divided into a plurality of rows of sub-pixel driving circuits, and each row of sub-pixel driving circuits includes a plurality of sub-pixel driving circuits arranged along the second direction. The plurality of sub-pixel driving circuits included in each row of sub-pixel driving circuits are divided into a plurality of sub-pixel driving circuit groups, and each sub-pixel driving circuit group includes two adjacent sub-pixel driving circuits;

The first electrodes of the two fifth transistors T5 included in the sub-pixel driving circuit group are coupled to the second extending portion 743 of the corresponding same conductive connection pattern 74.

Exemplarily, the plurality of conductive connection patterns 74 included in the display substrate is divided into a plurality of rows of conductive connection patterns 74, and each row of the conductive connection patterns 74 includes a plurality of conductive connection patterns 74 arranged along the second direction, the plurality of rows of conductive connection patterns 74 are in one-to-one correspondence with the plurality of rows of sub-pixel driving circuits.

Exemplarily, the plurality of conductive connection patterns 74 included in the display substrate is divided into a plurality of columns of conductive connection patterns 74, and each column of conductive connection patterns 74 includes a plurality of conductive connection patterns 74 arranged along the first direction, the conductive connection patterns 74 and the third conductive patterns 72 are alternately arranged.

Exemplarily, the plurality of sub-pixel driving circuits included in each row of sub-pixel driving circuits is divided into a plurality of sub-pixel driving circuit groups, each sub-pixel driving circuit group includes two adjacent sub-pixel driving circuits, and each sub-pixel driving circuit belongs to only one sub-pixel driving circuit group.

Exemplarily, the plurality of sub-pixel driving circuit groups in the display substrate are in one-to-one correspondence with the plurality of conductive connection patterns 74.

The above configuration that the first electrodes of the two fifth transistors T5 included in the sub-pixel driving circuit group are coupled to the second extension portion 743 of the corresponding same conductive connection pattern 74 effectively reduces the layout difficulty of the display substrate.

As shown in FIG. 39 to FIG. 53, in some embodiments, the sub-pixel driving circuit further includes a first transistor T1 and a second transistor T2; the second electrode of the first transistor T1 and the second electrode of the second transistor T2 are respectively coupled to the gate electrode of the driving transistor (i.e., the gate electrode T3-g of the third transistor T3) through the first conductive portion 81; the main portion 741 is located between the two first conductive portions 81 included in the corresponding sub-pixel driving circuit group.

Exemplarily, the display substrate further includes a plurality of second scan lines S2 and a plurality of reset lines R1, at least part of the second scan line S2 and at least part of the reset line R1 both extend along the second direction.

Exemplarily, the plurality of rows of sub-pixel driving circuits in the display substrate are in one-to-one correspondence with the plurality of second scan lines S2. The plurality rows of sub-pixel driving circuits in the display substrate are in one-to-one correspondence with the plurality of reset lines R1.

Exemplarily, the gate electrodes of the first transistors T1 included in each row of the sub-pixel driving circuits are respectively coupled to the corresponding second scan lines S2, and the gate electrodes of the second transistors T2 included in each row of the sub-pixel driving circuits are respectively coupled to the corresponding reset lines R1.

Exemplarily, each sub-pixel driving circuit includes one first conductive portion 81.

The main portion 741 are arranged between the two first conductive portions 81 included in the corresponding sub-pixel driving circuit group, which reduces the layout difficulty of the display substrate and facilitates the operation stability of the sub-pixel driving circuit.

As shown in FIGS. 39 to 53, in some embodiments, the main portion 741 includes a symmetrical pattern, the symmetry axis of the symmetrical pattern extends along the first direction, and the symmetrical axis is located between two sub-pixel driving circuits included in the sub-pixel driving circuit group corresponding to the main portion 741.

Exemplarily, the second extension portion 743 is also symmetrical about the symmetry axis.

The above arrangement can not only reduce the layout difficulty of the display substrate, but also facilitate the operation stability of the sub-pixel driving circuit.

As shown in FIGS. 39 to 53, in some embodiments, adjacent third conductive patterns 72 are coupled through at least one conductive connection pattern 74.

In some embodiments, at least part of the conductive connection patterns 74 are respectively coupled to the fourth portions 723 included in two adjacent third conductive patterns 72.

Exemplarily, adjacent third conductive patterns 72 are coupled through a plurality of conductive connection patterns 74.

The above arrangement reduces the layout difficulty of the display substrate, optimizes the grid structure of the signal line film layer, which is beneficial to reduce the voltage drop of the signal line film layer and improve the heat dissipation of the signal line film layer.

As shown in FIGS. 39 to 53, in some embodiments, the display substrate further includes a plurality of reset lines R1, a plurality of first scan lines S1 and a plurality of second scan lines S2, at least a portion of the reset line R1, at least a portion of the first scan line S1 and at least a portion of the second scan line S2 extend along the second direction;

The orthographic projection of the third portion 722 on the base substrate 60 partially overlaps the orthographic projection of the corresponding reset line R1 on the base substrate 60, partially overlaps the orthographic projection of the corresponding first scan line S1 on the base substrate 60, and partially overlaps the orthographic projection of the corresponding second scan line S2 on the base substrate 60.

Exemplarily, the plurality of rows of sub-pixel driving circuits in the display substrate are in one-to-one correspondence with the plurality of first scan lines S1.

Exemplarily, all of the third portions 722 included in the display substrate are divided into a plurality of rows of the third portions 722, and each row of the third portions 722 includes a plurality of third portions 722 arranged along the second direction.

Exemplarily, the plurality of rows of third portions 722 are in one-to-one correspondence with the plurality of reset lines R1; the plurality of rows of third portions 722 are in one-to-one correspondence with the plurality of first scan lines S1; the plurality of rows of third portion 722 are in one-to-one correspondence with the plurality of second scan lines S2.

The above arrangement reduces the layout difficulty of the display substrate, optimizes the grid structure of the signal line film layer, which is beneficial to reduce the voltage drop of the signal line film layer and improve the heat dissipation of the signal line film layer.

As shown in FIGS. 39 to 53, in some embodiments, the display substrate further includes a plurality of light-emitting control lines E1, a plurality of third scan lines S3, a first initialization signal transmission layer Vinit1, a second initialization signal transmission layer Vinit2 and a third initialization signal transmission layer Vinit3;

The orthographic projection of the fourth portion 723 on the base substrate 60 partially overlaps the orthographic projection of the corresponding light-emitting control line E1 on the base substrate 60; partially overlaps the orthographic projection of the corresponding third scan line S3 on the base substrate 60; partially overlaps the orthographic projection of the first initialization signal transmission layer Vinit1 on the base substrate 60; partially overlaps the orthographic projection of the second initialization signal transmission layer Vinit2 on the base substrate 60; and partially overlaps the orthographic projection of the third initialization signal transmission layer Vinit3 on the base substrate 60.

Exemplarily, the plurality of rows of sub-pixel driving circuits in the display substrate are in one-to-one correspondence with the plurality of third scan lines S3.

Exemplarily, the first initialization signal transmission layer Vinit1, the second initialization signal transmission layer Vinit2, and the third initialization signal transmission layer Vinit3 all include a first transmission portion, and the first transmission portion includes at least a portion extending along the second direction.

Exemplarily, all the fourth portions 723 included in the display substrate are divided into a plurality of rows of fourth portions 723, and each row of the fourth portions 723 includes a plurality of fourth portions 723 arranged along the second direction, the plurality of rows of the fourth portions 723 are in one-to-one correspondence with the plurality of rows of sub-pixel driving circuits in the display substrate.

Exemplarily, the plurality of rows of fourth portions 723 are in one-to-one correspondence with the plurality of third scan lines S3. The plurality of rows of fourth portions 723 are in one-to-one correspondence with a plurality of first transmission portions included in the first initialization signal transmission layer Vinit1. The plurality of rows of fourth portions 723 are in one-to-one correspondence with a plurality of first transmission portions included in the second initialization signal transmission layer Vinit2, the plurality of rows of fourth portions 723 are in one-to-one correspondence with a plurality of first transmission portions included in the third initialization signal transmission layer Vinit3.

The above arrangement reduces the layout difficulty of the display substrate, optimizes the grid structure of the signal line film layer, which is beneficial to reduce the voltage drop of the signal line film layer and improve the heat dissipation of the signal line film layer.

As shown in FIGS. 39 to 53, in some embodiments, the display substrate further includes a plurality of data lines D1, the data lines D1 including at least a portion extending along the first direction;

The display substrate further includes a plurality of sub-pixels, the sub-pixels include a sub-pixel driving circuit, the sub-pixel driving circuit includes a driving transistor, a fourth transistor T4 and a fifth transistor T5, and the fourth transistor T4 is respectively connected to the first electrode of the first transistor T1 and the corresponding data line D1, and the fifth transistor T5 is respectively coupled to the first electrode of the driving transistor and the corresponding conductive connection pattern 74;

The fourth transistor T4 includes the fourth active layer 34, the fifth transistor T5 includes the fifth active layer 35, and the orthographic projection of the fourth portion 723 on the base substrate 60 does not overlap the orthographic projection of the fourth active layer 34 on the base substrate 60, and does not overlap the orthographic projection of the fifth active layer 35 on the base substrate 60.

Exemplarily, the plurality of sub-pixel driving circuits included in the display substrate are divided into a plurality of columns of sub-pixel driving circuits, and the plurality of columns of sub-pixel driving circuits are in one-to-one correspondence with the plurality of data lines D1. The first electrodes of the fourth transistors T4 in each column of sub-pixel driving circuits are respectively coupled to the corresponding data lines D1.

Exemplarily, the display substrate includes a plurality of first scan lines S1, and the gate electrodes of the fourth transistors T4 in each row of sub-pixel driving circuits are respectively coupled to the corresponding first scan lines S1.

Exemplarily, the fourth transistor T4 includes a fourth active layer 34, and the fourth active layer 34 can form a channel region of the fourth transistor T4.

Exemplarily, the fifth transistor T5 includes a fifth active layer 35, and the fifth active layer 35 can form a channel region of the fifth transistor T5.

The orthographic projection of the fourth portion 723 on the base substrate 60 does not overlap the orthographic projection of the fourth active layer 34 on the base substrate 60, and does not overlap the orthographic projection of the fifth active layer 35 on the base substrate 60; so that the layout difficulty of the display substrate is reduced, the grid structure of the signal line film layer is optimized, the voltage drop of the signal line film layer is reduced, and the heat dissipation of the signal line film layer is improved.

As shown in FIG. 39 to FIG. 53, in some embodiments, the display substrate further includes a second initialization signal transmission layer Vinit2;

The display substrate further includes a plurality of sub-pixels, the sub-pixels include a sub-pixel driving circuit, the sub-pixel driving circuit includes a driving transistor, a sixth transistor T6, a seventh transistor T7 and a light-emitting element O1, the sixth transistor T6 are respectively coupled to the second electrode of the driving transistor and the light-emitting element O1, and the seventh transistor T7 is respectively coupled to the light-emitting element O1 and the second initialization signal transmission layer Vinit2;

The sixth transistor T6 includes a sixth active layer 36, the seventh transistor T7 includes a seventh active layer 37, and the orthographic projection of the fourth portion 723 on the base substrate 60 surrounds at least part of the orthographic projection of the seventh active layer 37 on the base substrate 60, also surrounds the orthographic projection of the sixth active layer 36 on the base substrate 60.

Exemplarily, the gate electrodes of the sixth transistors T6 in each row of sub-pixel driving circuits are respectively coupled to the corresponding light-emitting control lines E1.

Exemplarily, the gate electrodes of the seventh transistors T7 in each row of sub-pixel driving circuits are respectively coupled to the corresponding third scan lines S3.

The orthographic projection of the fourth portion 723 on the base substrate 60 surrounds at least part of the orthographic projection of the seventh active layer 37 on the base substrate 60 and also surrounds the orthographic projection of the sixth active layer 36 on the base substrate 60, which reduces the layout difficulty of the display substrate, optimizes the grid structure of the signal line film layer, facilities the voltage drop of the signal line film layer, and improves the heat dissipation of the signal line film layer.

As shown in FIGS. 39 to 53, in some embodiments, the display substrate further includes a plurality of sub-pixels, the sub-pixels include a sub-pixel driving circuit, the sub-pixel driving circuit includes a driving transistor, and the orthographic projection of the gate electrode of the driving transistor on the base substrate 60 partially overlaps the orthographic projection of the fourth portion 723 on the base substrate 60.

The above arrangement reduces the layout difficulty of the display substrate, optimizes the grid structure of the signal line film layer, which is beneficial to reduce the voltage drop of the signal line film layer and improve the heat dissipation of the signal line film layer.

As shown in FIG. 39 to FIG. 53, in some embodiments, the display substrate further includes a third initialization signal transmission layer Vinit3;

The display substrate further includes a plurality of sub-pixels, the sub-pixels include a sub-pixel driving circuit, the sub-pixel driving circuit includes a driving transistor and an eighth transistor T8, a first electrode of the eighth transistor T8 is coupled to the third initialization signal transmission layer Vinit3, a second electrode of the eighth transistor T8 is coupled to the first electrode or the second electrode of the driving transistor; the eighth transistor T8 includes an eighth active layer 38, the orthographic projection of the eighth active layer 38 on the base substrate 60 at least partially overlaps the orthographic projection of the fourth portion 723 on the base substrate 60.

Exemplarily, the third initialization signal transmitted by the third initialization signal transmission layer Vinit3 may be a high-level signal, for example, may be a positive power signal, or may be 0.5 to 1.5 times the voltage value of the positive power signal.

Exemplarily, when the third initialization signal is a positive power signal, the third initialization signal transmission layer Vinit3 may be coupled to the signal line film layer in the peripheral area of the display substrate; or the third initialization signal transmission layer Vinit3 and the second conductive layer are coupled through via holes in the display area and in an overlapping area between the third initialization signal transmission layer Vinit3 and the second conductive layer.

Figure 53:
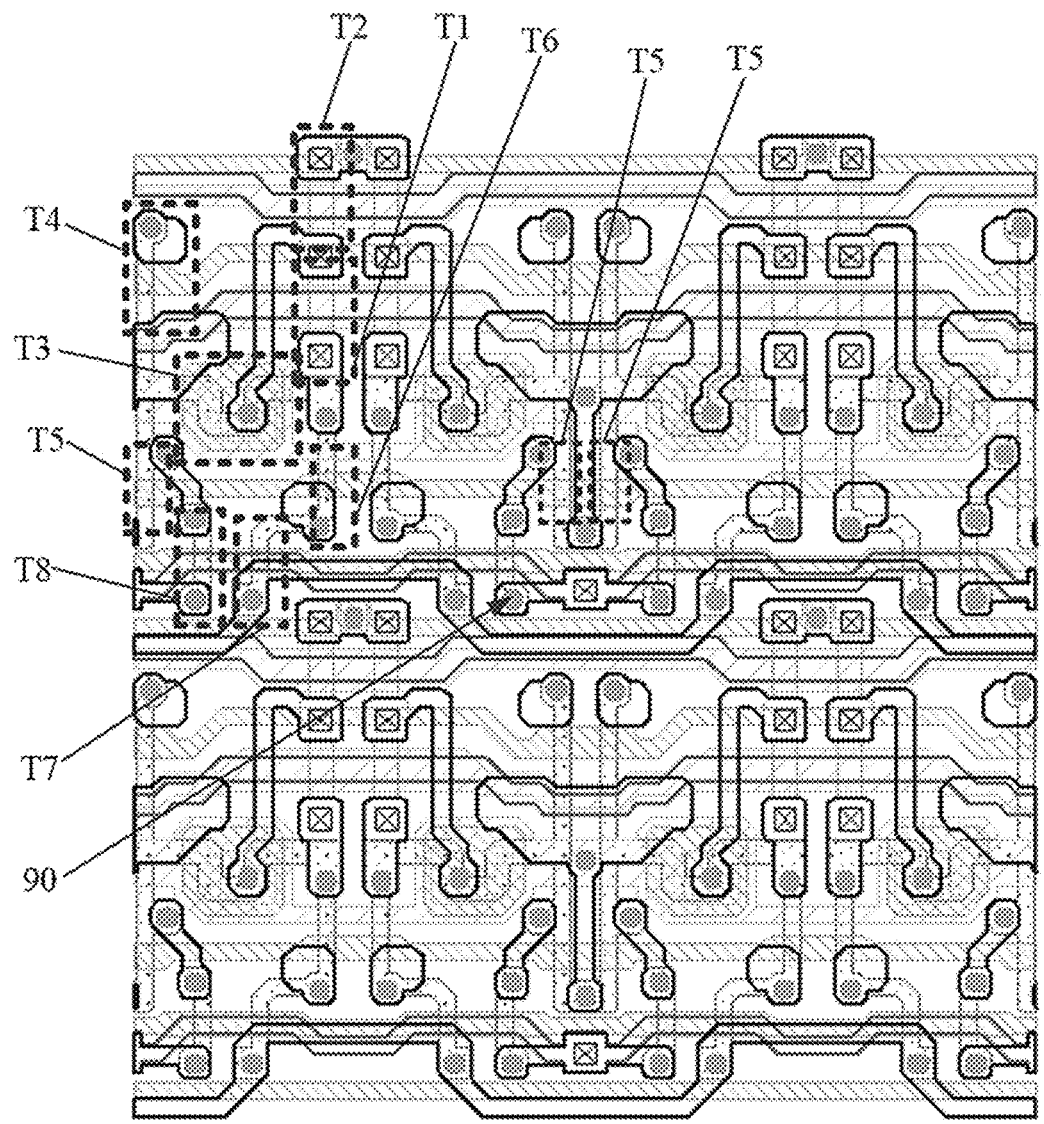
FIG. 53 is another schematic diagram of the layout of the display substrate provided by an embodiment of the present disclosure.

As shown in FIG. 53, in the display area, in the overlapping area between the third initialization signal transmission layer Vinit3 and the second conductive layer, the third initialization signal transmission layer Vinit3 is coupled to the second conductive layer through the via hole 90, but not limited thereto.

Exemplarily, the gate electrodes of the eighth transistors T8 in each row of sub-pixel driving circuits are respectively coupled to the corresponding third scan lines S3.

Exemplarily, the first electrodes of the eighth transistors T8 in each row of sub-pixel driving circuits are respectively coupled to the corresponding first transmission portions in the third initialization signal transmission layer Vinit3.

The orthographic projection of the eighth active layer 38 on the base substrate 60 at least partially overlap the orthographic projection of the fourth portion 723 on the base substrate 60, which reduces the layout difficulty of the display substrate and optimizes the grid structure of the signal line film layer, is beneficial to reduce the voltage drop of the signal line film layer and improve the heat dissipation of the signal line film layer.

As shown in FIG. 39 to FIG. 53, in some embodiments, the display substrate further includes a plurality of data lines D1, and the data line D1 include at least a portion extending along the first direction; there are two data lines D1 between adjacent third conductive patterns 72.

Exemplarily, the two data lines D1 between the adjacent third conductive patterns 72 are arranged symmetrically about the symmetry axis.

As shown in FIG. 39 to FIG. 53, in some embodiments, the display substrate further includes a plurality of sub-pixels, the sub-pixels include a sub-pixel driving circuit, and the sub-pixel driving circuit includes a driving transistor and a storage capacitor, the gate electrode of the driving transistor is multiplexed as the first electrode plate of the storage capacitor, and the second portion 702 is multiplexed as the second electrode plate of the storage capacitor.

The above arrangement reduces the layout difficulty of the display substrate, optimizes the grid structure of the signal line film layer, which is beneficial to reduce the voltage drop of the signal line film layer and improve the heat dissipation of the signal line film layer.

Embodiments of the present disclosure further provide a display device including the display substrate provided by the above embodiments.

In the display substrate provided by the above-mentioned embodiment, the signal line film layer includes a first conductive layer, a conductive connection layer and a second conductive layer that are stacked. In this arrangement, the signal line film layer is formed into a multi-layer network stacked structure, which effectively reduces the voltage drop generated when the signal line film layer transmits signals. When the display substrate is applied to a display product, the display uniformity of the display product in a high-brightness display mode is ensured. Moreover, the signal line film layer is formed into a multi-layer network stacked structure, which facilitates the heat dissipation of the display product in the high-brightness display mode.

The display device provided by the embodiment of the present disclosure includes the above-mentioned display substrate, and also has the above-mentioned beneficial effects, which will not be repeated here.

It should be noted that the display device can be any product or component with a display function, such as a TV, a monitor, a digital photo frame, a mobile phone, a tablet computer, etc., the display device also includes a flexible circuit board, a printed circuit board and a back panel.

It should be noted that the "same layer" in the embodiments of the present disclosure may refer to a film layer on the same structural layer. Or, for example, the film layers in the same layer may be a layer structure formed by using the same film forming process to form a film layer for forming a specific pattern, and then using the same mask to pattern the film layer through one patterning process. Depending on the specific pattern, one patterning process may include multiple exposure, development or etching processes, and the specific pattern in the formed layer structure may be continuous or discontinuous. These specific pattern may also be at different heights or have different thicknesses.

In the method embodiments of the present disclosure, the sequence numbers of the steps are not used to limit the sequence of the steps. For those of ordinary skill in the art, the sequence of the steps can be changed without creative work and also fall within the protection scope of the present disclosure.

It should be noted that each embodiment in this disclosure is described in a progressive manner, and the same and similar portions between the various embodiments may be referred to each other, and each embodiment focuses on the differences from other embodiments. In particular, for the method embodiment, since it is basically similar to the product embodiment, the description is relatively simple, and the relevant portion can be referred to the description of the product embodiment.

Unless otherwise defined, technical or scientific terms used in this disclosure shall have the ordinary meaning as understood by one of ordinary skill in the art to which this disclosure belongs. As used in this disclosure, "first," "second," and similar terms do not denote any order, quantity, or importance, but are merely used to distinguish the various components. "Including" or "comprising" and similar words mean that the elements or things appearing before the word encompass the elements or things recited after the word and their equivalents, but do not exclude other elements or things. Words like "connected," "coupled" are not limited to physical or mechanical connections, but may include electrical connections, whether direct or indirect. "Up", "Down", "Left", "Right", etc. are only used to represent the relative positional relationship, and when the absolute position of the described object changes, the relative positional relationship may also change accordingly.

It will be understood that when an element such as a layer, film, region or substrate is referred to as being "on" or "under" another element, it can be "directly on" or "under" the other element, or intermediate elements may be present.

In the foregoing description of the embodiments, the particular features, structures, materials or characteristics may be combined in any suitable manner in any one or more of the embodiments or examples.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising: a base substrate and a plurality of sub-pixels arranged on the base substrate, wherein the sub-pixels includes a sub-pixel driving circuit, an orthographic projection of the sub-pixel driving circuit on the base substrate has a maximum first width along a second direction; the display substrate further includes:

an initialization signal transmission layer arranged on the base substrate; wherein the initialization signal transmission layer includes a plurality of first transmission portions and a plurality of second transmission portions; the plurality of first transmission portions are arranged along a first direction, each of the first transmission portions includes at least a portion extending along the second direction, the second direction intersects the first direction; each of the second transmission portions includes at least a portion extending along the first direction, adjacent first transmission portions are coupled through at least one second transmission portion;

the plurality of first transmission portions include a target transmission portion, and the target transmission portion includes at least a portion extending along the second direction, a second transmission portion located between the target transmission portion and an adjacent previous first transmission portion and a second transmission portion located between the target transmission portion and an adjacent next first transmission portion are staggered by a first distance along the second direction, the first distance is greater than or equal to the first width.

2. The display substrate according to claim 1, wherein the display substrate includes a first initialization signal transmission layer and a second initialization signal transmission layer;

the initialization signal transmission layer is the first initialization signal transmission layer or the second initialization signal transmission layer; or, the display substrate includes at least two initialization signal transmission layers, a first one of the at least two initialization signal transmission layers is the first initialization signal transmission layer, and a second one of the at least two initialization signal transmission layers is the second initialization signal transmission layer.

3. The display substrate according to claim 2, wherein the display substrate further comprises a third initialization signal transmission layer.

4. The display substrate according to claim 3, wherein a third one of the at least two initialization signal transmission layers is the third initialization signal transmission layer.

5. The display substrate according to claim 3, wherein, a second transmission portion in the first initialization signal transmission layer and a second transmission portion in the second initialization signal transmission layer are staggered in the second direction; and/or, the second transmission portion in the first initialization signal transmission layer and a second transmission portion in the third initialization signal transmission layer are staggered in the second direction; and/or, the second transmission portion in the second initialization signal transmission layer and the second transmission portion in the third initialization signal transmission layer are staggered in the second direction.

6. The display substrate according to claim 3, wherein the display substrate includes a plurality of sub-pixels, and the sub-pixels include a light-emitting element and a sub-pixel driving circuit; the sub-pixel driving circuit includes a driving transistor, and further includes:

a second transistor, wherein the second transistor is respectively coupled to the gate electrode of the driving transistor and the first initialization signal transmission layer;

a seventh transistor, wherein the seventh transistor is respectively coupled to the light-emitting element and the second initialization signal transmission layer;

an eighth transistor, wherein the eighth transistor is respectively coupled to the first electrode of the driving transistor and the third initialization signal transmission layer.

7. The display substrate according to claim 3, wherein the display substrate further includes a display area and a peripheral area surrounding the display area, and the display substrate further includes:

a first signal line, wherein the first signal line is located in the peripheral area of the display substrate, the first signal line includes at least a portion extending along the first direction, the first signal line is coupled to the first initialization signal transmission layer;

the first signal line is made of a second source-drain metal layer, and the first transmission portion included in the first initialization signal transmission layer is made of a first gate metal layer, wherein the display substrate further comprises:

a second signal line, wherein the second signal line is located in the peripheral area of the display substrate, the second signal line includes at least a portion extending along the first direction, an orthographic projection of the first signal line on the base substrate is located between the display area and an orthographic projection of the second signal line on the base substrate, and the second signal line is coupled to the second initialization signal transmission layer;

the second signal line and the first transmission portion included in the second initialization signal transmission layer are both made of a first source-drain metal layer, wherein the display substrate further comprises:

a third signal line, wherein an orthographic projection of the third signal line on the base substrate is located between the orthographic projection of the first signal line on the base substrate and the orthographic projection of the second signal line on the base substrate, the third signal line is coupled to the third initialization signal transmission layer;

the third signal line is made of the first source-drain metal layer, and the third initialization signal transmission layer is made of a third gate metal layer.

8. The display substrate according to claim 2, wherein a second transmission portion in the first initialization signal transmission layer and a second transmission portion in the second initialization signal transmission layer are staggered along the second direction.

9. The display substrate according to claim 2, wherein the display substrate includes a plurality of sub-pixels, and the sub-pixels include a light-emitting element and a sub-pixel driving circuit; the sub-pixel driving circuit includes a driving transistor, and further includes:

a second transistor, wherein the second transistor is respectively coupled to the gate electrode of the driving transistor and the first initialization signal transmission layer;

a seventh transistor, wherein the seventh transistor is respectively coupled to the light emitting element and the second initialization signal transmission layer.

10. The display substrate according to claim 1, wherein the display substrate comprises a first initialization signal transmission layer, a second initialization signal transmission layer and a third initialization signal transmission layer;

the initialization signal transmission layer is one of the first initialization signal transmission layer, the second initialization signal transmission layer and the third initialization signal transmission layer.

11. The display substrate according to claim 1, wherein the plurality of first transmission portions include a non-target transmission portion, a second transmission portion located between the non-target transmission portion and an adjacent previous first transmission portion and a second transmission portion located between the non-target transmission portion and an adjacent next first transmission portion are arranged in a same column along the first direction.

12. The display substrate according to claim 1, wherein the display substrate further includes a plurality of sub-pixels, and the plurality of sub-pixels include a plurality of sub-pixel driving circuits; the plurality of sub-pixel driving circuits included in the plurality of sub-pixels are divided into a plurality of rows of sub-pixel driving circuits, and each sub-pixel driving circuit in each row of sub-pixel driving circuits is coupled to a corresponding first transmission portion;

the adjacent first transmission portions are coupled through a plurality of second transmission portions, among the plurality of the second transmission portions, a distance between adjacent second transmission portions is greater than or equal to a maximum width in the second direction of an orthographic projection of one sub-pixel driving circuit on the base substrate.

13. The display substrate according to claim 12, wherein adjacent sub-pixel driving circuits in a same row of sub-pixel driving circuits are arranged symmetrically as a whole;

the sub-pixels further include a plurality of data lines and a plurality of power supply lines, data lines adjacent in the second direction are symmetrically arranged, and power supply lines adjacent in the second direction are symmetrically arranged.

14. The display substrate according to claim 1, wherein the first transmission portion and the second transmission portion are formed as an integral structure.

15. The display substrate according to claim 1, wherein the display substrate further comprises a plurality of sub-pixels; the sub-pixels comprise a sub-pixel driving circuit, and the sub-pixel driving circuit comprises a driving transistor;

an orthographic projection of the second transmission portion on the base substrate partially overlaps an orthographic projection of a gate electrode of the driving transistor on the base substrate.

16. The display substrate according to claim 15, wherein the display substrate includes a plurality of data lines, and the data line includes at least a portion extending along the first direction;

the sub-pixel driving circuit further includes: a first transistor and a fourth transistor, the first transistor is respectively coupled to a gate electrode and a second electrode of the driving transistor, and the fourth transistor is respectively coupled to the first electrode of the driving transistor and a corresponding data line; the first transistor includes a first active layer, and the fourth transistor includes a fourth active layer;

at least part of the orthographic projection of the second transmission portion on the base substrate is located between an orthographic projection of the first active layer on the base substrate and an orthographic projection of the fourth active layer on the base substrate.

17. The display substrate according to claim 15, wherein the display substrate further comprises a power supply line; the sub-pixel further includes a light-emitting element; the sub-pixel driving circuit further includes a fifth transistor and a sixth transistor, the fifth transistor is respectively coupled to a first electrode of the driving transistor and a corresponding power supply line, the sixth transistor is respectively connected to a second electrode of the driving transistor and the light emitting element; the fifth transistor includes a fifth active layer, and the sixth transistor includes a sixth active layer;

- at least part of the orthographic projection of the second transmission portion on the base substrate is located between an orthographic projection of the fifth active layer on the base substrate and an orthographic projection of the sixth active layer on the base substrate,
- wherein the plurality of sub-pixels are divided into a plurality of sub-pixel groups, and each sub-pixel group includes a first sub-pixel and a second sub-pixel;
- both the first sub-pixel and the second sub-pixel include a second conductive portion, and the second conductive portion in the first sub-pixel is coupled to the second conductive portion in the second sub-pixel;
- a fifth transistor in the first sub-pixel is coupled to the second conductive portion; a fifth transistor in the second sub-pixel is coupled to the second conductive portion, the second conductive portion in the second sub-pixel is coupled to the corresponding power supply line;
- at least part of the second transmission portion is located in a sub-pixel driving circuit layout area in the first sub-pixel, and the orthographic projection of the second transmission portion on the base substrate does not overlap an orthographic projection of the second conductive portion in the first sub-pixel on the base substrate.

18. The display substrate according to claim 15, wherein the sub-pixel driving circuit further includes an eighth transistor, and the eighth transistor is coupled to the first electrode or the second electrode of the driving transistor, the eighth transistor is used for resetting the first electrode or the second electrode;

- the eighth transistor includes an eighth active layer, at least a portion of the orthographic projection of the second transmission portion on the base substrate and an orthographic projection of the eighth active layer on the base substrate are arranged along the second direction.

19. The display substrate according to claim 1, wherein the display substrate includes a plurality of sub-pixels, and the sub-pixels include a light-emitting element and a sub-pixel driving circuit; the sub-pixel driving circuit includes a driving transistor, and further includes:

- a second transistor, wherein the second transistor is respectively coupled to the gate electrode of the driving transistor and the initialization signal transmission layer;
- a seventh transistor, wherein the seventh transistor is respectively coupled to the light-emitting element and the initialization signal transmission layer.

20. A display device comprising the display substrate according to claim 1.

* * * * *